(12) United States Patent
Mori et al.

(10) Patent No.: US 7,239,939 B2
(45) Date of Patent: Jul. 3, 2007

(54) SUBSTRATE TRANSFER DEVICE

(75) Inventors: Hidehiko Mori, Hachiouji (JP);
Yoshiyuki Tomita, Hiratsuka (JP);
Kazutoshi Sakaki, Fujisawa (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 47 days.

(21) Appl. No.: 11/110,845

(22) Filed: Apr. 21, 2005

(65) Prior Publication Data
US 2005/0187653 A1 Aug. 25, 2005

Related U.S. Application Data

(62) Division of application No. 10/228,047, filed on Aug. 27, 2002, now Pat. No. 6,925,355.

(30) Foreign Application Priority Data
Oct. 5, 2001 (JP) ............................. 2001-310397

(51) Int. Cl.
*G06F 7/00* (2006.01)
(52) U.S. Cl. .................................... 700/213
(58) Field of Classification Search ................. 700/213
See application file for complete search history.

(56) References Cited

U.S. PATENT DOCUMENTS

| 4,228,358 | A | 10/1980 | Ryding |
| 4,383,178 | A | 5/1983 | Shibata et al. |
| 4,560,880 | A | 12/1985 | Petric et al. |
| 4,745,287 | A | 5/1988 | Turner |
| 4,899,059 | A | 2/1990 | Freytsis et al. |
| 5,003,183 | A | 3/1991 | Nogami et al. |
| 5,149,967 | A | 9/1992 | Otaka |
| 5,214,290 | A | 5/1993 | Sakai |
| 5,229,615 | A | 7/1993 | Brune et al. |
| 5,898,179 | A | 4/1999 | Smick et al. |
| 5,996,437 | A | 12/1999 | Novak et al. |
| 6,252,705 | B1 | 6/2001 | Lo et al. |
| 6,363,809 | B1 | 4/2002 | Novak et al. |
| 6,538,348 | B2 | 3/2003 | Sawai et al. |
| 6,556,887 | B2 | 4/2003 | Freeman et al. |
| 6,559,461 | B1 | 5/2003 | Seo |
| 6,583,597 | B2 | 6/2003 | Tanaka et al. |
| 6,654,100 | B2 | 11/2003 | Yoda |

(Continued)

FOREIGN PATENT DOCUMENTS

| JP | 4-171715 | 6/1992 |
| JP | 2001-50212 | 2/2001 |

(Continued)

*Primary Examiner*—Khoi H. Tran
(74) *Attorney, Agent, or Firm*—Squire, Sanders & Dempsey, L.L.P.

(57) ABSTRACT

The present invention provides a vacuum stage device that moves a substrate to be processed in a vacuum environment. In a substrate transfer device in accordance with the present invention, a wafer mounted to a wafer platen is moved in a vacuum processing chamber. This substrate transfer device includes a first driving mechanism for moving the wafer platen in a Y1 direction, and a second driving mechanism that is provided in the vacuum processing chamber and linearly reciprocates the wafer platen in X1 and X2 directions at a high speed.

41 Claims, 42 Drawing Sheets

U.S. PATENT DOCUMENTS

| | | |
|---|---|---|
| 6,710,360 B2 | 3/2004 | Ferrara |
| 6,777,687 B2 | 8/2004 | Vanderpot et al. |
| 6,925,355 B2 * | 8/2005 | Mori et al. ................. 700/213 |

FOREIGN PATENT DOCUMENTS

| | | |
|---|---|---|
| JP | 2001-275334 | 10/2001 |
| JP | 2001-346365 | 12/2001 |

* cited by examiner

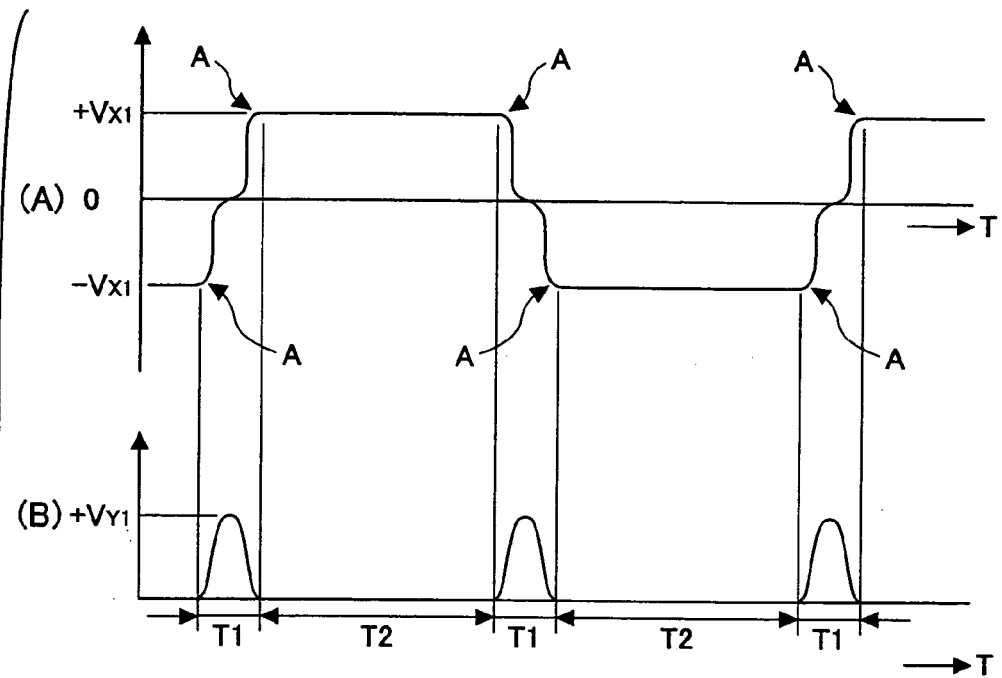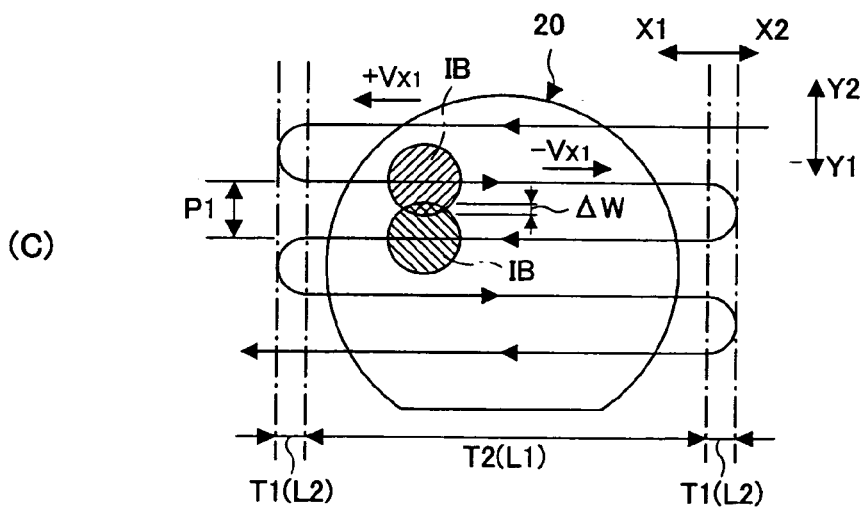
FIG. 23

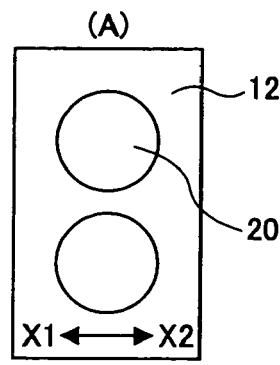
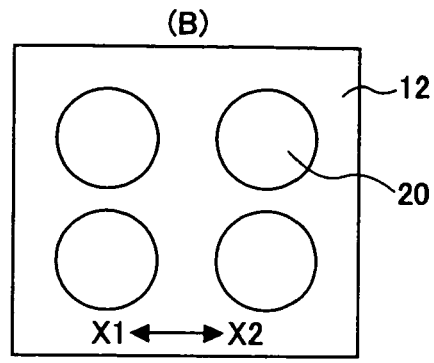
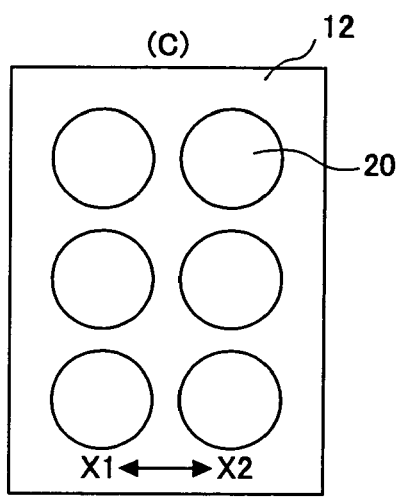
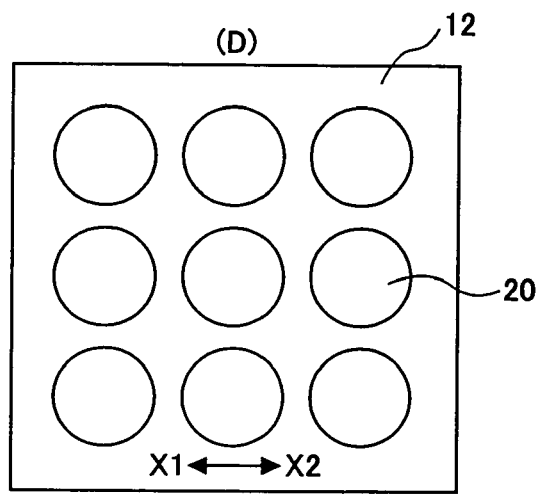
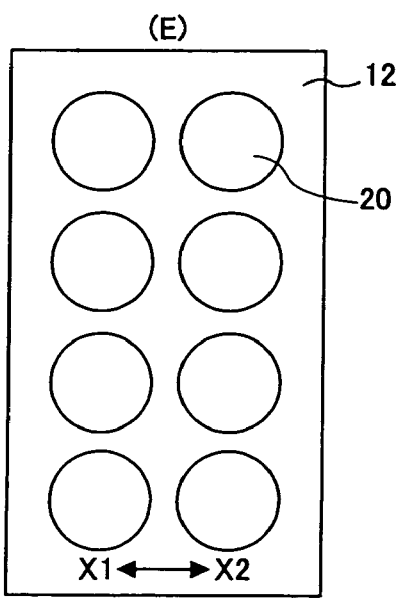
FIG. 27

SUBSTRATE TRANSFER DEVICE

REFERENCE TO RELATED APPLICATIONS

This is a divisional application of application Ser. No. 10/228,047, filed Aug. 27, 2002 now U.S. Pat. No. 6,925,355. This patent application is based on Japanese priority patent application No. 2001-310397, filed Oct. 5, 2001. The disclosure of the prior applications is hereby incorporated by reference herein in their entirety.

BACKGROUND OF THE INVENTION

1. Field of the Invention

The present invention relates to vacuum stage devices, and, more particularly, to a vacuum stage device that moves a substrate to be processed in a vacuum environment.

2. Description of the Related Art

To produce a semiconductor device, a number of manufacturing processes are carried out on a wafer (i.e., a semiconductor substrate), and there exist many kinds of semiconductor manufacturing processes that are carried out in a vacuum environment (i.e., in a vacuum processing chamber).

Specific examples of these semiconductor manufacturing processes include: a sputtering process for physically forming a thin film on a wafer; a CVD sputtering process for forming a thin film on a wafer by a chemical vapor technique; a lithography process for shaping thin films formed on a wafer; an impurity adding process for adding impurities to layers formed on a wafer that is an ion implantation process; an etching process for performing various etching operations on thin films formed on a wafer; an electronic beam process for performing a fine shaping operation on the surface of a wafer with an electronic beam; and an ion beam process for performing a fine shaping operation on a surface of the wafer with an ion beam. All of these processes are carried out in a vacuum environment.

When the above processes are carried out, it is necessary to move the wafer with precision in a vacuum processing chamber. Therefore, a transfer device for moving a stage (a base), to which the wafer is to be mounted, with precision in a vacuum processing chamber is provided for a processing device that carries out the above processes. In accordance with a process to be carried out for the wafer, the transfer device can selectively perform a moving operation in X-Y-Z directions, a tilting operation for tilting the wafer in relation to an electronic beam or the like, or a rotating operation for rotating the wafer.

Conventionally, a transfer device of this type for moving a wafer inside a vacuum processing chamber normally has a stage driving mechanism placed outside the vacuum processing chamber, for the following reasons:

1) It is difficult to employ a driving mechanism that generates heat, because the vacuum processing chamber does not contain a heat releasing medium (such as air) for releasing the heat generated by the driving mechanism to the outside.
2) As the volume of the vacuum chamber is reduced, the time required for obtaining a predetermined degree of vacuum can be shortened, and the throughput in the wafer processing can be increased. However, if the vacuum processing chamber is made smaller, the driving mechanism provided inside the vacuum processing chamber also becomes smaller. As a result, the driving force is lowered. For this reason, a wafer cannot be moved at a high speed inside the vacuum processing chamber, resulting in a reduced throughput.
3) Where a linear motor is employed as the driving mechanism, the wire rods that form the coil of the linear motor should be covered with a resin material for insulation purposes. Also, the coil is impregnated with resin and is thus solidified firmly, so as to prevent deformation due to a strong magnetic force between the wire rods or magnets. However, the heat, which is generated from the coil at the time of driving of the linear motor, generates outgas from the resin that is employed as the covering and solidifying material. As a result, the degree of vacuum inside the vacuum processing chamber is considerably lowered.

For the above reasons, the conventional stage driving mechanism is placed outside the vacuum processing chamber. In such a structure, it is necessary to introduce a stage driving force into the vacuum processing chamber from the outside. To do so, a vacuum sealing process needs to be carried out for the driving force introducing unit. As a result, the entire transfer device, as well as the vacuum processing chamber, becomes larger, and the production costs become higher.

Furthermore, if the stage inside the vacuum processing chamber is far apart from the stage driving mechanism placed outside the vacuum processing chamber, vibration and reaction force may be caused anywhere in the driving force transmission system that ranges from the stage driving mechanism to the stage. Because of this, it is difficult to move the stage at a high speed. If the moving speed of the stage (or the wafer) is reduced, however, the throughput of the wafer processing will drop considerably.

SUMMARY OF THE INVENTION

A principal object of the present invention is to provide substrate transfer devices, in which the above problems of the prior art are eliminated.

A more specific object of the present invention is to provide a substrate transfer device that can move a substrate to be processed inside a vacuum processing chamber at a high speed.

The above objects of the present invention are achieved by a substrate transfer device for moving a substrate inside a vacuum processing chamber for processing the substrate, with the substrate being mounted on a base. This substrate transfer device includes: a first driving mechanism for moving the base; and a second driving mechanism for reciprocating the base in a direction perpendicular to the moving direction of the first driving mechanism at a speed higher than the moving speed of the first driving mechanism. In this substrate transfer device, the second driving mechanism is located inside the vacuum processing chamber.

In the above substrate transfer device, the first driving mechanism and the second driving mechanism both linearly reciprocate the base.

Also in the above substrate transfer device, the frequency of the linear reciprocating movement of the base caused by the second driving mechanism is set in the range of 1 Hz to 20 Hz.

Also in the above substrate transfer device, the moving speed of the base linearly reciprocated by the second driving mechanism is set in the range of 1 m/S to 50 m/S.

Also in the above substrate transfer device, the accuracy of the speed in a linear constant speed moving area during the linear reciprocating movement is in the range of 0.01% to 1%.

With the above substrate transfer device, the second driving mechanism reciprocates the base inside the vacuum processing chamber at a high speed. Accordingly, a predetermined process can be carried out for the substrate with a high throughput.

Here, it is preferable to set the frequency of the linear reciprocating movement of the base moved by the second driving mechanism in the range of 1 Hz to 20 Hz. Also, the moving speed of the base linearly reciprocated by the second driving mechanism is preferably set in the range of 1 m/S to 50 m/S, and the accuracy of the moving speed is preferably in the range of 0.01% to 1%.

In the above substrate transfer device in-accordance with the present invention, the second driving mechanism may be formed by a fluid pressure actuator.

This fluid pressure actuator includes a guide axis that extends in a single axial direction, and a slider that can move along the guide axis. A pressure chamber is formed between the surrounding area of the guide axis and the slider. A partition wall for dividing the pressure chamber into two cylinder chambers with respect to the axial direction is fixed to the slider or one end of the guide axis. A supply and discharge passage provided inside the guide axis is extended to each of the two cylinder chambers, so that compressed fluid can enter and exit the two cylinder chambers.

In the above substrate transfer device, the fluid pressure actuator includes a guide axis and a slider that can move along the guide axis. The guide axis is formed by two axis members each having a first end facing the first end of the other axis member, with a predetermined distance being maintained between the two axis members, and the centers of the two axis members corresponding to each other. The slider is formed by a cylindrical member that accommodates a space formed between the one ends of the two axis members facing each other and an area covering a predetermined distance from the first end to a second end of each of the two axis members. A partition wall for dividing the space between the first ends into two cylinder chambers with respect to the axial direction is fixed to the inner wall of the slider. A supply and discharge passage provided in the guide axis is extended to each of the two cylinder chambers, so that compressed fluid can enter and exit the cylinder chambers.

In the above substrate transfer device, a bearing and a discharging part for discharging leakage fluid from each of the cylinder chambers are formed between the guide axis and the slider on either side of each of the cylinder chambers. A discharge passage that extends from an end of the guide axis to the discharging part is provided in the guide axis.

In the above substrate transfer device in accordance with the present invention, the fluid pressure actuator as the second driving mechanism can be placed inside the vacuum processing chamber. This fluid actuator has the guide axis and the slider that can slide along the guide axis. The pressure chamber formed between the guide axis and the slider is divided into the two cylinder chambers. A compressed fluid can enter and exit the cylinder chambers selectively through the supply and discharge passages, so as to move the slider along the guide axis.

Since this compressed fluid does not enter the vacuum processing chamber from the cylinder chambers, the degree of vacuum inside the vacuum processing chamber is not lowered by the fluid pressure actuator. Also, since the fluid pressure actuator moves the slider with the compressed fluid, heat generation is hardly caused at the driving point. Furthermore, the pressure of the compressed fluid is controlled in such a manner as to move the slider at a high speed.

In the substrate transfer device in accordance with the present invention, the second driving mechanism may be formed by a linear motor.

In this substrate transfer device, the linear motor may have a magnet as a stator, and a coil as a needle.

Since the needle as the driving unit is a coil in this substrate transfer device, the driving unit can be made lighter, and high-speed movement and high-speed reciprocating movement can be more easily achieved. Also, since the coil is surrounded by the magnet, leakage magnetic flux is hardly found at the ends of the driving unit. In this manner, adverse influence of the magnetic field on the substrate placed on the driving unit can be reduced.

Also in the substrate transfer device in accordance with the present invention, the linear motor may have a magnet as a needle, and a coil as a stator.

Since the stator is a coil in this structure, it is unnecessary to provide a wire at the moving parts. Accordingly, there will be no trouble caused by the load on the driving unit or wear and damage due to the wiring. In this manner, the high-speed movement and the high-speed reciprocating movement of the driving unit can be more easily realized.

In the substrate transfer device in accordance with the present invention, the linear motor contains a coil formed by combining a plurality of coil pieces, and includes a sealed container for cooling the coil by having a refrigerant flowing around the coil.

In the above substrate transfer device, each of the coil pieces contained in the linear motor substantially has a ring shape. Each of the coil pieces includes effective conductive parts that are formed by two facing sides of the rectangular section of each of the coil pieces and help to generate a thrust force for the base, and a linking conductive part that is formed by the other two facing sides of the rectangular section and links the effective conductive parts to each other.

Also in the above substrate transfer device, the coil pieces may be formed by repeating a coil forming process that includes:

a first rotating step of rotating a winding die around an X-axis by 180 degrees, with a lead wire sent out in a Z-axial direction being engaged at one of engaging points that are the four corners of the rectangular section;

a second rotating step of rotating the winding die around a Y-axis by 180 degrees, with the lead wire being engaged at one of the engaging points that is adjacent to the engaging point that engages the lead wire in the first rotating step;

a third rotating step of rotating the winding die around the X-axis by 180 degrees, with the lead wire being engaged at one of the engaging points that is adjacent to the engaging point that engages the lead wire in the second rotating step; and a fourth rotating step of rotating the winding die around the Y-axis by 180 degrees, with the lead wire being engaged at one of the engaging points that is adjacent to the engaging point that engages the lead wire in the third rotating step. In this substrate transfer device, the lead wire is employed to form the coil pieces, and the Z-axis is the direction of sending out the lead wire. Further, the X-axis and the Y-axis are perpendicular to each other in a plane that is perpendicular to the Z-axis. The winding die is a base for winding the lead wire in a shape substantially having a rectangular section, and having the engaging points. The center of the winding die corresponds to the point origin of the X-axis and the Y-axis.

In this substrate transfer device, the second driving mechanism can be placed in the vacuum processing chamber, because a linear motor is employed as the second driving mechanism.

More specifically, a linear motor has a small amount of heat generation, because the frictional resistance of the linear motor is low at the time of driving. Also, only a small number of components are required for a linear motor, and the size of the linear motor can be reduced accordingly. For these reasons, even though the vacuum processing chamber has a small volume, a linear motor can be placed inside the vacuum processing chamber.

Furthermore, a sealed container that accommodates the coil constituting a linear motor and cools the coil by providing a refrigerant flowing around the coil may be employed in the above substrate transfer device. With this sealed container, generation of outgas from the coil is prevented, and a desirable degree of vacuum inside the vacuum processing chamber can be maintained accordingly.

Further, with the ring-shaped coil that includes an effective conductive part and a linking conductive part, the density of the magnetic flux generated can be increased, and a greater driving force can be output accordingly. In this manner, the moving speed of the base can be increased, and the throughput of each process carried out for the substrate can be increased.

The substrate transfer device in accordance with the preset invention may further include a third driving mechanism that rotates the base around a tilt axis that is parallel to the moving direction of the base driven by the first driving mechanism or/and a tilt axis that is parallel to the moving direction of the base driven by the second driving mechanism. The third driving mechanism can also stop the base at a desired angle.

The substrate transfer device in accordance with the present invention may further include a third driving mechanism that rotates the base around a tilt axis parallel to the vertical direction in such a manner that the base can be stopped at a desired angle. This third driving mechanism stops and positions the base at the desired angle.

In the above substrate transfer device, the tilt axis extends through the center point of the substrate to be processed.

As the third driving mechanism that serves as a tilting mechanism is added to the substrate transfer device, the orientation of the substrate can have a certain degree of freedom during a process. With this structure, each process can be carried out for a substrate at a suitable orientation, thereby achieving the optimum process effects.

The substrate transfer device in accordance with the present invention may further include a fourth driving mechanism that rotates the base around an axis that is perpendicular to an attachment surface to which the substrate to be processed is mounted. This fourth driving mechanism also stops and positions the base.

In the above substrate transfer device, the axis perpendicular to the attachment surface extends through the center point of the substrate to be processed.

Since the fourth driving mechanism that rotates the substrate to be processed is added to the substrate transfer device of the present invention, a process can be carried out while the substrate to be processed is being rotated. In this manner, a uniform process can be carried out for the substrate to be processed.

In the substrate transfer device in accordance with the present invention, the substrate to be processed may be attached to the base so that the process surface of the substrate to be processed stands vertically in a standard attachment state of the substrate to be processed.

Since the process surface of the substrate to be processed stands vertically, any dust naturally falls off the substrate to be processed, and does not stick to the substrate to be processed.

In the substrate transfer device in accordance with the present invention, the base may attract the substrate to be processed by electrostatic suction force, so that the substrate to be processed is mounted on the base.

With the electrostatic suction force used as a means for attaching the substrate onto the base, the substrate to be processed can be surely mounted onto the base even in the vacuum processing chamber, which is a vacuum environment.

In the substrate transfer device in accordance with the present invention, the base may be provided with a cooling mechanism.

With this cooling mechanism provided on the base, a process can be carried out while the substrate to be processed is cooled. In such a structure, the substrate to be processed can be prevented from being decomposed or deformed while a process is being carried out for the substrate to be processed.

In the substrate transfer device in accordance with the present invention, the base may have only one substrate to be processed mounted thereon.

With this structure in which only one substrate to be processed is mounted onto the base (a so-called single-substrate structure), the process precision can be increased, and the size of the vacuum processing chamber can be reduced.

In the substrate transfer device in accordance with the present invention, the base may have two to nine substrates to be processed mounted thereon.

With this structure in which two to nine substrates to be processed can be mounted onto the base, the processing capacity for the substrates to be processed can be increased, without reducing the process precision or enlarging the vacuum processing chamber.

In the substrate transfer device in accordance with the present invention, the second driving mechanism may have a stroke including a length necessary for a process and a return area width necessary for changing the moving direction of the base.

In the above substrate transfer device, the length necessary for the process may be a length in a processing direction of an object to be processed.

Also in the above substrate transfer device, the length necessary for the process may be a length in a processing direction of carrying out an actual process on an object to be processed.

In the above substrate transfer device, each stroke of the second driving mechanism may be made up of the length necessary for a process (L1) and the return area width necessary for changing the moving direction of the base (L2). With this stroke length (L1+L2), each stroke of the second driving mechanism can be shortened, and the processing time can also be shortened.

When a process is carried out for the entire substrate to be processed, the length necessary for the process is equal to the length of the substrate to be processed in the processing direction. When a process is partially carried out for the substrate to be processed, the length necessary for the process is equal to the length of the actual processed area on the object to be processed in the processing direction.

In the substrate transfer device in accordance with the present invention, a mounting position of the substrate to be processed onto the base may be offset in relation to a position where the first driving mechanism and the second driving mechanism directly move the base.

In the above arrangement, the driving mechanisms do not exist in the vicinity of the mounting position of the substrate to be processed. Accordingly, a detection unit for detecting the state of a process being carried out for the substrate to be processed, for instance, can be placed in the vicinity of the substrate to be processed.

In the substrate transfer device in accordance with the present invention, the mounting position of the substrate to be processed onto the base is equivalent to the position where the first driving mechanism and the second driving mechanism directly move the base.

Since the mounting position of the substrate to be processed onto the base corresponds to the position where the first driving mechanism and the second driving mechanism directly move the base, the moment generated in the base being moved can be reduced. In this manner, the base being moved is not vibrated, and a high-precision process can be carried out.

In the substrate transfer device in accordance with the present invention, the second driving mechanism may be placed on the first driving mechanism.

In the substrate transfer device in accordance with the present invention, the first driving mechanism may be placed on the first driving mechanism.

Since the second driving mechanism is placed on the first driving mechanism or the first driving mechanism is placed on the second driving mechanism in the above substrate transfer device, the total size of the first driving mechanism and the second driving mechanism can be made smaller, compared with a structure in which the first driving mechanism and the second driving mechanism are arranged separately from each other. Accordingly, the entire size of the substrate transfer device can also be reduced.

The substrate transfer device in accordance with the present invention may further include a driving control unit for controlling driving operations of the first driving mechanism and the second driving mechanism.

Since the driving control unit controls the driving operations of the first driving mechanism and the second driving mechanism, the movement of the base by the first driving mechanism can be synchronized with the movement of the base by the second driving mechanism. When a process is carried out for the substrate to be processed in this structure, very efficient movements of the base can be realized.

In the above substrate transfer device, the driving control unit alternately carries out a mode for the second driving mechanism to move the base at considerably varied moving speeds and a mode for the second driving mechanism to move the base at a constant moving speed.

In this substrate transfer device, the mode for the second driving mechanism to move the base at varied moving speeds is a mode for changing the moving direction of the base. Here, the base first considerably reduces the speed and then stops. After that, the base regains speed quickly in the opposite direction. When the speed reaches a predetermined level, the driving control unit switches to the mode for moving the base at a constant moving speed. The driving control unit alternately carries out the two modes, so as to reciprocate the base within the vacuum processing chamber.

In the above substrate transfer device, the constant speed zone width of the constant speed movement by the second driving mechanism is determined by the smallest stroke necessary for a process that depends on the outer configuration of the substrate to be processed, and the constant speed zone width can be set or changed prior to the process for the substrate to be processed.

Since the constant speed zone can be adjusted in conformity with the external shape of an object to be processed in the above structure, the processing time can be reduced.

In the above substrate transfer device, the driving control unit smoothes out a moving speed variation of the base at each switch point between the varied moving speed mode and the constant moving speed mode.

Since the driving control unit smoothes out a moving speed variation of the base at each switch point between the varied moving speed mode and the constant moving speed mode, the base can be protected from excessive vibration or moment at each switch point where the moving speed changes considerably.

Also in the above substrate transfer device, the driving control unit controls the first driving mechanism to continuously move the base at a constant moving speed.

In this structure, the first driving mechanism is controlled by the driving control unit so as to continuously move the base at a constant moving speed. The movement trail of the base is formed by overlapping the trails of the reciprocating movement by the second driving mechanism and the movement by the first driving mechanism (i.e., the movement in a direction perpendicular to the reciprocating direction of the second driving mechanism). In this structure, the movement trail of the base has a saw-toothed shape.

In the above substrate transfer device, the driving control unit can change the constant moving speed at which the first driving mechanism moves the base.

In this structure, the height of each tooth of the saw-toothed movement trail (i.e., the pitch of adjacent movement strokes) can be adjusted. Accordingly, a higher degree of freedom can be allowed in setting the movement trail of the base.

Also in the above substrate transfer device, the driving control unit controls the first driving mechanism to intermittently move the base, depending on the reciprocating movement by the second driving mechanism.

With such a control operation by the driving control unit, the movement trail of the base becomes a step-like movement trail.

In the above substrate transfer device, the driving control unit can change a moving distance of the base moved by the first driving mechanism.

With such a control operation by the driving control unit, the pitch of the adjacent movement strokes of the step-like movement trail can be adjusted. In this manner, a higher degree of freedom can be allowed in setting the movement trail of the base.

In the above substrate transfer device, the driving control unit performs such a control operation that the first driving mechanism intermittently moves the base while the second driving mechanism carries out the mode for moving the base at varied moving speeds.

With this structure, the first driving mechanism can be prevented from intermittently moving the base during a linear movement operation. In this manner, a stable process can be carried out for the substrate to be processed. Here, the zone in which the second driving mechanism moves the base at varied moving speeds is located outside the substrate to be processed or the processing zone. Accordingly, even if the first driving mechanism performs an intermittent movement operation for the base in that zone, there will be no adverse influence on the substrate to be processed.

In the above substrate transfer device, the driving control unit performs such a control operation that a process for the substrate to be processed synchronizes with the mode for the second driving mechanism to move the base at a constant moving speed.

Since the process for the substrate to be processed synchronizes with the mode for moving the base at a constant moving speed by the second driving mechanism in the above structure, the process can be carried out for the substrate to be processed in the constant-speed movement zone, in which a stable process can be carried out. Accordingly, a stable and high-precision process can be carried out for the substrate to be processed.

In the substrate transfer device in accordance with the present invention, the base may be guided by a linear guide.

In the above substrate transfer device, the linear guide is formed by an air bearing or a magnetic bearing.

Since the base is guided by the linear guide in the above structure, smooth and stable movement of the base can be ensured.

The substrate transfer device in accordance with the present invention may be incorporated into a device selected from the group consisting of a beam processing device, an exposure device, and an ion implantation device.

The substrate transfer device may include a moving mechanism for moving a base, to which a substrate to be processed is mounted, in a predetermined direction at a high speed. In this substrate transfer device, only the moving mechanism is placed inside a vacuum processing chamber.

The above and other objects and features of the present invention will become more apparent from the following description taken in conjunction with the accompanying drawings.

BRIEF DESCRIPTION OF THE DRAWINGS

FIG. 23-(A) is a timing chart of a first control operation example of the first and second driving mechanisms carried out by the controller, FIG. 23-(B) is a timing chart of the first control operation example of the first and second driving mechanisms carried out by the controller, and FIG. 23-(C) shows a relative movement trail of a wafer in the first control operation example;

FIG. 27-(A) through 27-(E) show various examples of the arrangement of a plurality of wafers mounted on a wafer platen;

DESCRIPTION OF THE PREFERRED EMBODIMENTS

The following is a description of embodiments of the present invention, with reference to the accompanying drawings.

Figure 1:
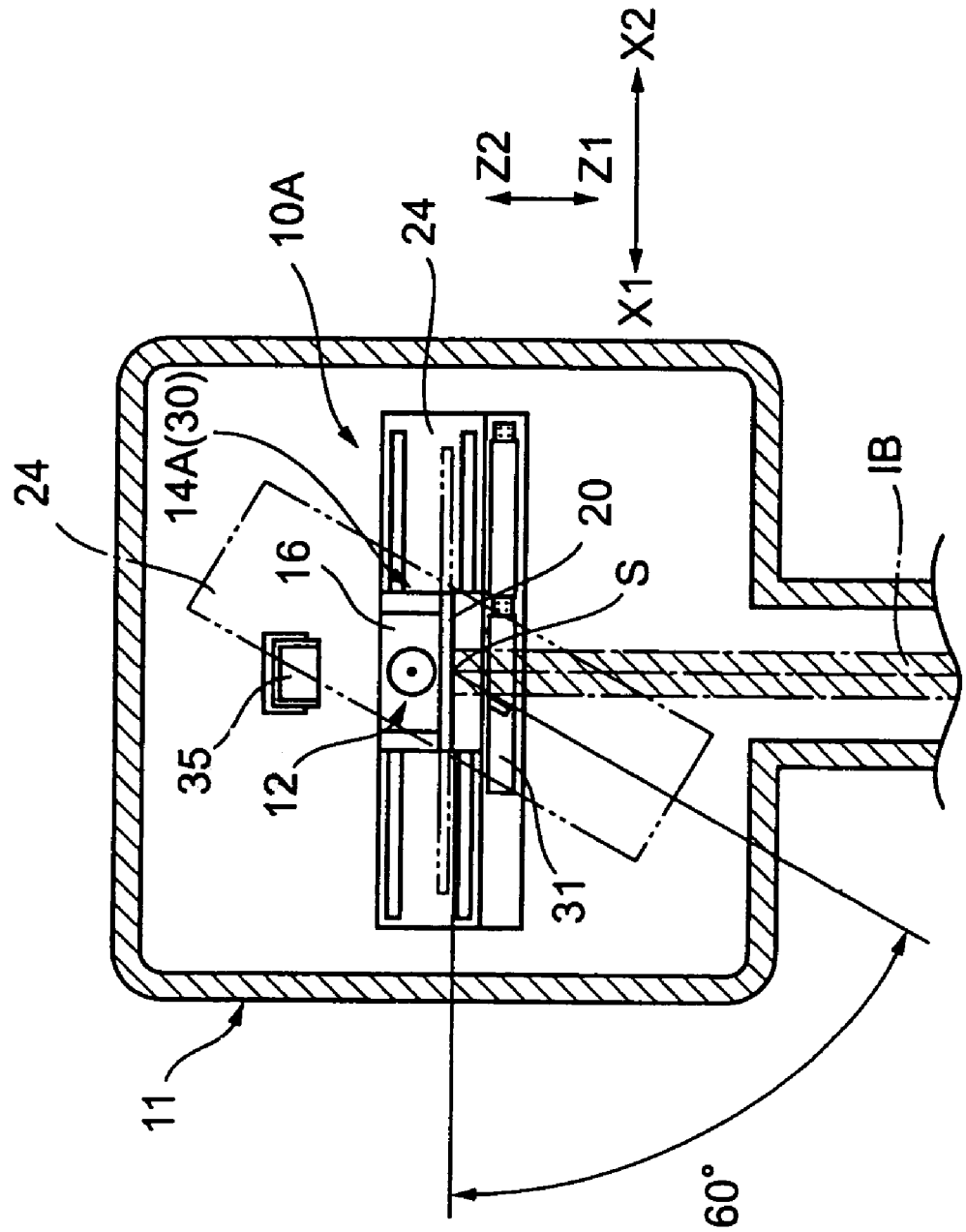
FIG. 1 is a section view of a substrate transfer device that is the first embodiment of the present invention, seen from the top.
Figure 2:
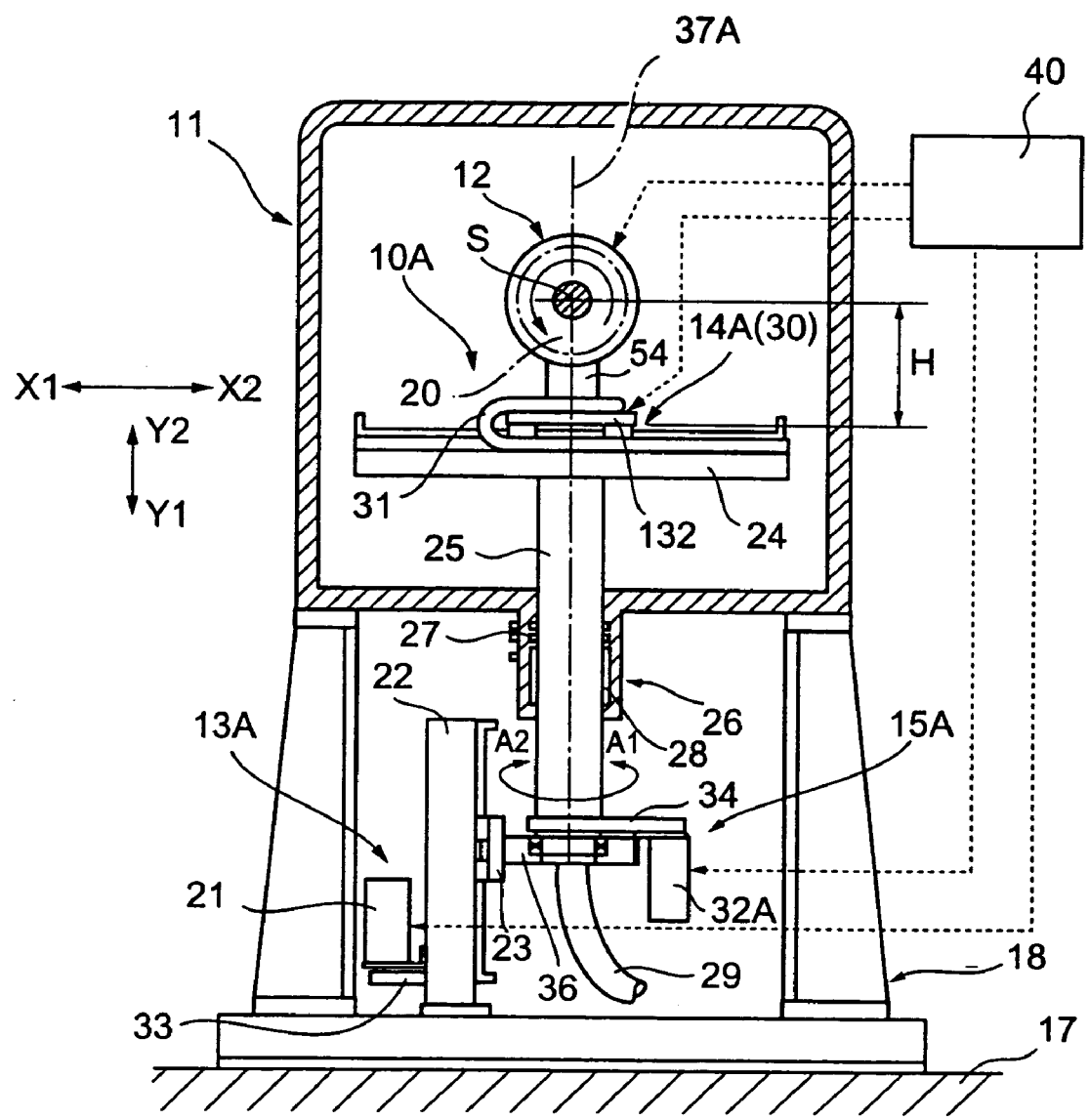
FIG. 2 is a section view of the substrate transfer device that is the first embodiment of the present invention, seen from the front.
Figure 3:
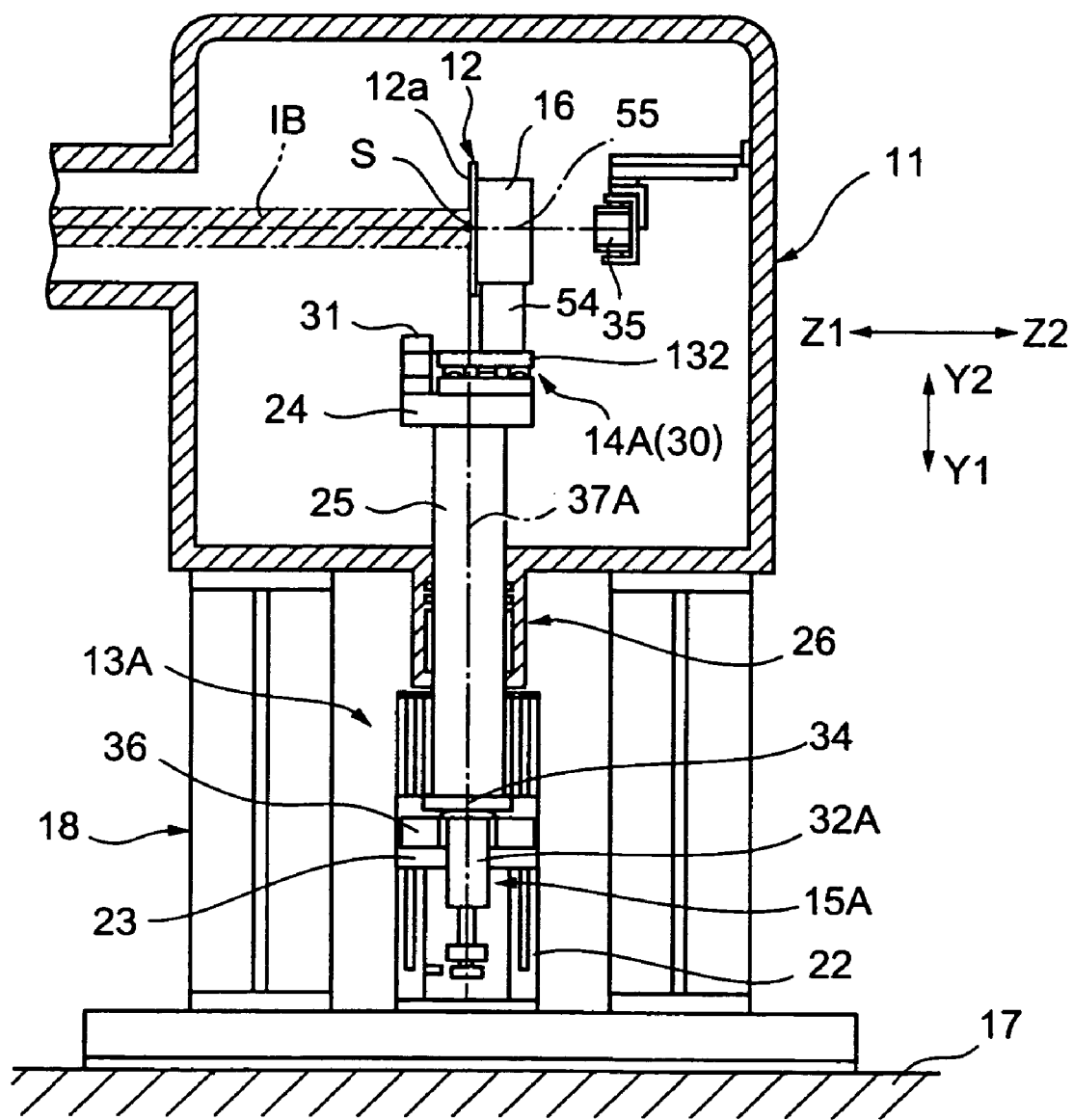
FIG. 3 is a section view of the substrate transfer device that is the first embodiment of the present invention, seen from a side.

FIGS. 1 through 3 show a processor that employs a substrate transfer device 10A, which is the first embodiment of the present invention. The substrate transfer device 10A of this embodiment moves a wafer 20, which is the substrate to be processed, in a vacuum processing chamber 11 of the processor. The substrate transfer device 10A can be employed in a processor such as a semiconductor manufacturing device. More specifically, the substrate transfer device 10A can be employed in a beam processing device, an exposure device, or an ion implantation device.

In the following description, an example in which the substrate transfer device 10A is employed in the processor that carries out predetermined processes by irradiating the wafer 20 with an ion beam (hereinafter referred to as IB) will be explained. Still, it should be noted that the present invention is not limited to this embodiment, but can also be applied to the above-mentioned processors of various types.

The substrate transfer device 10A includes a wafer platen 12, a first driving mechanism 13A, a second driving mechanism 14A, a third driving mechanism 15A, a fourth driving mechanism 16, and a controller 40.

The wafer platen 12 serves as a base on which the wafer 20 is mounted. The first driving mechanism 13A moves the wafer platen 12 in a single direction indicated by the arrow Y1 or a single direction indicated by the arrow Y2 in the drawings. The second driving mechanism 14A reciprocates the wafer platen 12 in the directions indicated by the arrows X1 and X2 in the drawings. The third driving mechanism 15A tilts the wafer platen 12. The fourth driving mechanism 16 rotationally moves the wafer platen 12.

In the substrate transfer device 10A of this embodiment, the wafer platen 12, the second driving mechanism 14A, and the fourth driving mechanism 16 are provided in the vacuum processing chamber 11. The first driving mechanism 13A and the third driving mechanism 15A are provided outside the vacuum processing chamber 11. In the following, each of the components of the substrate transfer device 10A will be described in detail.

The wafer platen 12 is the base on which the wafer 20 is to be mounted. In this embodiment, the wafer platen 12 is designed so that a wafer mounting surface 12a, on which the wafer 20 is to be actually mounted, is situated in the vertical direction in the stand-by attachment state (i.e. the initial state prior to a process start). In such a structure, the wafer 20 is irradiated with an IB in the horizontal direction. In this manner, the amount of dust that sticks to the wafer 20 can be reduced, because dust sticking to the wafer 20 naturally falls off due to gravity.

The wafer platen 12 is attached to the second driving mechanism 14A. As will be described later, a linear motor 30 is used as the second driving mechanism 14A in this embodiment, and the wafer platen 12 is moved in the directions indicated by the arrows X1 and X2 in the drawings. The wafer platen 12 is fixed to a support pillar 54 standing from a coil unit 132 that constitutes the linear motor 30. In such a structure, the center of the wafer platen 12 deviates from the position where the wafer platen 12 is moved directly by the linear motor 30 (i.e., the position of the coil unit 132), by the distance indicated by the arrow H in FIG. 2.

A Faraday cup 35 is provided behind the wafer platen 12 (in the direction indicated by the arrow Z2 in FIGS. 1 and 3). The Faraday cup 35 measures the amount of current of the IB given to the wafer 20, and is located at the position from which the IB impinges onto the wafer 20. In this embodiment, the IB impinges on a constant point, and the irradiation point of the IB does not change.

As described above, the wafer platen 12 deviates from the position of the coil unit 132 (i.e., the position where the wafer platen 12 is moved directly by the linear motor 30) by the distance indicated by the arrow H in the drawings. On the back surface of the wafer platen 12, only the fourth driving mechanism 16 is integrally attached. Therefore, when the wafer platen 12 is moved by the linear motor 30 from the position facing the Faraday cup 35 in the direction indicated by the arrow X1 or the arrow X2, the IB directly impinges on the Faraday cup 35.

With the Faraday cup 35, the amount of current of the IB impinging on the wafer 20 is measured. Based on the measurement result, the output of the IB is controlled. By doing so, the IB impinging on the wafer 20 can be made stable, without a great change in the output.

When the wafer 20 is to be processed, the wafer platen 12, to which the wafer 20 is mounted, is moved at a high speed in the directions indicated by the arrows X1 and X2 in the drawings. This movement will be described later in detail. On the back surface of the wafer platen 12, no other components are attached, as described above.

Every time the wafer platen 12 is moved by a distance longer than its radius in the directions of the arrows X1 and X2, the IB impinges on the Faraday cup 35. In other words, the IB impinges on the Faraday cup 35 a greater number of times, and therefore the output of the IB is controlled more frequently. Accordingly, the output of the IB can be controlled with excellent response.

Figure 4:
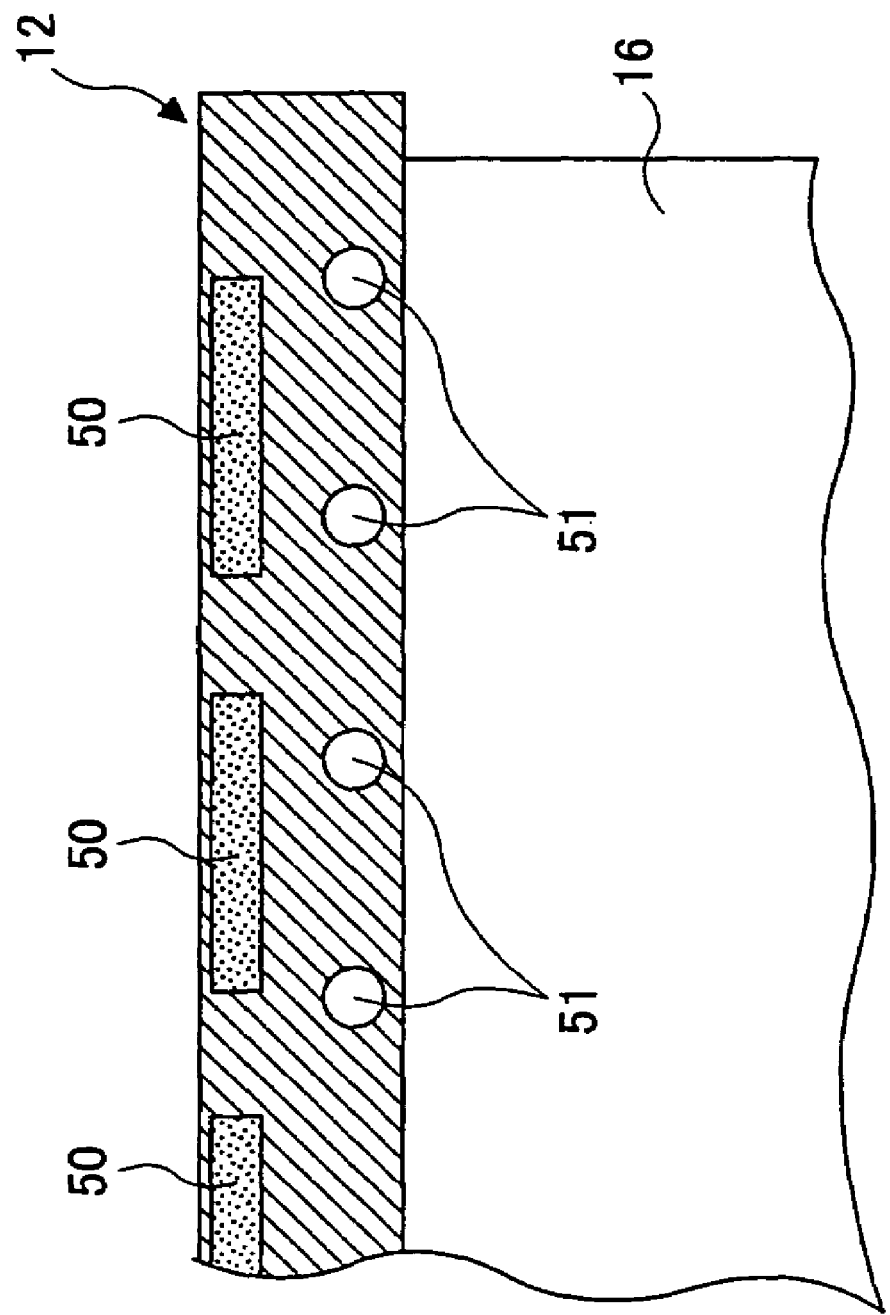
FIG. 4 illustrates a wafer platen mounted to the substrate transfer device that is the first embodiment of the present invention.

FIG. 4 is an enlarged section view of a part of the wafer platen 12. As shown in FIG. 4, electrostatic chuck electrodes 50 and cooling pipes 51 are provided in the wafer platen 12. The electrostatic chuck electrodes 50 are supplied with a power source from outside, and attract the wafer 20 with suction power generated by the electrostatic force. In this manner, the wafer 20 is fixed to the wafer platen 12.

As an electrostatic chuck method using the electrostatic chuck electrodes 50 for attaching the wafer 20 to the wafer platen 12 is employed in this embodiment as described above, the wafer 20 can be securely mounted to the wafer platen 12 even in the vacuum processing chamber 11.

The cooling pipes 51 are located in the vicinity of the attachment position of the wafer 20. The cooling pipes 51 are supplied with cooling liquid or cooling gas (hereinafter referred to as a refrigerant) from outside. With this structure, even if the wafer 20 is heated due to the irradiation with the IB, the refrigerant flowing through the cooling pipes 51 cools the wafer 20 so as to prevent the wafer 20 from decomposing or becoming deformed.

The wafer platen 12 having the above structure is rotationally energized by the fourth driving mechanism 16. The rotating direction of the wafer platen 12 is indicated by an arrow in FIG. 2. The fourth driving mechanism 16 is an electric motor or a hydraulic motor. The fourth driving mechanism 16 rotates the wafer platen 12 by supplying a power source or a drive fluid (drive liquid or drive air) to the wafer platen 12.

As shown in FIG. 3, the rotation axis 55 of the wafer platen 12 is substantially perpendicular to the wafer mounting surface 12a, and extends through the center S of the wafer 20. By rotating the wafer platen 12 in this manner, the wafer 20 can be uniformly irradiated with the IB.

Since the wafer platen 12 is located in the vacuum processing chamber 11 in this embodiment, it is necessary to supply the power source for the electrostatic chuck electrodes 50, the refrigerant to be introduced into the cooling pipes 51, and a power source or a drive fluid for driving the fourth driving mechanism 16, from the outside of the vacuum processing chamber 11.

In this embodiment, the power source wiring and the drive fluid pipes for the above supplies are collectively arranged as a collective cable 29, as shown in FIG. 2. This collective cable 29 is connected to the wafer platen 12 and the fourth driving mechanism 16 via a hollow support pillar 25, a cable bearing 31, and a support pillar 54. The collective cable 29 is also provided with an introduction pipe for introducing a refrigerant (described later) to cool the linear motor 30 into a main fluid path 152, and a discharging pipe for discharging the refrigerant through the main fluid path 152.

The pillar 25 rotates in the directions indicated by the arrows A1 and A2 in FIG. 2, and also moves up and down in the directions indicated by the arrows Y1 and Y2 in the drawings. The wafer platen 12 and the fourth driving mechanism 16 are reciprocated in the directions indicated by the arrows X1 and X2 by the second driving mechanism 14A. Extending inside the hollow support pillar 25, the collective cable 29 leads to the table 24.

The cable bearing 31, which is bent and can be elongated and contracted in the directions of the arrows X1 and X2, is provided between the table 24 and the wafer platen 12. The collective cable 29 is connected to the wafer platen 12 and the fourth driving mechanism 16 via the cable bearing 31. In this structure, even though a number of mechanisms exist for moving the wafer 20, the power source for the electrostatic chuck electrodes 50, the refrigerant to be introduced into the cooling pipes 51, and the power source or drive fluid for driving the fourth driving mechanism 16, can be surely supplied to the wafer platen 12 and the fourth driving mechanism 16 from the outside of the vacuum processing chamber 11.

The description of this embodiment now moves on to the first driving mechanism 13A.

The first driving mechanism 13A moves the wafer platen 12 (and the wafer 20) in the single direction indicated by the arrow Y1 or the single direction indicated by the arrow Y2 in the drawings. In this embodiment, the first driving mechanism 13A is located outside the vacuum processing chamber 11. The first driving mechanism 13A includes a Y-direction device motor 21, an elevating mechanism 22, the table 24, and the support pillar 25.

The Y-direction driving motor 21 drives the elevating mechanism 22. The Y-direction driving motor 21 is connected to a controller 40 (described later), which controls the driving of the Y-direction driving motor 21.

The elevating mechanism 22 is formed by a ball screw, for instance. The lower end of the ball screw is connected to the Y-direction driving motor 21 via a belt 33. Also, an engaging member 23 is engaged with the ball screw. A flange 36 fixed to the lower end of the support pillar 25 is integrally bonded to the engaging member 23.

Accordingly, as the Y-direction driving motor 21 is actuated, the ball screw of the elevating mechanism 22 is rotated. The engaging member 23 moves up and down in the directions indicated by the arrows Y1 and Y2, depending on the rotation direction of the Y-direction driving motor 21. Since the flange 36 fixed to the lower end of the support pillar 25 is integrally bonded to the engaging member 23, as described above, the support pillar 25 is moved up and down by the engaging member 23 moving up and down via the flange 36.

The upper part (a predetermined part in the direction of the arrow Y2) of the support pillar 25 is located in the vacuum processing chamber 11, while the lower part (a predetermined part in the direction of the arrow Y1) of the support pillar 25 is located outside the vacuum processing chamber 11. The vacuum processing chamber 11 is situated above a base 18 that is attached to a setting deck 17. The inside of the vacuum processing chamber 11 is constantly maintained at a predetermined vacuum by a vacuum pump (not shown).

The support pillar 25 is inserted into the vacuum processing chamber 11 via an air bearing 26. This air bearing 26 is made up of a differential pumping unit 27 and a jet unit 28. Even though the support pillar 25 is inserted into the vacuum processing chamber 11, the degree of vacuum in the vacuum processing chamber 11 is not reduced. Also, the support pillar 25 is rotatable with respect to the vacuum processing chamber 11 in the directions indicated by the arrows A1 and A2 in FIG. 2, and to be movable in the directions of the arrows Y1 and Y2 in the drawings.

The upper end of the support pillar 25 (at the end of the Y2 direction) is provided with the table 24. This table 24 is located inside the vacuum processing chamber 11, and extends in the directions indicated by the arrows X1 and X2 in the drawings.

The wafer platen 12 is placed on the table 24 via the second driving mechanism 14A. As the Y-direction driving motor 21 is actuated and the support pillar 25 is moved in the directions of the arrows Y1 and Y2 via the elevating mechanism 22, the engaging member 23, and the flange 36, the wafer platen 12 (and the wafer 20) are also moved in the directions indicated by the arrows Y1 and Y2 in the drawings.

The description of this embodiment now moves on to the second driving mechanism 14A.

The second driving mechanism 14A continuously reciprocates the wafer platen 12 (and the wafer 20) in a linear fashion in the directions indicated by the arrows X1 and X2 in the drawings. The second driving mechanism 14A is located inside the vacuum processing chamber 11. More specifically, being placed on the table 24 that comprises the first driving mechanism 13A, the second driving mechanism 14A is located inside the vacuum processing chamber 11.

In this embodiment, the linear motor 30 is used as the second driving mechanism 14A. This linear motor 30 is also connected to the controller 40, which controls the driving of the linear motor 30. In the following, the structure of the linear motor 30 will be described in detail, with reference to FIGS. 5 through 20.

Figure 5:
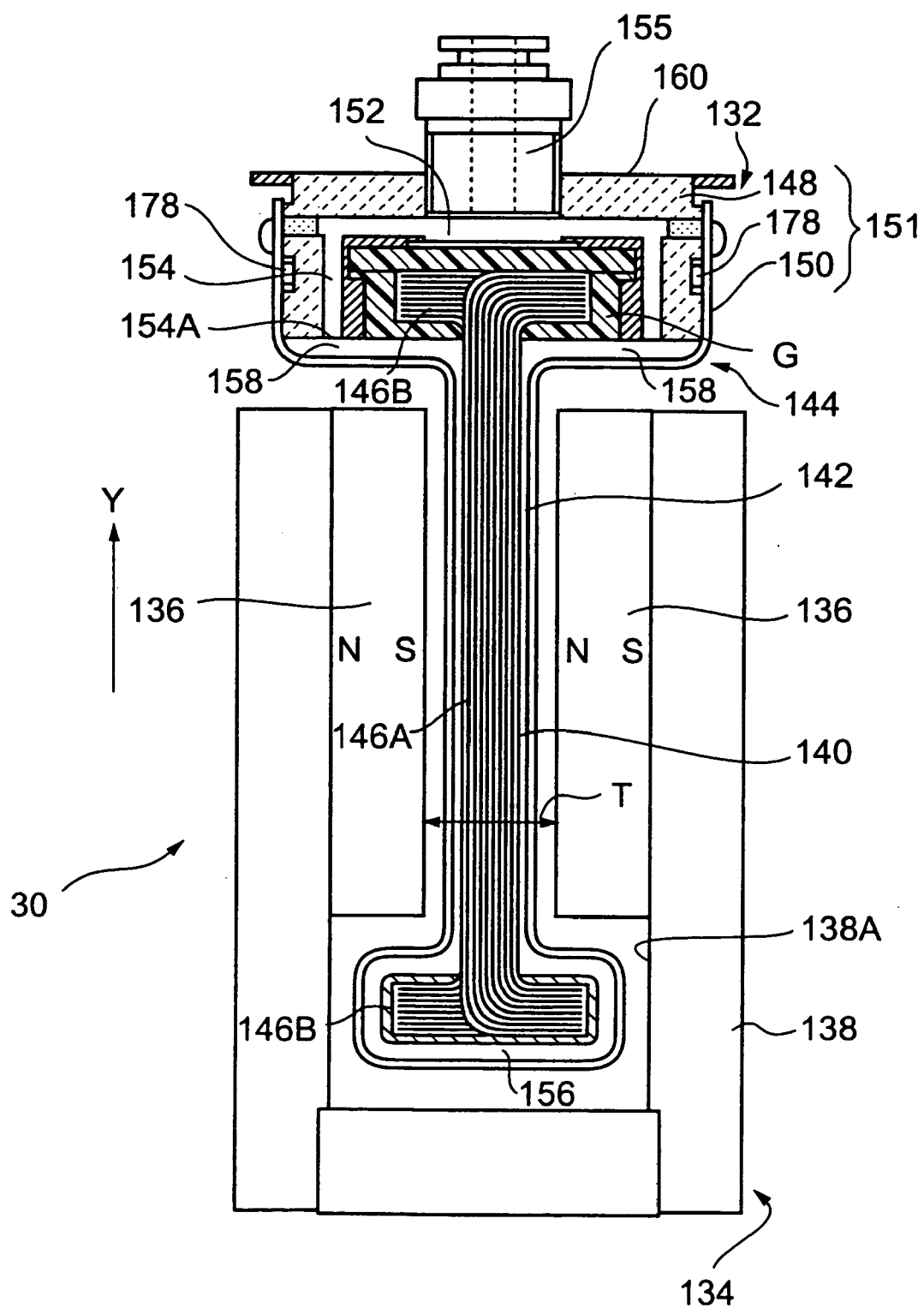
FIG. 5 is a section view of a linear motor employed in the substrate transfer device that is the first embodiment of the present invention.
Figure 6:
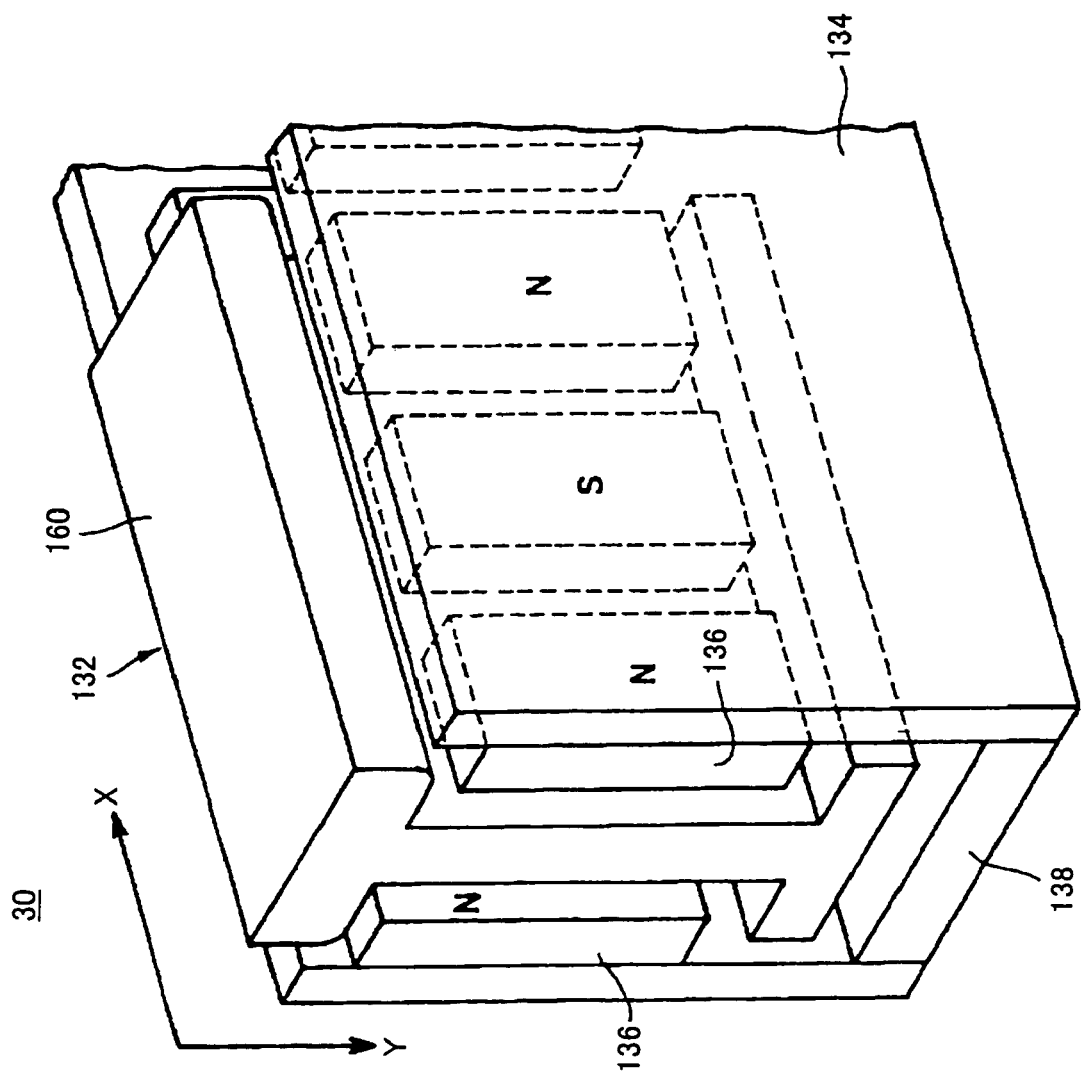
FIG. 6 is a perspective view of a part of the linear motor employed in the substrate transfer device that is the first embodiment of the present invention.
Figure 7:
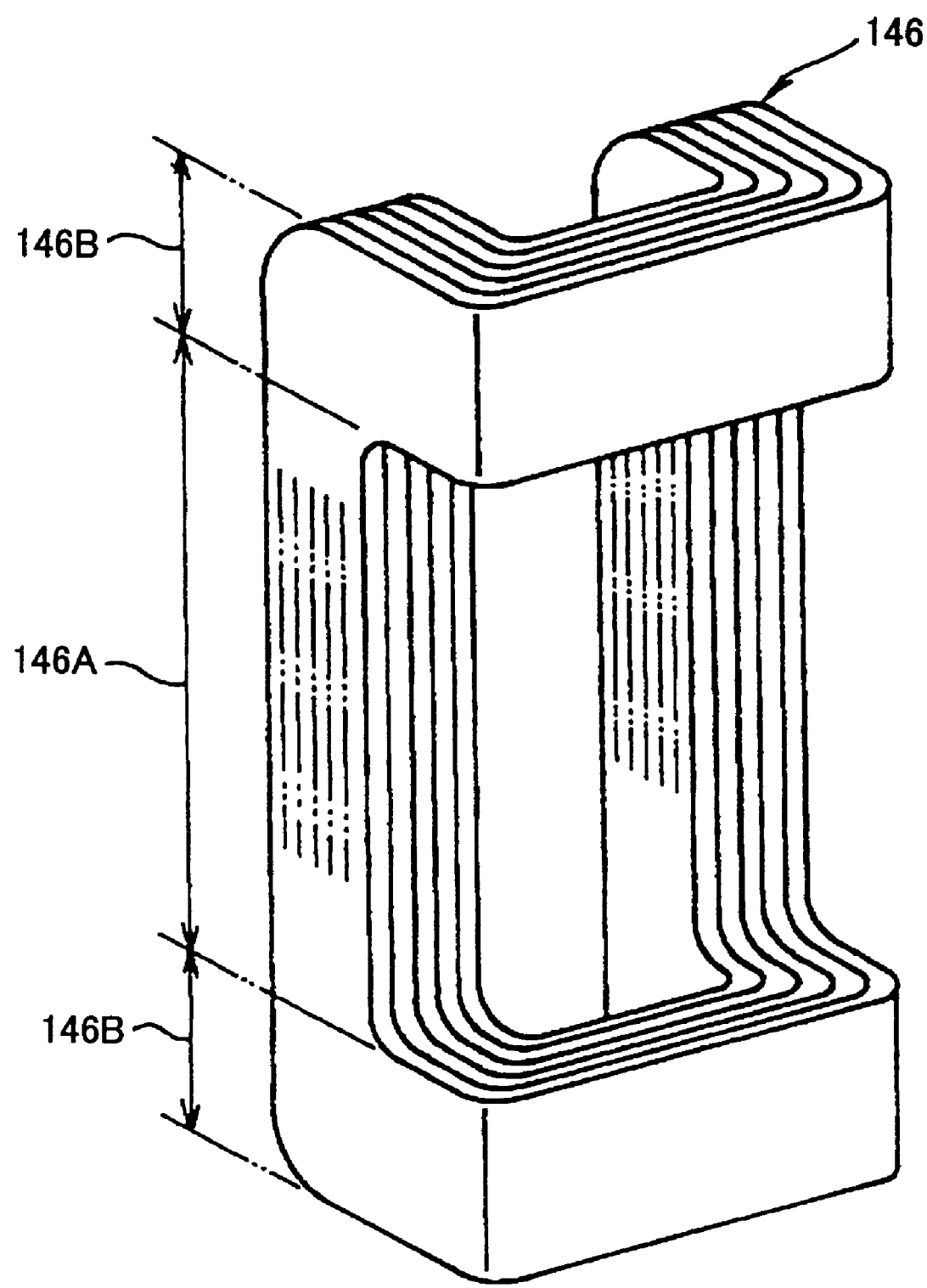
FIG. 7 is a perspective view of a coil piece accommodated in a coil cooling jacket of the linear motor employed in the substrate transfer device that is the first embodiment of the present invention.

FIG. 5 shows the coil unit 132 used for the linear motor 30. The wafer platen 12 and the fourth driving mechanism 16 described above are placed on the support pillar 54 that stands from the coil unit 132.

The coil unit 132 includes a flat-panel coil 140 that extends in a direction X (shown in FIG. 6) and faces magnets 136 of a magnet unit 134, and a coil cooling jacket 144 that accommodates the coil 140 with a predetermined gap 14 and can cool the coil 140 by supplying a refrigerant flowing through the gap 142.

In this embodiment, the coil 140 serves as a needle, while the magnets 136 serve as a stator. Accordingly, in the linear motor 30, the coil unit 132 moves in relation to the magnet unit 134.

The magnet unit 134 includes a base 138 that has a section similar to a rectangular frame minus one side, and the magnets 136 are attached to the inner walls 138A of the base 138.

Figure 8:
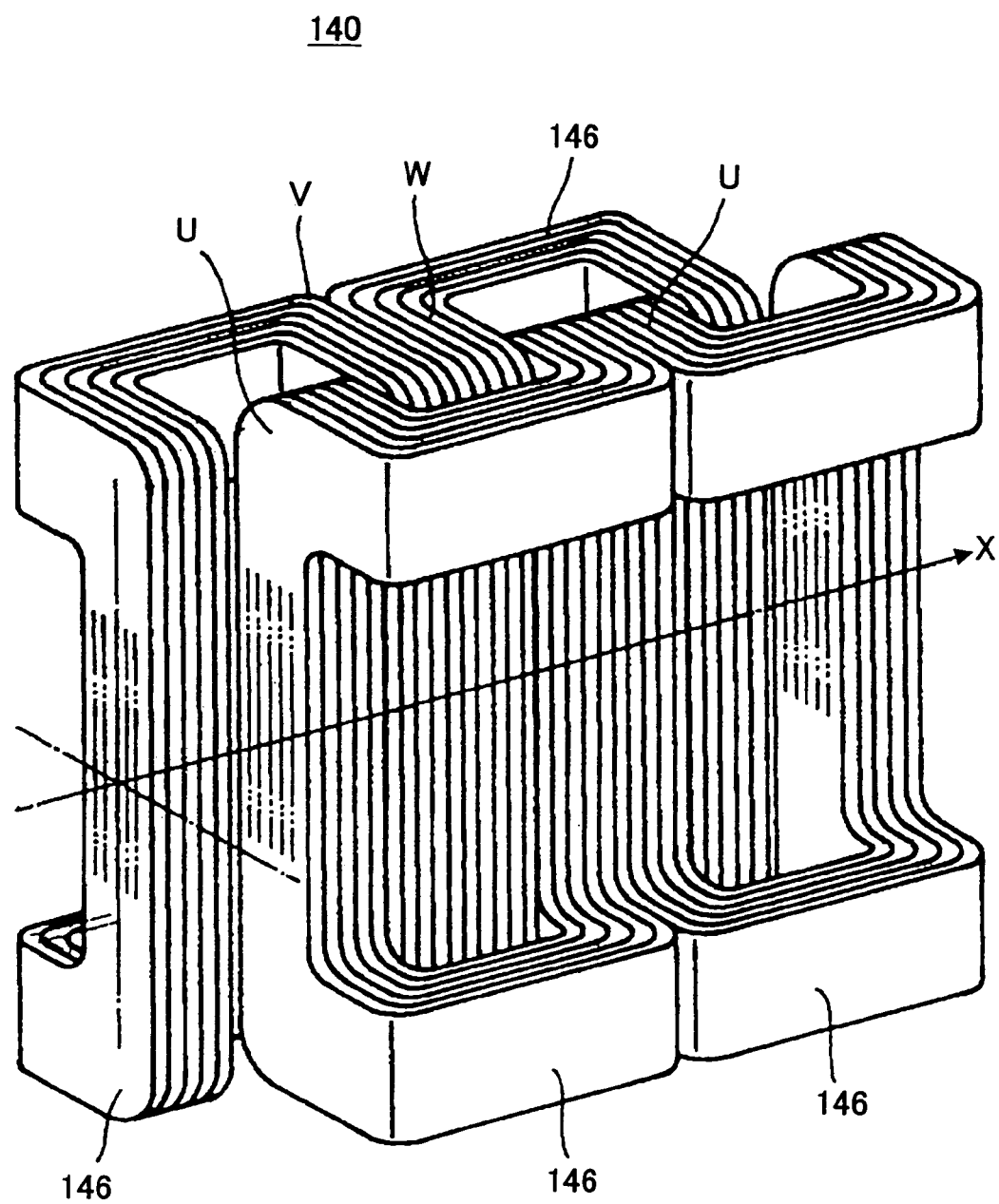
FIG. 8 is a perspective view of a coil formed by assembling a plurality of coil pieces, each of which is the same as the coil piece shown in FIG. 7.

The flat-panel coil 140 has a saddle-shaped structure having an I-shaped section perpendicular to the moving direction X shown in FIG. 8. More specifically, the flat-panel coil 140 is made up of a plurality of coil pieces 146 shown in FIG. 7. Each of the coil pieces 146 is formed by lead wire that is wound into rings. The lead wire is wound in such a manner as to form a linear linking conductive part 146A and effective conductive parts 146B that are formed by bending at either end of the linking conductive part 146A.

Figure 9:
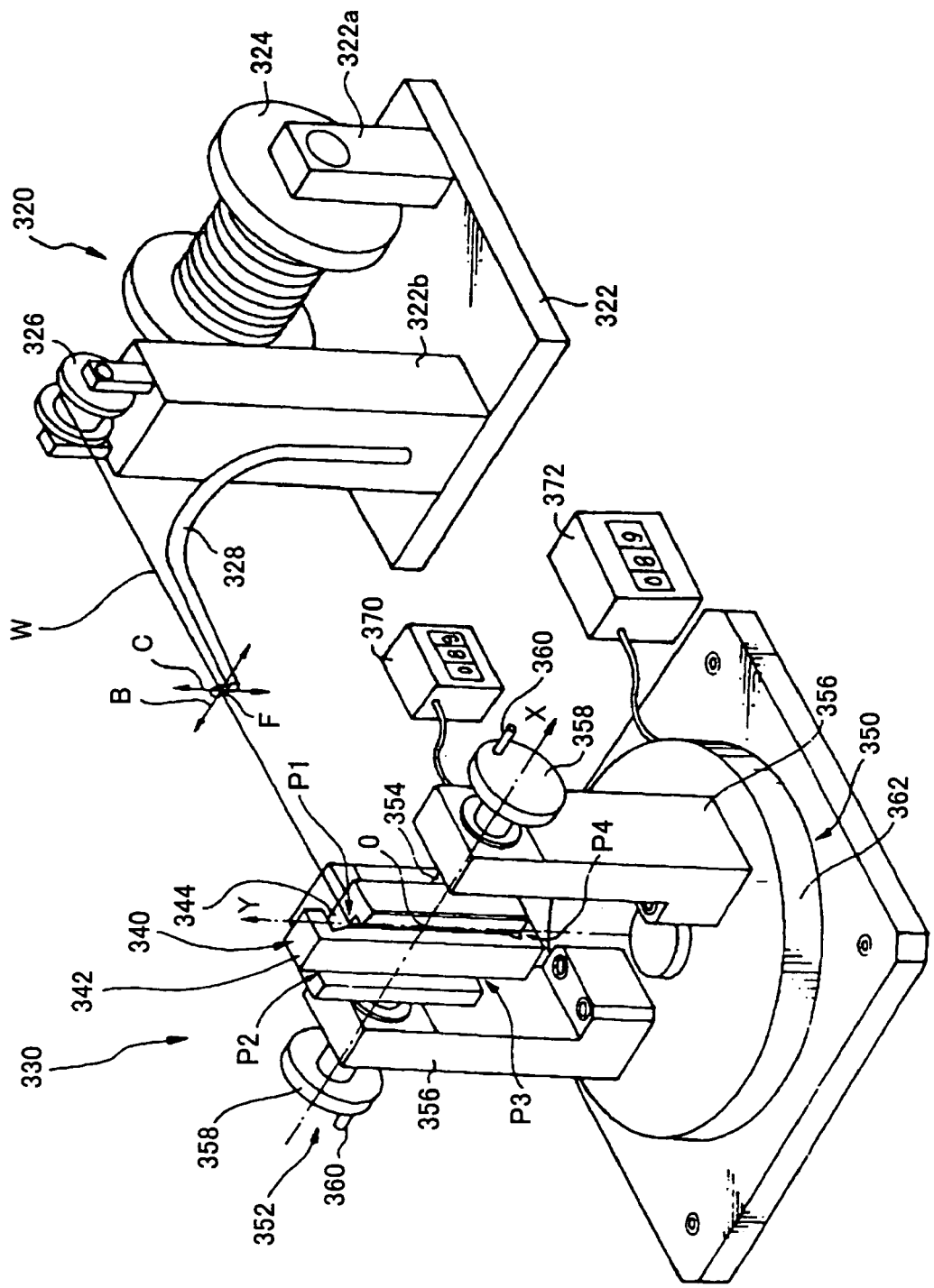
FIG. 9 is a schematic perspective view of a coil piece winder device employed in the substrate transfer device that is the first embodiment of the present invention.

FIG. 9 shows a winder device for winding the lead wire into a coil piece 146. In the following, the winder device and the method of winding the lead wire into the coil pieces 146 will be described. In FIG. 9, the winding has just started to form the coil pieces 146. The direction of sending out the lead wire W, which is to become the coil pieces 146, is defined as along the Z-axis, and the axes that are perpendicular to each other in the plane perpendicular to the Z-axis are defined as the X-axis and the Y-axis.

For ease of explanation, the axis in the horizontal direction (the rotation center axis of the side, which is to become the linking conductive part 146A) is defined as the X-axis, and the axis in the vertical direction (the rotation center axis of the sides to be the effective conductive parts 146B) is defined as the Y-axis. This winder device includes a lead wire sender (or a lead wire sending mechanism) 320 for sending out the lead wire W in the Z-axial direction, and a winder 330 for winding the lead wire W that has been sent out.

The structure of the lead wire sender 320 will be first described. This lead wire sender 320 includes a base 322, a coil bobbin 324, a guide roller 326, and a guide arm 328. A pair of first support pillars 322a and a second support pillar 322b stand vertically from the base 322. The coil bobbin 324 is supported rotatably around the X-axis by the first support pillars 322a, and rewinds and then sends out the wound lead wire W. The guide roller 326 is supported rotatably around the X-axis by the top part of the second support pillar 322b, and changes the send-out direction of the lead wire W to the Z-axial direction. The guide arm 328 is attached to a side face of the second support pillar 322b, and fixes the position (the coordinates) for sending out the lead wire W.

The winder 330 includes a winding die 340, and first and second rotating mechanisms 350 and 352, respectively. The winding die 340 is positioned so that its center corresponds to the origin O of the above described X-axis and Y-axis. The winding die 340 has engaging points P1 through P4 at the top part having a rectangular shape, and functions as a base when winding up the lead wire W into a rectangular coil by the rotation of the winding die 340 itself.

The structure of the winding die 340 is shown in detail in FIG. 9. The winding die 340 includes a first piece 342 and a second piece 344. The first piece 342 is located inside the two sides 314A, which are to become the effective conductive parts 146B. The first piece 342 extends beyond the two sides, which are to become the linking conductive part 146A, and has a pair of first winding parts 342a, around which the linking conductive part 146A is wound.

The second piece 344 is located inside the two sides 316A, which are to become the linking conductive part 146A. The second piece 344 extends beyond the two sides 314A, which are to become the effective conductive parts 146B, and has a pair of second winding parts 344a, around which the effective conductive parts 146B are wound.

Each of the first winding parts 342a is sloped so as to have a longer distance from the second piece 344 at the end of the first winding part 342a. This structure is designed for comfortably accommodating the liking conductive parts 146A of the coil pieces that are arranged to form the coil 146 for the linear motor.

Folding parts 342b and 344b protrude from the end parts of the first winding parts 342a of the first piece 342 and the second winding parts 344a of the second piece 344, respectively, toward each other piece. With the folding parts 342b, the parts of the lead wire W to become the linking conductive part 146A are shaped, and the rectangular section of the linking conductive part 146A is maintained. With the folding parts 344, the parts of the lead wire W to be the effective conductive parts 146B are shaped, and the rectangular section of each of the effective conductive part 146B can be maintained.

The first piece 342 and the second piece 344 are detachably overlapped with each other in a cross-shaped fashion via a plurality of bolts 332. With the first piece 342 and the second piece 344 being overlapped with each other in the cross-shaped fashion, the first winding parts 342*a* of the first piece 342 and the second winding parts 344*a* extend beyond each other. The four crossing points formed in this manner serve as the engaging points P1 through P4 for the lead wire W.

The first rotating mechanism 350 includes: a shaft 354 that is integrally formed on the second piece 344 of the winding die 340 along the X-axis via holding members 353*a* and 353*b* and bolts 355; a pair of third support pillars 356 that rotatably support the shaft 354; disk plates 358 that are formed integrally with the shaft 354; and handles 360 for rotating the disk plates 358. In this structure, the winding die 340 is manually rotated around the X-axis.

The second rotating mechanism 352 is mainly formed by a rotating base 362 that makes the winding die 340 and the entire first rotating mechanism 350 rotatable around the Y-axis. The rotating base 362 is manually rotated with the handles 360, the disk plates 358, and the third support pillars 356 of the first rotating mechanism 350. Accordingly, the handles 360, the disk plates 358, and the third support pillars 356 not only constitute a part of the first rotating mechanism 350, but also serve as a part of the second rotating mechanism 352. In FIG. 9, reference numerals 370 and 372 indicate counters that count and display the number of rotations of the first rotating mechanism 350 and the second rotating mechanism 352, respectively.

Although a structure in which the winding die 340 is manually rotated in the above manner is employed in this embodiment, it is possible to employ a structure in which the disk plates 358 and the rotating base 362 are electrically rotated by motors that are not shown in the drawings.

In such a case, each of the motors are controlled so that the sending speed S for the lead wire W being sent from the lead wire sender 320 becomes constant. By doing so, the tension Te of the lead wire W can be maintained substantially at a constant level, and the winding can be smoothly carried out without unevenness. Since the sending speed S for the lead wire W varies with the rotation speed of the guide roller 326, a rotation speed sensor (not shown) for detecting the rotation speed of the guide roller 326 is attached to the guide roller 326.

If a torque sensor for detecting the tension force Te of the lead wire W (or any of conventional structures of various types for detecting elastic deformation or the like, such as a tension sensor mechanism) is employed, the motors for rotating the disk plates 358 of the first rotating mechanism 350 and the rotating base 362 of the second rotating mechanism 352 are controlled in such a manner that the detected tension force Te becomes constant.

Although the sending position (coordinates) F where the lead wire W is sent out by the lead wire sender 320 is secured in a fixed position by the guide arm 328 in this embodiment, it is possible to change the send-out position F in the X-axial direction or the Y-axial direction, as indicated by the arrows B and C in FIG. 9.

In such a case, the send-out position F is changed and controlled in synchronization with the rotation of the winding die 340, so that the lead wire W can be wound up as if being wound around a simple cylinder (in an aligned winding fashion).

Further, the winding state of the effective conductive parts 146B that directly help to generate magnetic force can be made dense by controlling the send-out position F in the X-axial direction. In a structure in which the send-out position F can be also changed to the Y-axial direction, the winding state of the linking conductive part 146A can be well maintained.

Next, the functions of the winder device will be described.

Figure 10:
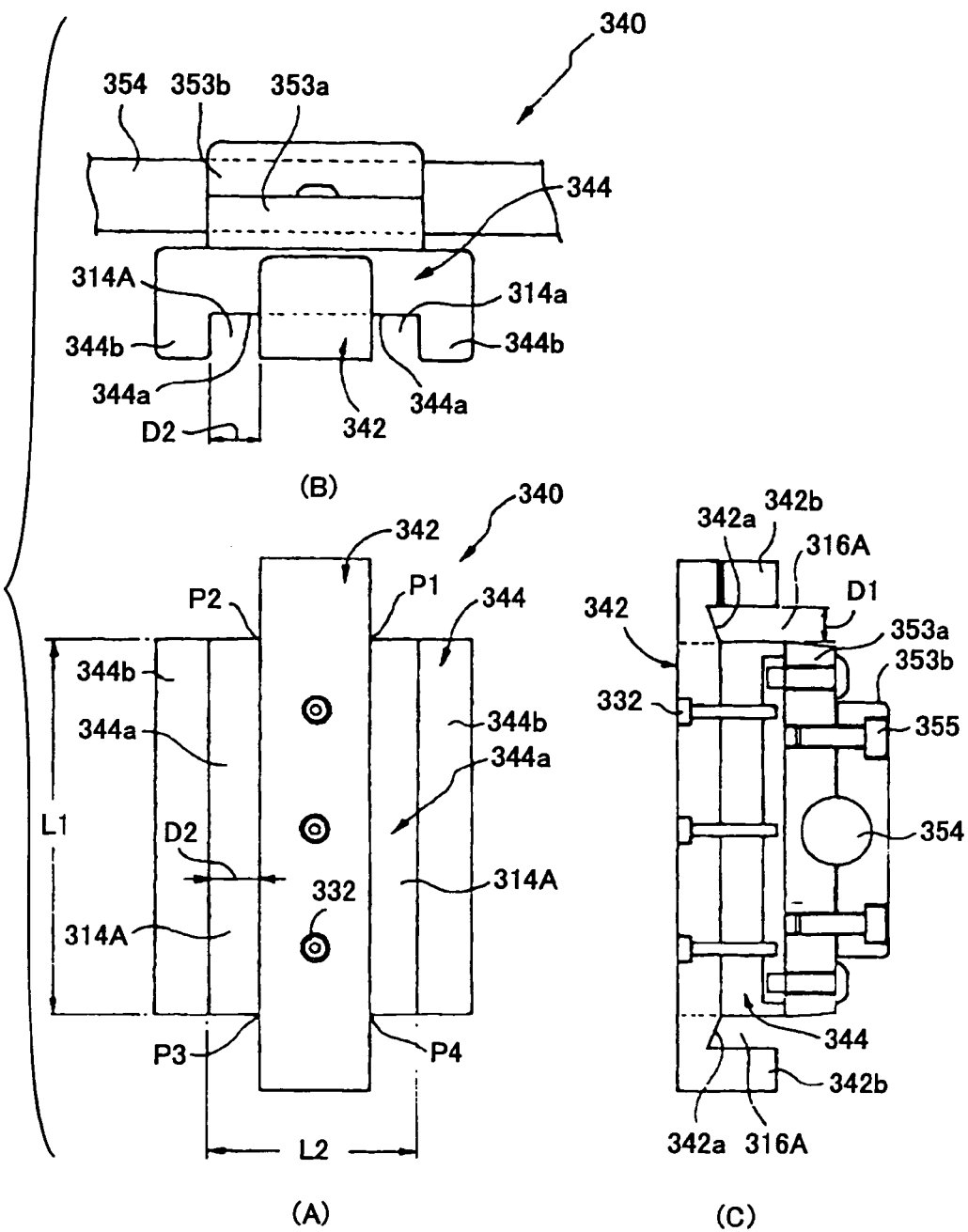
FIG. 10-(A) is a front view of a winding die provided in the coil piece winder device shown in FIG. 9, FIG. 10-(B) is a plan view of the winding die provided in the coil piece winder device shown in FIG. 9, and FIG. 10-(c) is a section view of the winding die provided in the coil piece winder device shown in FIG. 9.
Figure 11:
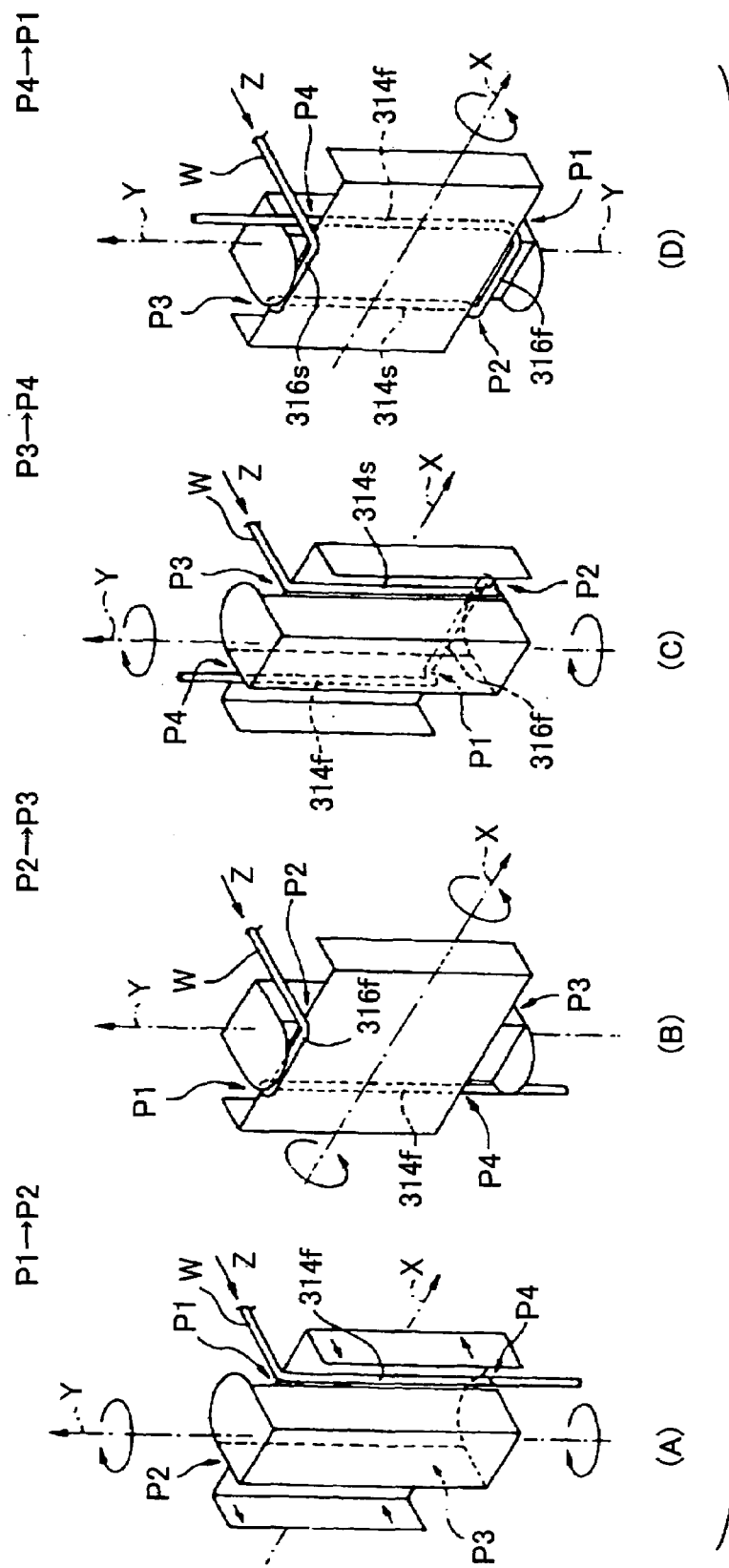
FIGS. 11-(A) through 11-(D) illustrate a lead wire winding process carried out by the coil piece winder device shown in FIG. 9.

As shown in FIGS. 9 through 11, the lead wire W sent out in the Z-axial direction via the coil bobbin 324, the guide roller 326, and the guide arm 328, is folded at the engaging point P1 of the winding die 340. In this initial state, an initial effective conductive part 314*f* (146B) is formed as shown in FIG. 11-(A). Here, the formation of this initial state can be carried out by directly folding the lead wire W or combining with the rotation of the winding die 340 around the X-axis.

The winding die 340 is then rotated around the Y-axis by 180 degrees by the second rotating mechanism 352. This rotation causes torsion at the engaging point P1, so that the lead wire W is firmly engaged at the engaging point P1. With this engaging point P1 being set as the point of origin, the winding die 340 is rotationally moved toward the lead wire W, so that the lead wire W reaches the engaging point P2, which is a terminal point. Here, an initial linking conductive part 314*f* (146A) tensely bridges between the engaging points P1 and P2, as shown in FIG. 11-(B). This "tense bridging" is carried out by moving the winding die 340 toward the stress-free lead wire W that is newly supplied. Accordingly, side force (torsion stress) is not caused on the plane that includes the Z-axis and the linking conductive part 146A. Even though the coil to be formed is a deformed coil, most of the torsion caused at the engaging point P1 is not carried to the next engaging point P2.

After the formation of the state shown in FIG. 11-(B), the winding die 340 is further rotated around the X-axis 180 degrees. This rotation causes torsion at the engaging point P2, so that the lead wire W is firmly engaged at the engaging point P2.

With this engaging point P2 being set as the point of origin, the winding die 340 is rotationally moved to the lead wire W, so that the lead wire W reaches the engaging point P3, which is a new terminal point. By doing so, a next effective conductive part 314*s* is tensely formed, as shown in FIG. 11-(*c*). Since this "tense bridging" is also carried out by moving the winding die 340 toward the stress-free lead wire W that is newly supplied, side force (torsion stress) is not caused on the plane that contains the Z-axis and the effective conductive part 146B. Accordingly, most of the torsion caused at the engaging point P2 is not carried to the next engaging point P3.

The winding die 340 is further rotated around the Y-axis again 180 degrees, so that the lead wire W tensely bridges the distance between the engaging points P3 and P4 in the same manner as the tense bridging between the engaging points P1 and P2 shown in FIG. 11-(A). As a result, a next linking conductive part 314*s* is formed as shown in FIG. 11-(D), and one cycle of winding is completed. The procedures shown in FIGS. 11-(A) through 11-(D) area are then repeated, and the winding operation is stopped when the counters 370 and 372 indicate a predetermined number of winding cycles.

As is apparent from the above explanation, when any of the effective conducive parts 146B are formed, and when any of the linking conductive parts 146A are formed, the lead wire W is engaged at the corresponding one of the engaging points P1 through P4, and is then bent 90 degrees, with the engaging point being the center point.

With the above structure, the effective conductive parts 146B and the linking conductive parts 146A can receive a new part of the lead wire W from the lead wire sender 320 in the optimum direction and at the optimum angle, despite the fact that this coil is a deformed coil having a special shape with the two linking conductive parts 146A are bent in the same direction from the effective conductive parts 146B. In this manner, the lead wire W can be smoothly wound up without excessively increasing the winding tension.

Although the first rotating mechanism 352 and the second rotating mechanism 350 of the winder 330 rotate the winding die 340 by the same degrees, the winding 340 is rotationally reversed around the X-axis and the Y-axis, alternately. When the rotation of the winding die 340 with respect to the lead wire W, the following four movements are repeated:

1) Forward rotation around the axis that is parallel to the linking conductive parts 146A by 180 degrees (FIG. 11-(D)→FIG. 11-(A));
2) Forward rotation around the axis that is parallel to the effective conductive parts 146B by 180 degrees (FIG. 11-(A)→FIG. 11-(B));
3) Backward rotation around the axis that is parallel to the linking conductive parts 146A by 180 degrees (FIG. 11-(B)→FIG. 11-(C)); and
4) Backward rotation around the axis that is parallel to the effective conductive parts 146B by 180 degrees (FIG. 11-(c)→FIG. 11-(D)).

When one winding cycle is completed, the lead wire W that has been twisted by the forward rotations returns to the original state by the backward rotations. In this manner, twists do not accumulate, no matter how many times the winding operation is repeated.

As described earlier, each new winding operation is performed in a state in which side force (torsion stress) is not caused on the plane formed by the Z-axis and the effective conductive parts 146B, and the plane formed by the Z-axis and the linking conductive parts 146A. In this manner, little torsion stress is caused on the lead wire W between engaging points, and the torsion caused at an engaging point is hardly carried to a next engaging point.

The winding technique employed in this embodiment belongs to a method called "random winding method", unless the send-out position is controlled. Each of the coil pieces 146 produced by winding the lead wire W around the winding die 340 has quite a high linear density (the linear moment of the conductive part). However, the above shaping process further increases the linear density of the effective conductive parts 146B. Accordingly, a linear density that is as high as a linear density obtained by an aligned winding method can be obtained by this random winding method.

In the following, a method of forming the coil pieces 146 and methods of forming and producing the coil 140 with the coil pieces 146 will be described.

Figure 12:
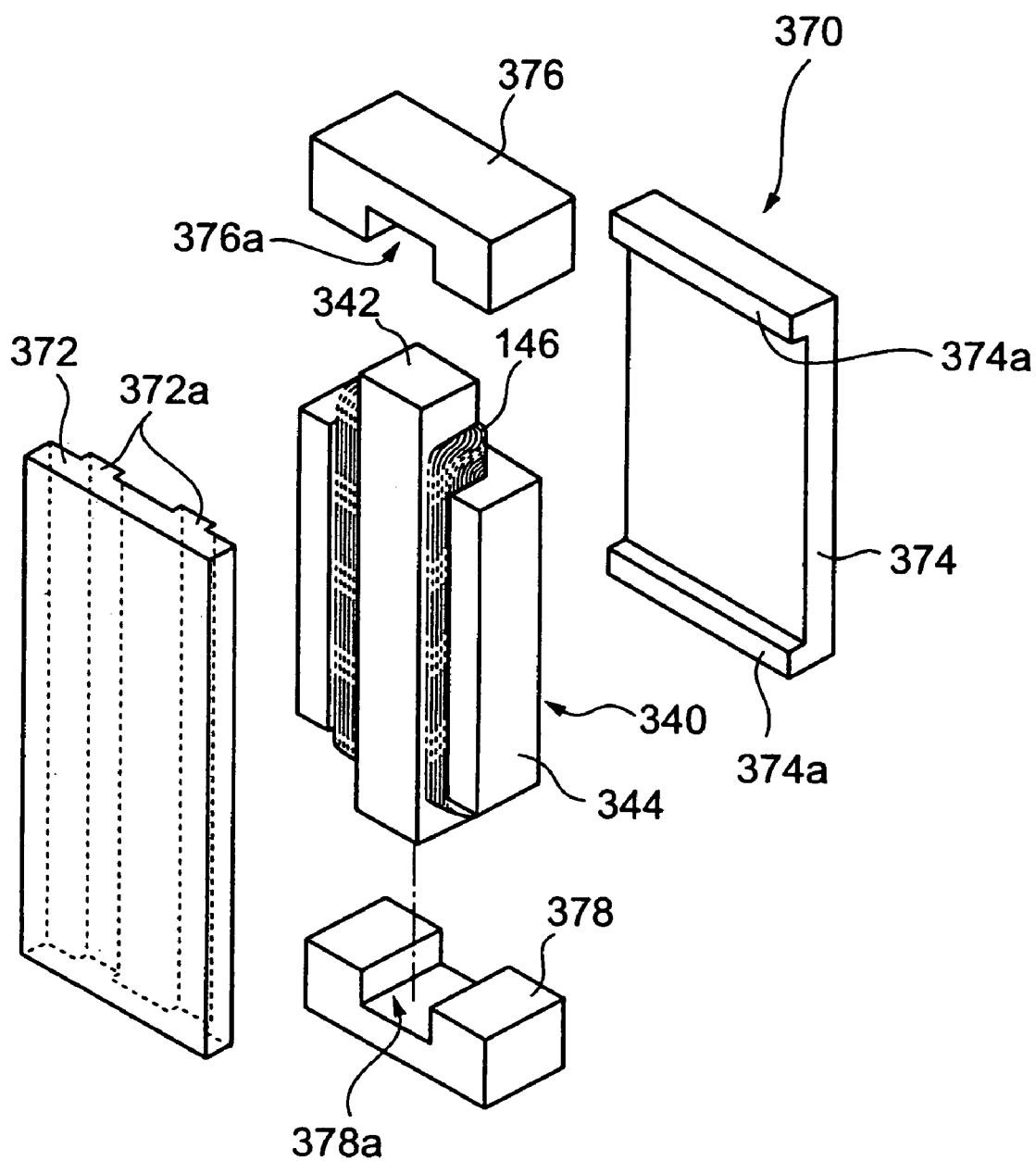
FIG. 12 is an exploded perspective view of a former used for producing a coil.

A former 370 is mounted to each of the coil pieces 146, which is still wound around the winding die 340, as shown in FIG. 12. The former 370 includes plates 372, 374, 376, and 378. The winding die 340 still having the coil piece 146 is sandwiched by the plates 372 and 374 from both sides corresponding to the Z-axial direction. The winding die 340 is also sandwiched by the plates 376 and 378 from both sides corresponding to the Y-axial direction. The plates 372, 374, 376, and 378 have concave parts 372a, 374a, 376a, and 378a, respectively, so as to conform to the shape of the winding die 340. It should be noted that the tightening bolts and bolt holes are not shown in FIG. 12.

The former 370 is initially tightened to the winding die 340, and a predetermined current is given to the lead wire W. As a result, the lead wire W starts generating head. When the temperature of the lead wire W reaches a plastic point, the former 370 is further tightened. By doing so, the lead wire W in a plastic state can be formed into a predetermined shape. Also, coil pieces 146 having effective conductive parts 146B and linking conductive parts 146A that are uniform in terms of shape and size can be obtained by this forming technique.

Figure 13:
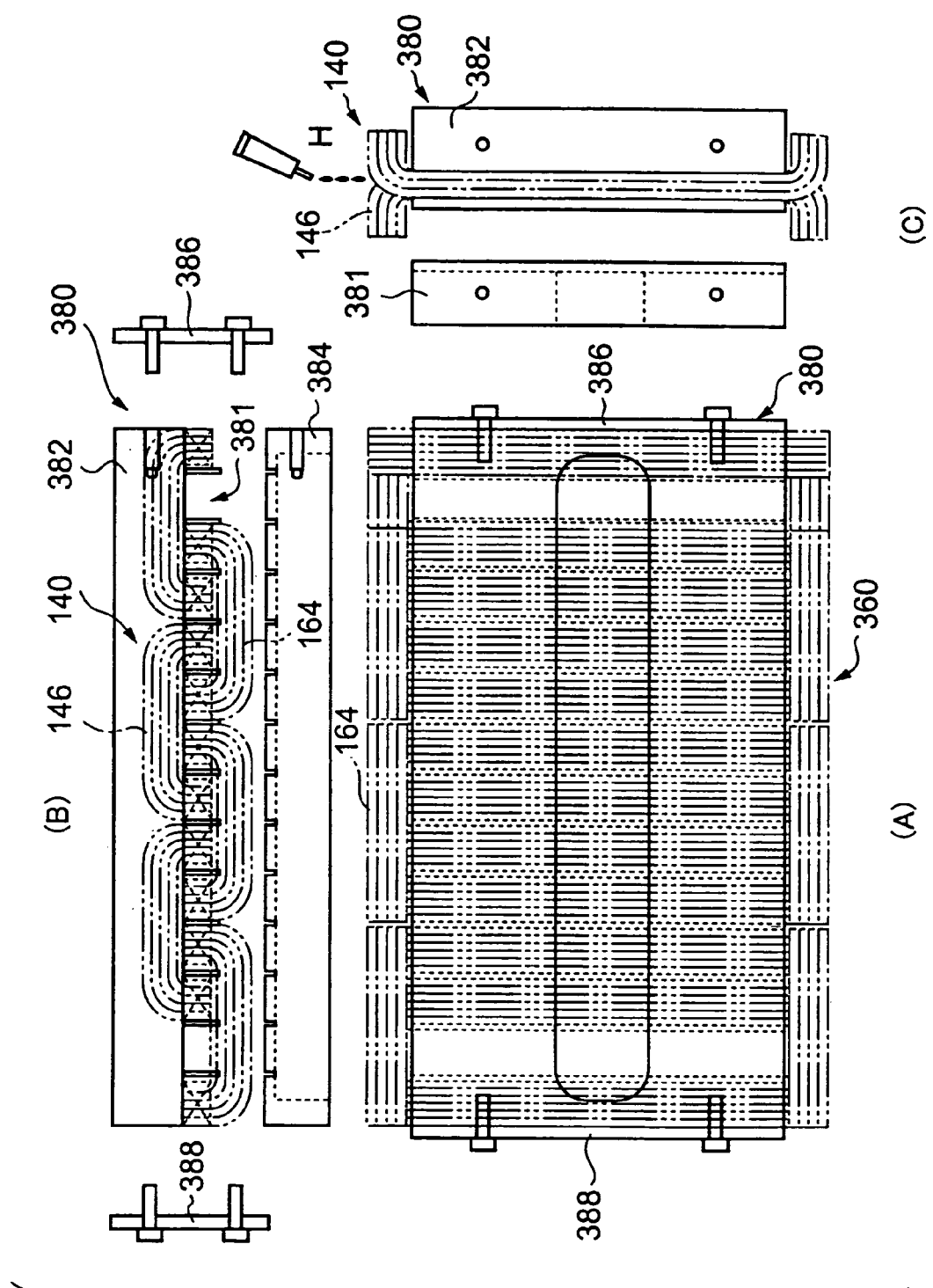
FIG. 13-(A) is an exploded front view of a first forming plate used for producing a coil, FIG. 13-(B) is an exploded plan view of the first forming plate used for producing a coil, and FIG. 13-(C) is an exploded side view of the first forming plate used for producing a coil.

After cooling down, the coil piece 146 formed in the above manner is detached from the former 370 and the winding die 340. A plurality of such coil pieces 146 are then fitted in a unit forming plate 380 and temporarily tightened, as shown in FIG. 13. The unit forming plate 380 includes: a pair of main bodies 382 and 384 that have grooves 381 into which the coil pieces 146 are inserted, and extend in the moving direction; and a pair of covers 386 and 388 that covers both ends of the main bodies 382 and 384.

The main bodies 382 and 384 hold the coil pieces 146 without gaps, with the linking conductive parts 146A being arranged alternately in the left and right sides in the moving direction. In this situation, the coil pieces 146 are connected in a predetermined manner. After the connection, the linking conductive parts 146 at the upper part and the lower part of the coil 140 are secured by an adhesive agent H.

Another method of producing the coil 140 with the wound coil pieces 146 will now be described.

Figure 14:
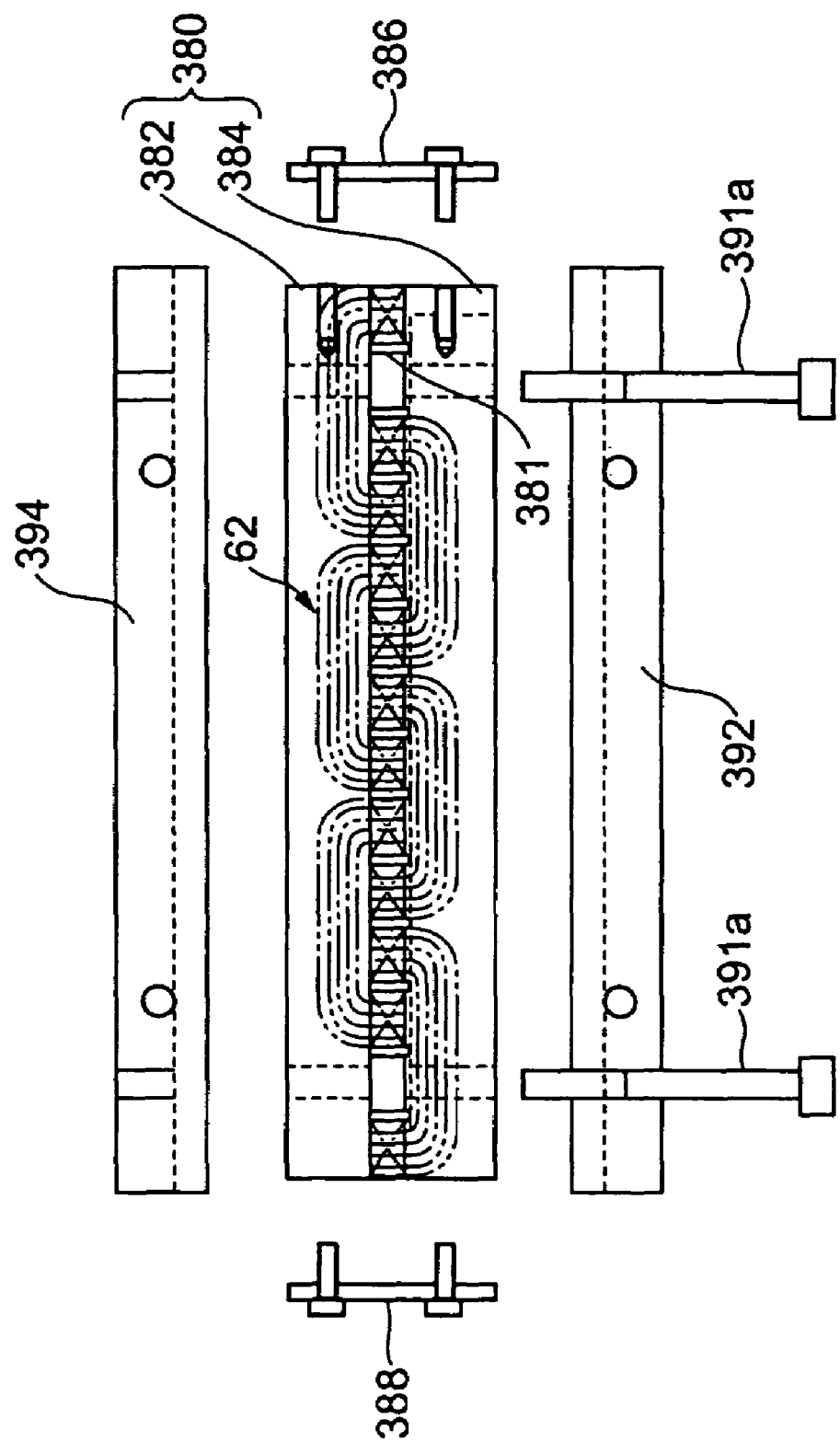
FIG. 14 is an exploded plan view of a second forming plate incorporated into the first forming plate as a modification of the embodiment shown in FIG. 9.
Figure 15:
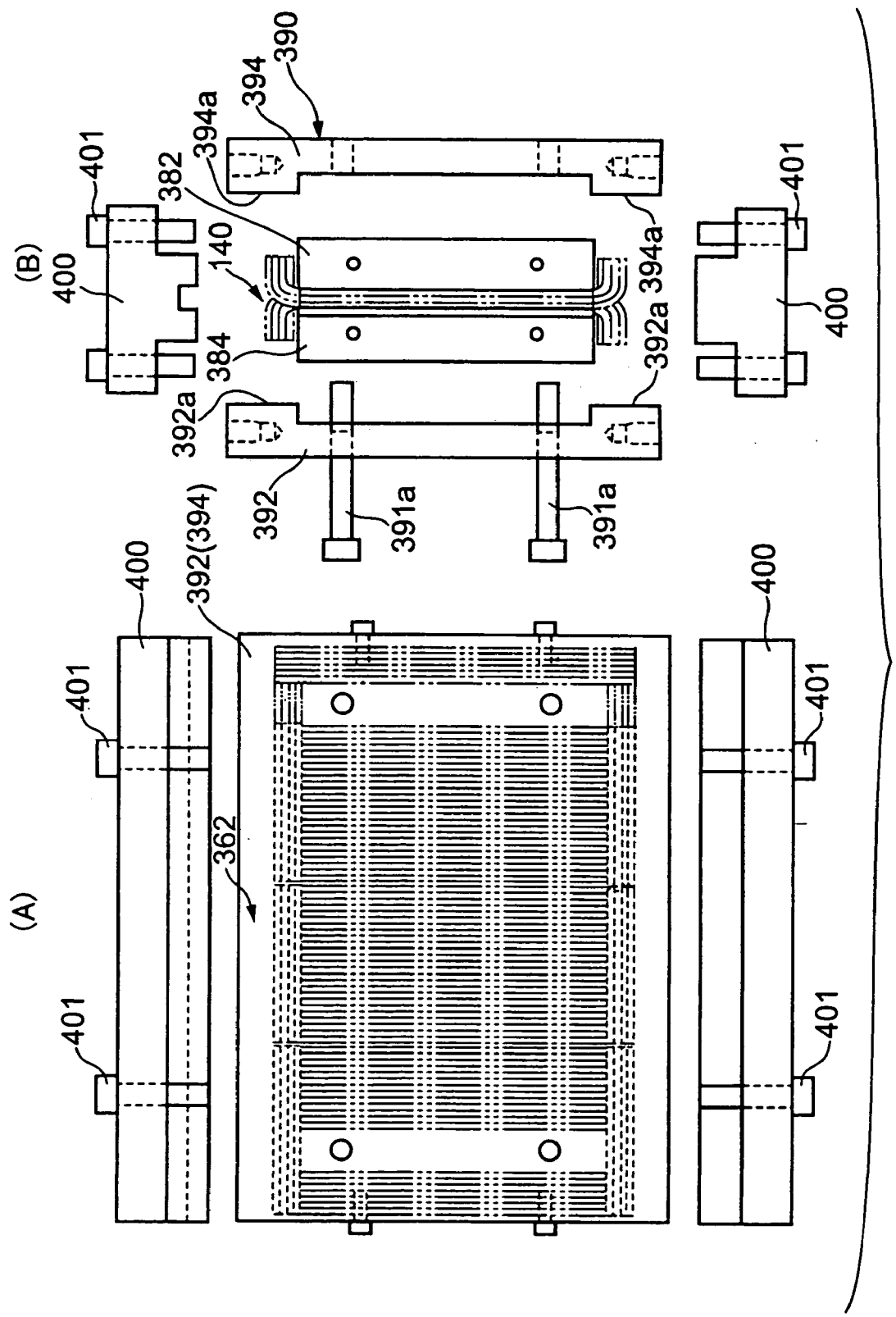
FIG. 15-(A) is an exploded front view of a structure in which a former is further incorporated into the modification shown in FIG. 14, and FIG. 15-(B) is an exploded side view of a structure in which a former is further incorporated into the modification shown in FIG. 14.

In this method, the coil pieces 146 wound around the winding die 340 are not formed by the former 370, but are immediately detached from the winding die 340 and then directly fitted in the grooves 381 of the unit forming plate 380 shown in FIG. 13. Here, the coil pieces 146 are temporarily tightened to the unit forming plate 380. After that, the coil pieces 146 are connected to one another in accordance with the design of the coil 140, and a second unit forming plate 390 shown in FIGS. 14 and 15 is mounted and temporarily tightened to the coil pieces 146.

The second unit forming plate 390 includes plates 392 and 294, and is mounted to the first unit forming plate 380 with bolts 391a. The coil 140 (coil unit) and the first unit forming plate 380 are sandwiched by the plates 392 and 394 from both sides of the moving direction. The plates 392 and 394 have concave parts 392a and 394a, respectively, so as to conform to the shape of each of the coil pieces 146.

Initially, the second unit forming plate 390 is only temporarily tightened. In this initial state, a predetermined amount of current is given to the lead wire W of each of the coil pieces 146. When the temperature of the lead wire W reaches a plastic level, the first unit forming plate 380 and the second unit forming plate 390 are further tightened, so as to form the lead wire W in the plastic state into a predetermined shape. Finally, formers 400 are fitted to the coil unit from the above and below, and the coil unit is then compressed to a predetermined size by bolts 401. After cooling down, the formers 400 and the second unit forming plate 390 are removed, and the linking conductive parts 146A are secured by an adhesive agent. In the last step of either of the methods, only the coil pieces 146 are fitted into a resin mold, and are then solidified in the predetermined shape.

Figure 16:
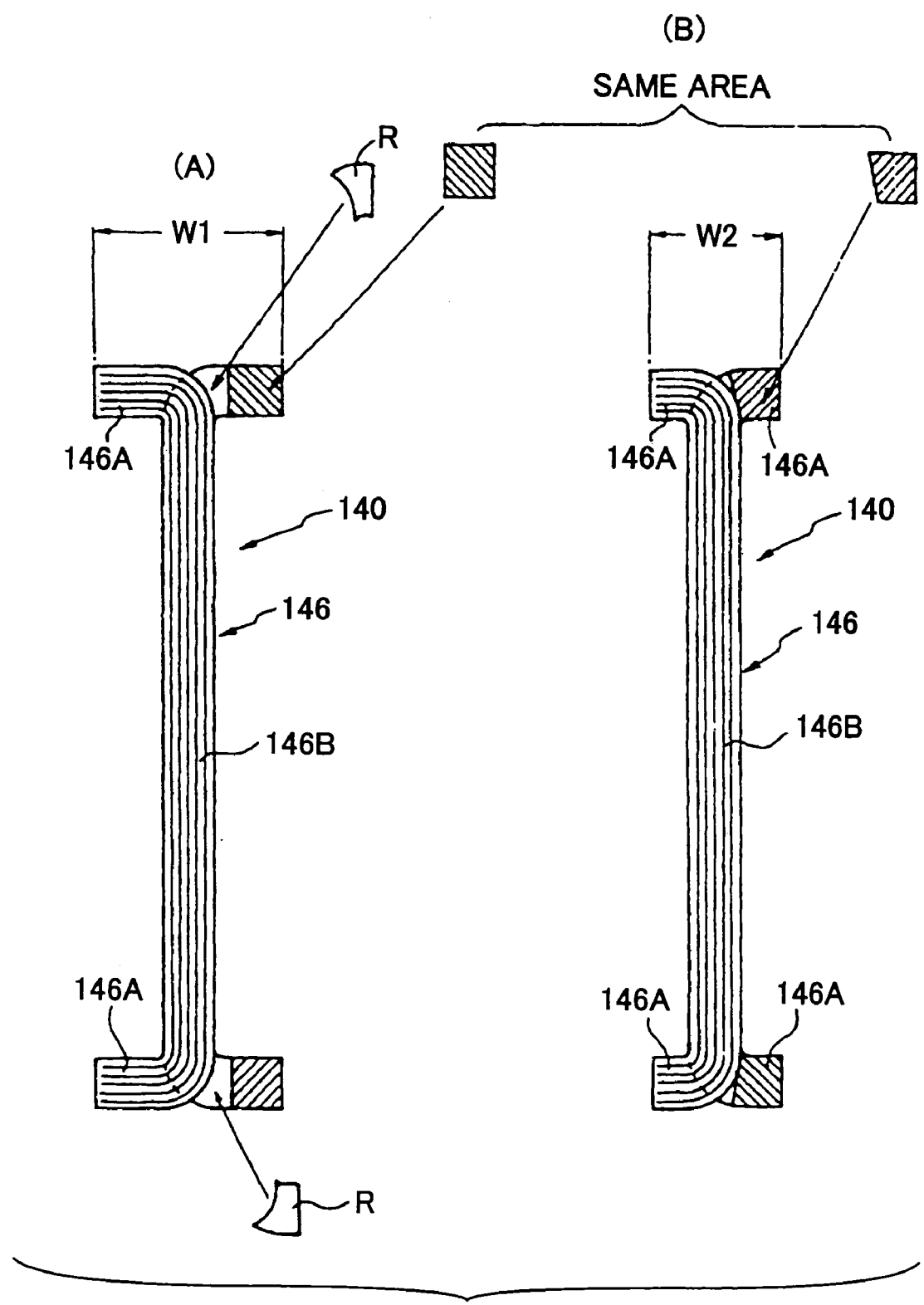
FIG. 16-(A) is a sectional view of a coil having a greater width W1, and FIG. 16-(B) is a sectional view of a coil having a smaller width W2.
Figure 17:
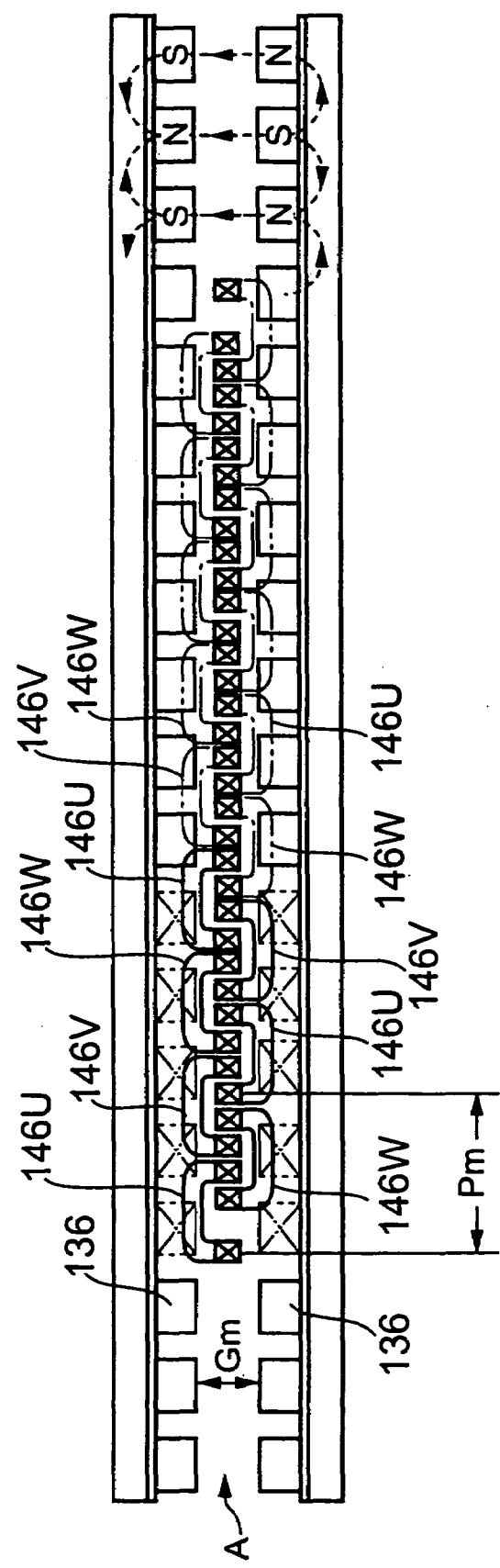
FIG. 17 is a plan view of the arrangement of coils and magnets in the linear motor.

Referring now to FIGS. 16 and 17, a structure employing the above coil 140 for the linear motor 30 will be described.

The plurality of coil pieces 146 include coil pieces 146U, 146V, and 146W for forming a U-V-W phase. The assembling of the 3-phase coil pieces 146 is carried out in the following manner. First, two rows of unit coils are arranged, so that the outer surfaces of the effective conductive parts 146B are in contact with one another, and that the linking conductive parts 146A are bent in the opposite direction to the moving direction A. In FIG. 17, this arrangement is shown as the upper row of unit coils each placed in an upside-down U-shape and the lower row of unit coils each placed in a U-shape.

Two of the effective conductive parts 146B of one group are fitted between the effective conductive parts 146B of each coil piece 146 of the other group. As a result, the coil pieces 146 face the coil pieces 146 of each other group in such a manner that the effective conductive parts 146B are arranged at uniform pitch.

As shown in FIG. 17, the coil pieces 146 of one unit coil group are arranged in the order of U, V, W, U, V, W, . . . , so are the coil pieces 146 of the other unit coil group. The phases of the coil pieces 146 of both unit coil groups are adjusted so that the ends of the effective conductive parts 146B of each V-phase coil piece and each W-phase coil piece of one unit coil group are fitted between the effective conductive parts 146B of each U-phase coil piece 146 of the other unit coil group.

In this structure, the sections of the effective conductive parts 146B of the U-V-W phases are arranged in a row in the moving direction. This is achieved by employing coil pieces 146 having the linking conductive parts 146A situated at approximately 90 degrees with respect to the effective conductive parts 146B. On a section that is perpendicular to the moving direction, only 2-phase coils can be seen, as shown in FIGS. 16A and 16B. This is a very advantageous arrangement, because only one type of coil piece 146 is required.

In this embodiment, the first winding parts 342a of the first piece 342 of the winding die 340 are sloped in such a manner as to have a greater distance from the second piece 344 at each end of the first winding parts 342a. Without this sloping, it is necessary for the linking conductive parts 146A to maintain a wide horizontal width W1 in relation to the moving direction, as shown in FIG. 16A, so as to prevent interference with neighboring coil pieces 146.

However, with this sloping, the unnecessary area R is eliminated, and the entire size can be reduced, as shown in FIG. 16B. As a result, the width W1 can be reduced to a smaller width W2. This reduction contributes to the reduction of the horizontal width of the linear motor 30 in relation to the moving direction. If the same width can be maintained, a thicker casing can be employed, thereby achieving more stable movement. It can also be designed so as to generate a greater thrust force.

Referring back to FIG. 17, a magnetic flux having a sinusoidal wave shape is distributed by the magnets 136 along the centerline of the magnet row on the stator side of the linear motor 30. With the coordinate along the centerline of the magnet row being represented by z, the magnetic flux density B (z) of each coordinate can be expressed by the following equation:

$$B(z) = B_0 \sin(\pi z / Pm) \square. \quad (1)$$

In the above equation, Pm represents the polar pitch. When the current intensity of each phase of the coil pieces 146U, 146V, and 146W is changed so as to conform to the phase of the magnetic flux density of the center point of each phase, a uniform thrust force is constantly generated in the coil 140, regardless of the relative locations of the coil pieces 146 and the magnet rows.

For instance, with the current intensity of the center point of the U-V-W phases being a function of z, the current intensity is controlled to be $I_0 \square \sin(z/Pm)\pi$, $I_0 \square \sin(z/Pm+ \frac{2}{3})\pi$, and $I_0 \square \sin(z/Pm+\frac{4}{3})\pi$, respectively. With the length of the effective conductive parts 146B of the coil pieces 146 being L1, the thrust force F(z) per one coil pole is expressed as $F(z) = 1.5 B_0 I_0 L_0$. This equation does not contain a factor that is related to the coordinate z. Therefore, a constant thrust force can be obtained, regardless of the coordinate z.

In a case where the parameters such as the inter-magnet distance Gm are unchanged and only the magnetic polar pitch Pm, the ratio of the magnetic polar pitch Pm to the inter-magnet distance Gm needs to be in the range of 4 to 5, so as to maximize the effective magnetic flux density. If the ratio is set at 4.1, the density of the effective magnetic flux crossing the coil piece 146 becomes approximately 1.5 times greater. If the effective conductive parts 146B are fitted without gaps between the magnetic poles here, the number of winding circles of the coil piece 146 also becomes 1.5 times larger.

However, the resistance of the coil also becomes 1.5 times greater. If the driver power voltage is constant, the current that can be given becomes 1/1.5 times greater, and the value of $I_0 L1$ cannot be changed. Although the thrust force becomes 1.5 times greater at last, the width W2 of the linking conductive parts 146A (see FIG. 16B) also becomes 1.5 times greater, resulting in greater difficulties in accommodation. However, if the linear moment is made the same by increasing the section area of the winding circles, the $I_0$ can be made 1.5 times greater, without changing L1. In this case, the thrust force becomes 2.25 times greater, which is the square of 1.5.

By the method in accordance with the present invention, it is very easy to change the section area of the lead wire W and the number of winding circles. Also, by combining the above forming techniques, the coil pieces 146 can be more tightly fitted to each other, and the width W2 of the linking conductive parts 146A can be minimized. Further, a round wire having a circular section, which has a higher market availability, can be used as the lead wire W. The lead wire W formed by such a round wire can reduce the production costs.

Referring back to FIGS. 5 and 6, the coil cooling jacket 144 is a component for accommodating the coil 140, and includes the coil holder 148, a cylindrical shell unit 151 that has a stainless plate 150 linked to the coil holder 148, and a lid unit 157 that is placed on the shell unit 151. The plate 150 is bent along the I-shape of the section of the coil 140, and accommodates the coil 140 therein, with the predetermined gap 142 being formed between the plate 150 and the linking conductive parts 146A of the coil 140.

Referring now to FIGS. 5, 6, 18, 19, and 20, the cooling function for the coil 140 in the coil unit 132 will be described below.

A longitudinal-direction main passage 152 is formed in the vicinity of a width-direction end 140A of the coil 140. This main passage 152 extends in the longitudinal direction X (equivalent to the moving direction) inside the coil cooling jacket 144 (more specifically, inside the coil holder 148). A refrigerant supplied from a liquid supply port 155 that is open through the external face of the coil cooling jacket 144 can be introduced and stored in the main passage 152.

This main passage 152 is provided with branch passages 154 that can discharge the introduced refrigerant to the outside in the width direction Y. The branch passages 154 are arranged in the longitudinal direction X at uniform intervals. The refrigerant discharged from the main passage 152 via the branch passages 154 flows through the gap 142 between the coil cooling jacket 144 and the coil 140 in the width direction Y, so that the coil 140 is cooled in the width direction Y.

In the vicinity of the other end 140B of the coil 140 in the width direction Y, a second main passage 156 is formed in the longitudinal direction X. This second main passage 156 receives the refrigerant that has flowed on the surface of the coil 140 (i.e., through the gap 142) in the width direction Y.

As shown in FIG. 5, a sub passage 158 is formed at the downstream ends 154A of the branch passages 154. The sub passage 158 extends in the longitudinal direction X, and can temporarily store the refrigerant discharged via the branch passages 154. The sub passage 158 also connects the downstream ends 154A of the branch passages 154. The sub passage 158 temporarily stores the refrigerant discharged via the branch passages 154, and then discharges the refrigerant to the gap 142.

As shown in FIG. 5, an attachment surface 160 that connects the coil unit 132 to a mating component is formed on the outer periphery of the coil cooling jacket 144 (or the coil holder 148) on the opposite side from the coil 140 (or the ends 140A), with the main passage 152 being interposed. In this structure, the main passage 152 interposed between the attachment surface 160 and the coil 140 restrains the heat transfer from the coil 140 to the attachment surface 160.

Figure 18:
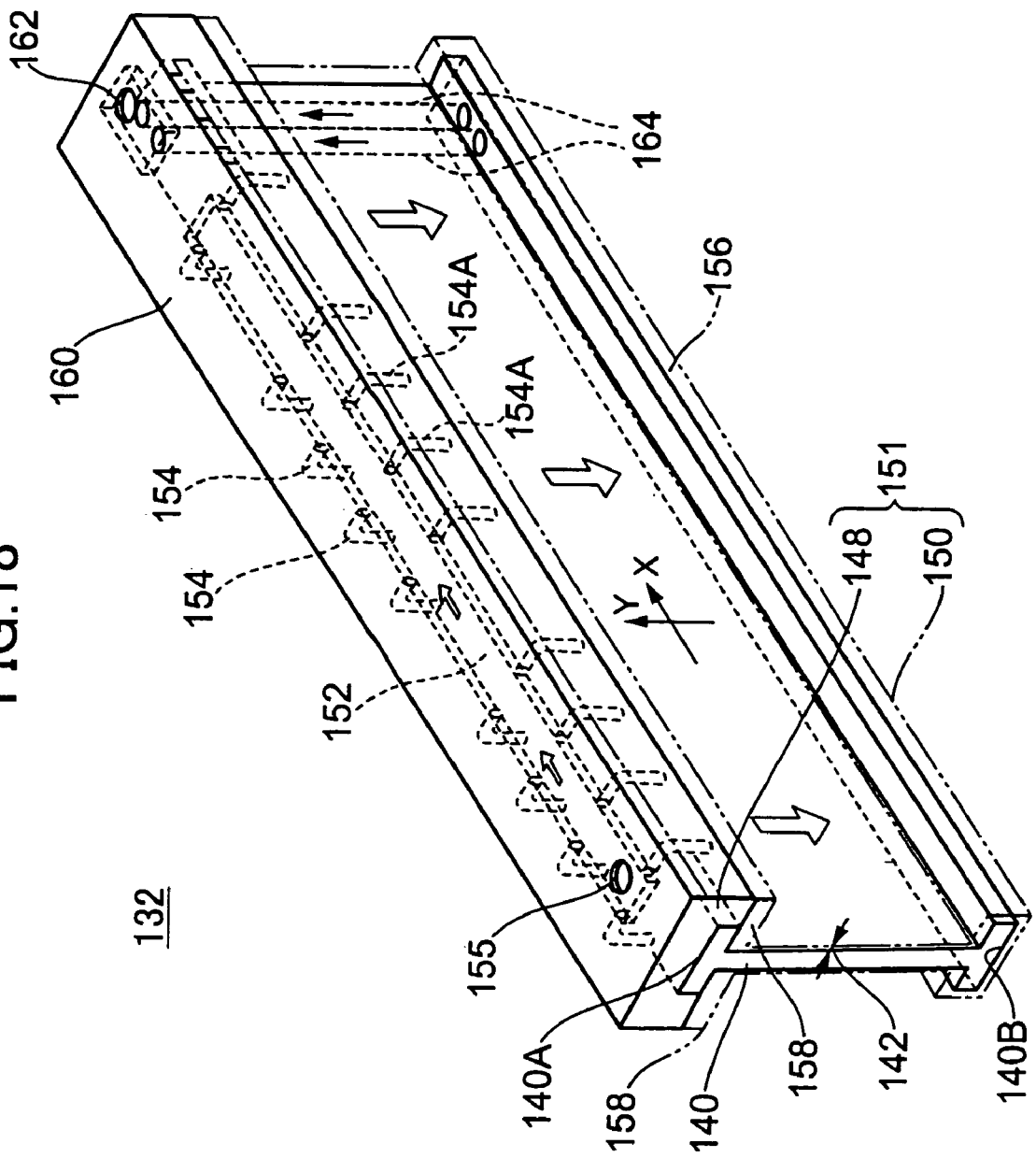
FIG. 18 is a perspective view of a coil cooling structure inside a coil cooling jacket.

As shown in FIG. 18, the liquid supply port 155 is formed at one end of the attachment surface 160 in the longitudinal direction X, while a liquid discharge port 162 is formed at the other end of the attachment surface 160 in the longitudinal direction X. The liquid supply port 155 and the liquid discharge port 162 are connected to an introduction pipe (not shown) and a discharge pipe (not shown), are formed in the collective cable 29 shown in FIG. 2.

Two discharge tubes 153 extending in the width direction Y are provided inside the coil cooling jacket 144 in the vicinity of the discharge port 162. One end of each of the discharge tubes 164 is open to the attachment surface 160 via the liquid discharge port 162, while the other end of each of the discharge tubes 164 communicates with the second main passage 156 in the coil cooling jacket 144. As a result, the refrigerant guided into the second main passage 156 is discharged from the liquid discharge port 162 via the discharge tubes 164.

Since the discharge tubes 164 are located inside the coil cooling jacket 144, the refrigerant, which has been guided through the main passage 152, the branch passages 154, and the sub passage 158, flows on the outer peripheral surfaces of the discharge tubes toward the second main passage 156, accordingly, the discharge tubes 164 are covered with the refrigerant, which is constantly flowing, and are cooled by the flow of the refrigerant. Thus, the heat generated around the discharge tubes 164 is restrained from transferring to the coil cooling jacket 144.

In the above cooling structure, after being introduced in the longitudinal direction of the coil 140, the refrigerant is branched in the width direction Y. With this branching of the refrigerant, the coil 140 can be uniformly cooled both in the longitudinal direction X and the width direction Y. Thus, the one end in the direction indicated by the direction X arrow in FIG. 18 (i.e., the downstream side) can be prevented from locally having a high temperature.

Figure 19:
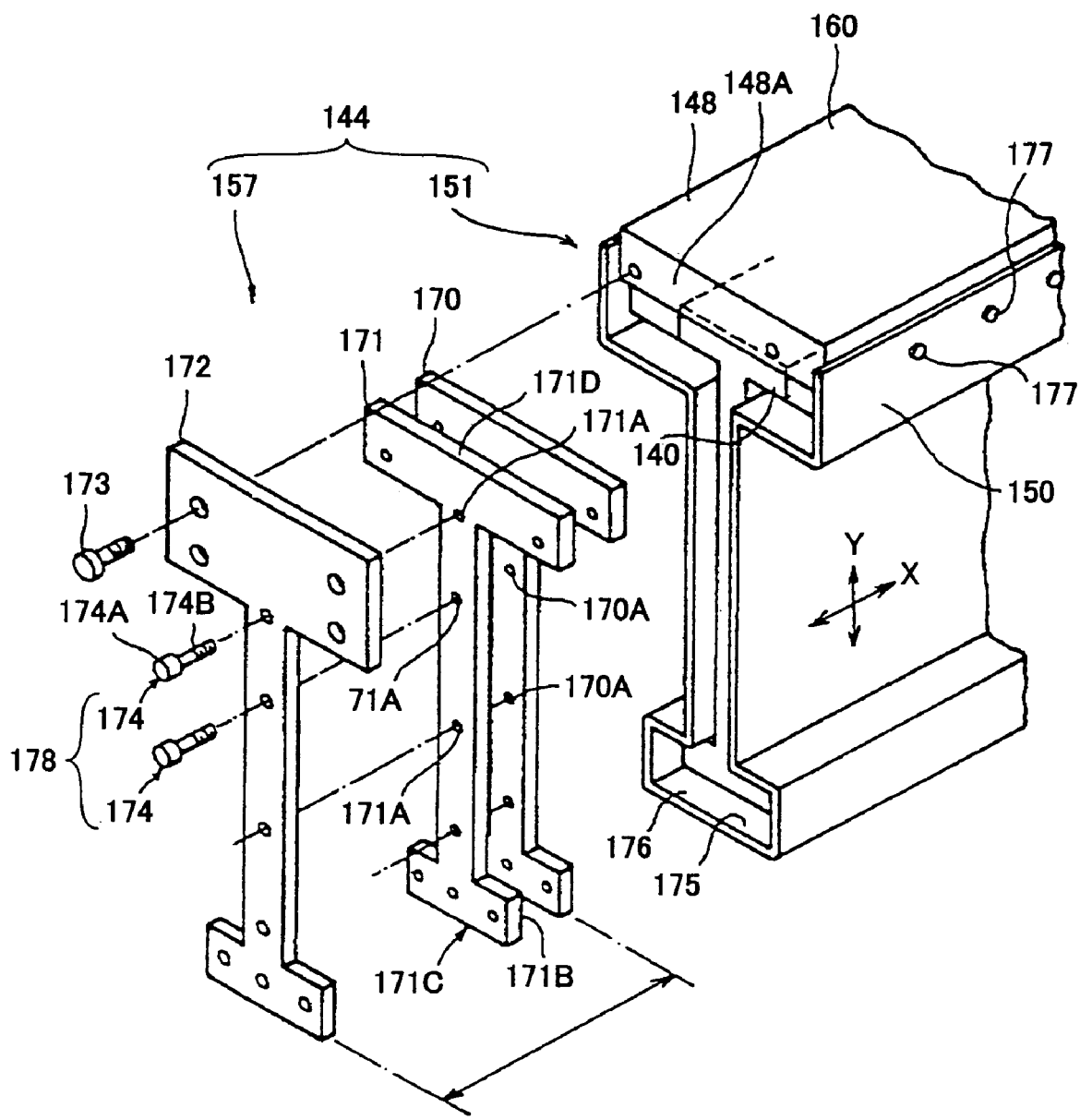
FIG. 19 is a perspective view of a sealing structure of the coil cooling jacket.
Figure 20:
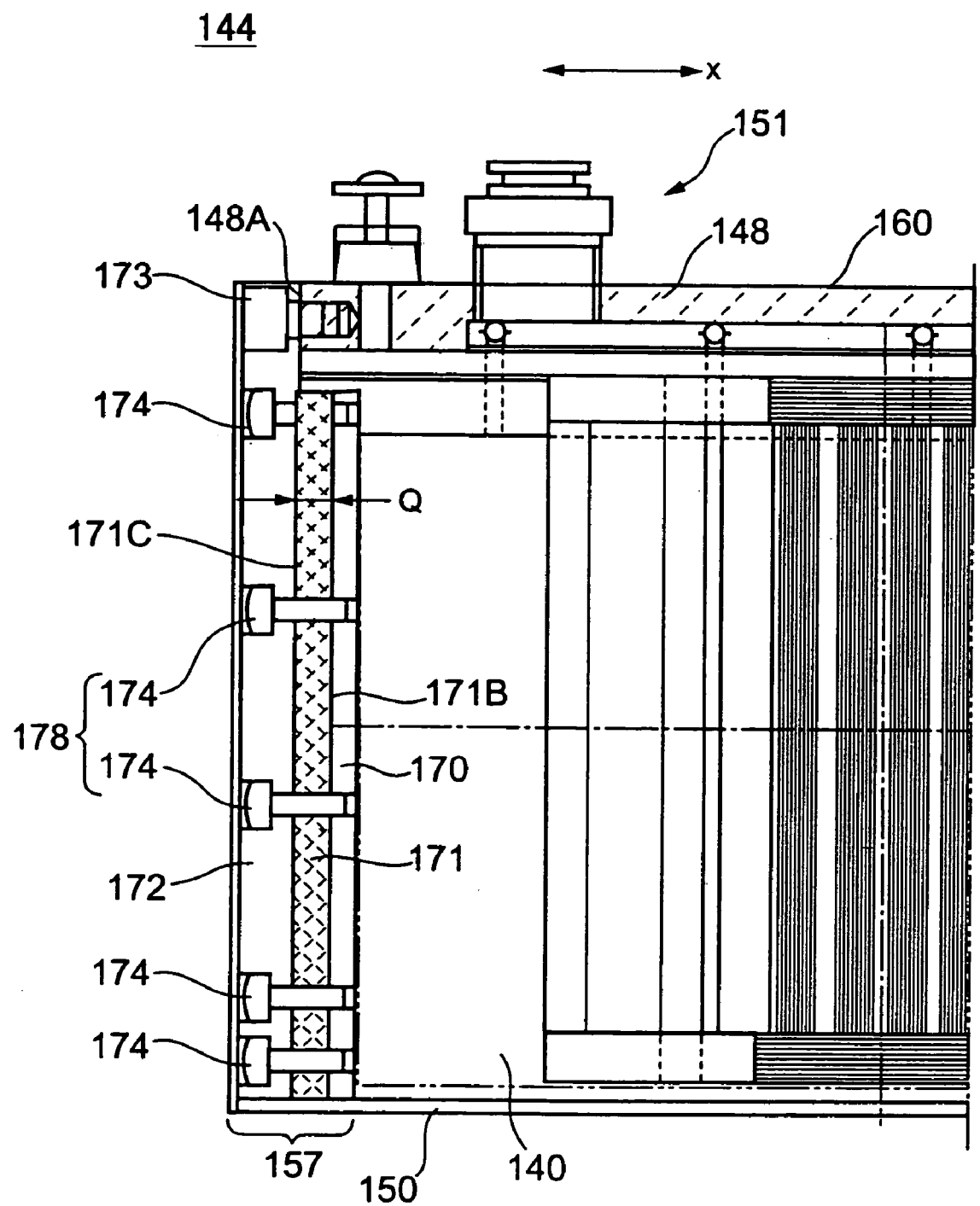
FIG. 20 is another perspective view of the sealing structure of the coil cooling jacket.

Next, the sealing function of the coil cooling jacket 144 will be described. As shown in FIGS. 19 and 20, the coil cooling jacket 144 includes the cylindrical shell unit 151 that extends in the longitudinal direction, and the lid unit 157 that is attached to the shell unit 151.

The cylindrical shell unit 151 includes the coil holder 148, and the plate 150 that is attached to the coil holder 148 with screws 177. With this structure, an I-shaped opening 175 is formed at the end in the longitudinal direction X. As shown in FIG. 5, a sealing member 178 is inserted between the plate 150 and the coil holder 148, so as to prevent the refrigerant from leaking through the gap.

The lid unit 157 includes: an elastic member 171 that is designed so as to conform to the shape of the inner periphery 176 of the opening 175; a first plate that is placed on the surface 171B of the elastic member 171 at the side of the shell unit 151; a second plate 172 that is placed on the outer surface 171C of the elastic member 171 at the opposite side from the shell unit 151, and an adjusting mechanism 178 that can adjust the interposing gap Q for interposing the elastic member 171 between the first plate 170 and the second plate 172.

The first plate 170 is accommodated in the shell unit 151 via the opening 175, and, therefore, is slightly smaller than the opening 175. The second plate 172 has substantially the same shape as the elastic member 171, but the part of the second plate 172 that is in contact with an end surface 148A of the coil holder 148 is extended and fixed to the end surface 148A with an attachment bolt 173. The elastic member 171 is made of rubber or elastic synthetic resin.

The adjusting mechanism 178 includes adjusting bolts 174, each of which is made up of a flange part 174A to be engaged with the second plate 172, and an inserting screw part 174B to be screwed into a receiving screw hole 170A formed through the first plate 170. Here, the inserting screw part 174B penetrates the second plate 172, and reaches the first plate 170. By tightening the adjusting bolts 174, the gap Q becomes narrower. On the other hand, the gap Q can be widened by loosening the adjusting bolts 174. The inserting screw part 174B of each of the adjusting bolts 174 penetrates a through hole 171A formed through the elastic member 171, and then is screwed into the corresponding receiving screw hole 170A.

The lid unit 157 is integrally fitted into the opening 175, with the elastic member 171 and the first plate 170 being attached to the second plate 172 with the adjusting bolts 174. At the time of the fitting, the adjusting bolts 174 are loosened so as to keep the gap W wide. After the lid unit 175 (or the second plate 172) is fitted into the opening 175 with the attachment bolts 173, the adjusting bolts 174 are tightened so as to narrow the gap Q.

With the above structure, the elastic member 171 is elastically deformed outward by the energizing force (the narrowing force) between the first plate 170 and the second plate 172. As a result, the outer periphery 171C of the elastic member 171 is tightly attached to the inner periphery 176 of the opening 175. The elastic member 171 may have a ring shape. Also, the second plate 172 may be directly welded to the opening 175 (by laser welding, for instance).

As described above, the linear motor 30 is used as the second driving mechanism 14A in this embodiment. With the linear motor 30, the second driving mechanism 14A can be fitted into the vacuum processing chamber 11. More specifically, the linear motor 30 has a low frictional resistance at the time of driving, and therefore has a small amount of heat generation. Also, the number of components is small, and therefore the device size can be easily reduced. For these reasons, the linear motor 30 can be fitted into the vacuum processing chamber 11, even if the volume of the vacuum processing chamber 11 is small.

The linear motor 30 of this embodiment accommodates the coil 140, and also includes a coil cooling jacket 144 that is designed for cooling the coil 140 by supplying a refrigerant flowing around the coil 140. Accordingly, while the linear motor 30 is being driven, the coil 140 can be cooled, so that outgas can be prevented from being generated from a covering material for insulating the wire rod of the coil 140 or an impregnated resin for solidifying the wire rod. Accordingly, though the linear motor 30 is fitted into the vacuum processing chamber 11, outgas is not generated, and the high degree of vacuum in the vacuum processing chamber 11 can be maintained.

In the linear motor 30 of this embodiment, each of the coil pieces 146 that constitute the coil 140 has a ring shape, including the effective conductive parts 146B and the linking conductive parts 146A. With this structure, the magnetic flux density generated from the coil 140 can be increased. With an increased magnetic flux density, the driving force of the linear motor 30 can also be increased. Accordingly, the moving speed of the coil unit 132 (or the wafer platen 12) can be increased, and the throughput of the processing for the wafer 20 can also be increased.

Figure 21:
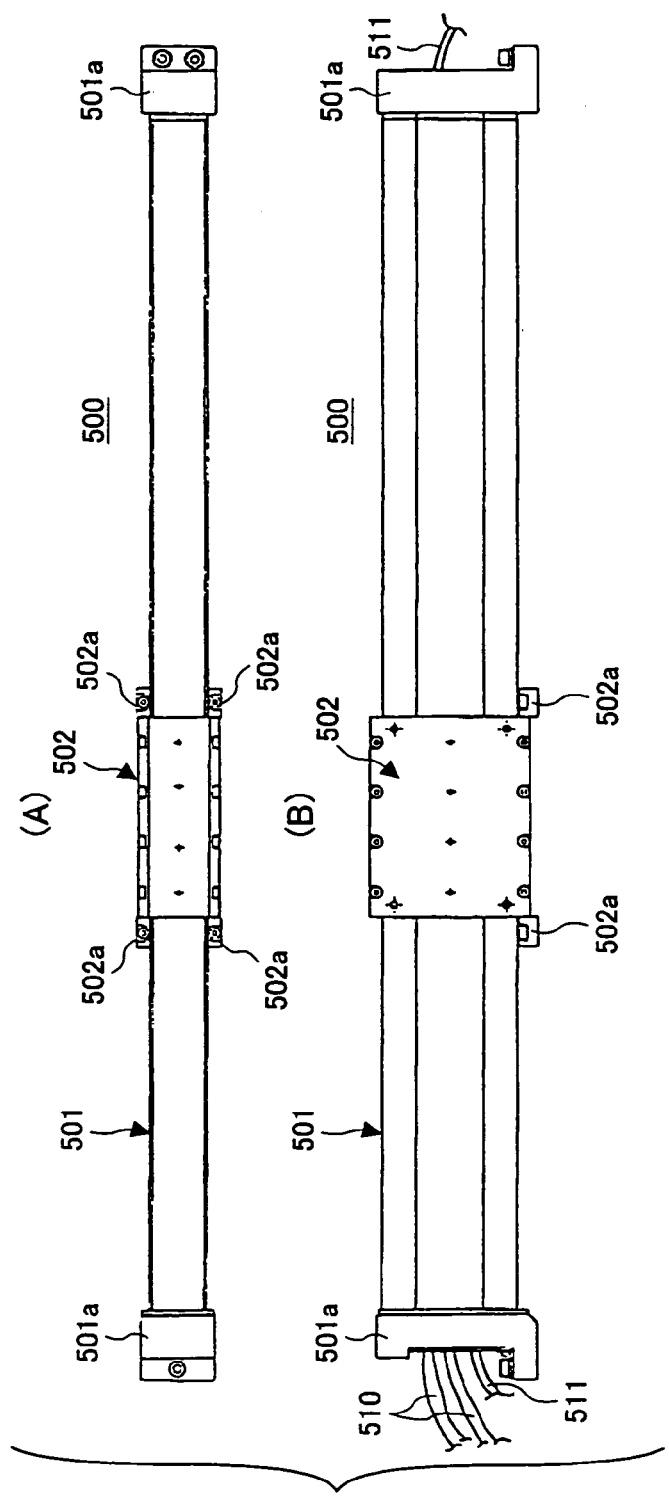
FIG. 21-(A) is a plan view of a linear motor that is a modification of the linear motor shown in FIG. 5, and FIG. 21-(B) is a side view of the linear motor that is a modification of the linear motor shown in FIG. 5.

Referring now to FIGS. 21-(A), 21-(B), and 22, a modification of the linear motor 30 will be described. In the linear motor 30 described above, the magnets 136 serve as a stator, and the coil 140 serves as a needle. In other words, the magnet unit 134 is fixed, and the coil unit 132 is moved in relation to the fixed magnet unit 134.

Since the coil 140 serves as the needle that is a driver, the weight can be reduced. As a result, the wafer platen 12 (or the wafer 20) mounted onto the coil 140 can be easily moved and reciprocated at a high speed. Also, since the coil 140 is surrounded by the magnets 136, the amount of magnetic flux leak at the end of the driver is small. Accordingly, the adverse influence of the magnetic field on the wafer 20 and others placed on the driver can be minimized.

Figure 22:
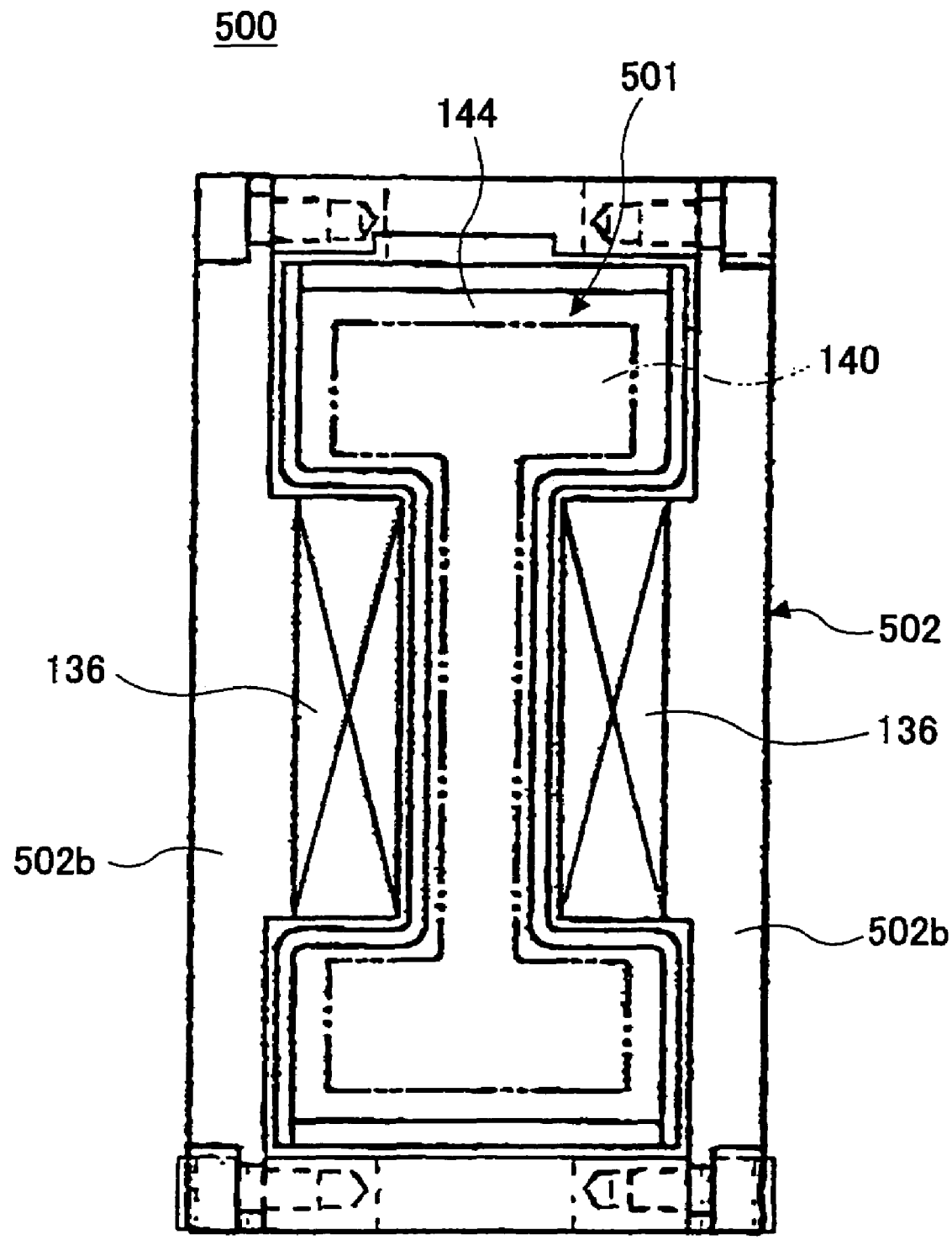
FIG. 22 is a section view of the linear motor shown in FIGS. 21-(A) and 21-(B)

In the linear motor 500 in accordance with this modification, on the other hand, the magnets 136 serve as a stator 501, and the coil 140 serves as the needle 502. FIG. 21-(A) is a plan view of the linear motor 500, and FIG. 21-(B) is a side view of the linear motor 500. FIG. 22 is a section view of the linear motor 500.

The stator 501 has an I-shaped section, and the needle 502 is arranged so as to surround the stator 501. Wires 510 are connected to one end of the stator 501, and current is supplied through the wires 510 to the coil 140 contained in the stator 501 (see FIG. 22). Pipes 511 are connected to both ends of the stator 501, and a cooling liquid is supplied into and discharged from the stator 501 through the pipes 511.

The stator 501 is fixed to the table 24 with fixing parts 501*a* that are provided at both ends of the stator 501. The needle 502 is fixed to a linear guide with fixing parts 502*a*, so that the stator 501 and the needle 502 are not in contact with each other. The wafer platen 12, to which a process substrate such as the wafer 20 is chucked, is mounted on the needle 502.

As shown in FIG. 22, needle side plates 502*b* are arranged so as to face the magnets 136 in between, and are formed into a shape that conforms to the shape of the stator 501. Meanwhile, the outer shell of the stator 501 is the coil cooling jacket 144, containing the I-shaped coil 140 therein. A cooling liquid is supplied through the above described pipes 511, and circulates through the gap in the coil cooling jacket 144, thereby preventing the heat generation of the coil 140.

In the linear motor 500 in accordance with this modification, the coil 140 serves as the stator 501, and the magnets 136 serve as the needle 502. Since the magnets 136 are contained in the needle 502, it is unnecessary to arrange wires. Accordingly, the load on the driver that would be caused by wires can be eliminated. Also, there are no problems that would otherwise be caused by wear of the wires or damage of the wires. Accordingly, the needle 502 (or the wafer platen 12) can be easily moved and reciprocated at a high speed.

Referring back to FIGS. 1 through 3, the third driving mechanism 15A will be described.

The third driving mechanism 15A performs a "tilting operation" for the wafer platen 12 (or the wafer 20). Here, a "tilting operation" refers to an operation that moves (or rotates) the wafer 20 (or the wafer platen 12) around a tilt axis.

The third driving mechanism 15A includes a tilting motor 32A and a belt 34. The tilting motor 32A is connected to the controller 40, which controls the driving operation of the tilting motor 32A. The output axis of the tilting motor 32A is connected to the support pillar 25 via the belt 34. As the tilting motor 32A is driven, the support pillar 25 is selectively rotated in the directions indicated by the arrows A1 and A2 in FIG. 2, depending on the rotational driving direction of the tilting motor 32A.

As described earlier, the table 24 is provided above the support pillar 25. The wafer platen 12 is placed above the table 24, with the linear motor 30 (or the second driving mechanism 14A) being interposed in between. Accordingly, as the support pillar 25 is rotated in the directions indicated by the arrows A1 and A2, the wafer 20 mounted onto the wafer platen 12 is also rotated. Hereinafter, the rotation axis of the wafer 20 will be referred to as a "rotational center tilt axis 37A".

In this embodiment, the tilt axis 37A (indicated by a dot-and-dash line in the drawings) is parallel to the vertical direction indicated by the Y1 and Y2 in the drawings. The tilt axis 37A also passes through the center point (indicated by an arrow S in the drawings) of the wafer 20 mounted onto the wafer platen 12.

In FIG. 1, the dot-and-dash line indicates a case where the wafer platen 12 (or the wafer 20) is tilted by 60 degrees by the third driving mechanism 15A. By tilting the wafer platen 12 in this manner, the irradiation angle of the IB impinging upon the wafer 20 can be changed. Further, being controlled by the controller 40, the third driving mechanism 15A can stabilize the wafer platen 12 at a desired angle.

With the third driving mechanism 15A, the orientation of the wafer 20 being processed can be set at will. The process of the IB for the wafer 20 varies depending on the irradiation angle of the IB. Accordingly, with the third driving mechanism 15A, the irradiation of the IB can be carried out at the optimum angle for the wafer 20.

Since the fourth driving mechanism 16 has already been described in conjunction with the explanation of the wafer platen 12, explanation of the fourth driving mechanism 16 is omitted here. Although the wafer platen 12 is moved in the directions of the arrows X1 and X2 by the linear motor 30 in the above structure, it is possible to employ a structure in which the table 24 has a linear guide that guides and moves the wafer platen 12. With such a structure, the movement of the wafer platen 12 can be made more stable and smooth. Since the linear guide is also located inside the vacuum processing chamber 11, it is desirable to employ a linear guide using an air bearing or a magnetic bearing.

In the following, control operations performed by the controller 40 will be described. As described earlier, the controller 40 performs driving control operations for components including the first driving mechanism 13A, the second driving mechanism 14A, the third driving mechanism 15A, and the fourth driving mechanism 16. Among these operations, the driving control operations for the first driving mechanism 13A and the second driving mechanism 14A, which play important roles in the IB irradiation process for the wafer 20, will be described in the following description.

FIGS. 23-(A) through 23-(C) illustrates a first example of control operations carried out by the controller 40 for the first driving mechanism 13A and the second driving mechanism 14A. FIG. 23-(A) shows a driving control operation performed by the controller 40 for the second driving mechanism 14A. In FIG. 23-(A), the axis of ordinate indicates the speed, and the axis of abscissa indicates the time. FIG. 23-(B) shows a driving control operation performed by the controller 40 for the first driving mechanism 13A. In FIG. 23-(B), the axis of ordinate indicates the speed, and the axis of abscissa indicates the time. FIG. 23-(C) shows the relative movement trail of the IB in relation to the wafer 20, when the driving control operations shown in FIGS. 23-(A) and 23-(B) are carried out.

As described earlier, the second driving mechanism 14A reciprocates the wafer platen 12 (or the wafer 20) in the directions of the arrows X1 and X2. On the other hand, the first driving mechanism 13A moves the wafer platen 12 (or the wafer 20) in the single direction of the arrow Y1 or the arrow Y2.

First, the driving control operation for the second driving mechanism 14A shown in FIG. 23-(A) will be described in detail. In the driving control operation for the second driving mechanism 14A, there are two operation modes consisting of a mode for moving the wafer platen 12 at considerably varying speeds as indicated by the time T1 in the drawing (hereinafter referred to as "varied speed mode"), and a mode for moving the wafer platen 12 at a constant speed as indicated by the time T2 in the drawing (hereinafter referred to as "constant speed mode"). This driving control operation is performed by alternately carrying out the two modes. The moving direction in the constant speed mode is alternately changed.

On the other hand, the driving control operation for the first driving mechanism 13A is performed only when the second driving mechanism 14A is in the varied speed mode at the time T1. The driving control operation for the first driving mechanism 13A is not performed when the second driving mechanism 14A is in the constant speed mode at the time T2. Accordingly, the driving of the wafer platen 12 by the first driving mechanism 13A is carried out stepwise. Here, the intermittent driving of the wafer platen 12 by the first driving mechanism 13A is a varied driving operation.

When the first driving mechanism 13A and the second driving mechanism 14A are controlled in the above manner, the moving direction of the wafer platen 12 is changed in the varied speed mode at the time T1. Here, the wafer platen 12 first considerably diminishes the speed, and then stops the movement. After that, the wafer platen 12 regains the speed in the opposite direction. When the speed is increased to a predetermined speed of $+V_{X1}$ or $-V_{X1}$, the controller 40 controls the second driving mechanism 14A so as to switch to the constant speed mode for moving the wafer platen 12 at a constant speed. In this embodiment, movements in the directions of the arrows X1 and Y1 shown in the drawings are positive (+), while movements in the directions indicated by the arrows X2 and Y2 in the drawings are negative (−).

The controller 40 alternately carries out the above described varied speed mode and the constant speed mode, so that the wafer platen 12 is reciprocated within the vacuum processing chamber 11. As the wafer platen 12 is moved, the IB irradiation point on the wafer platen (or the wafer 20) is relatively moved (though the IB is not actually moved). In this embodiment, the relative movement trail of the IB becomes as shown in FIG. 23-(C).

Here, the moving speed $V_{Y1}$ of the wafer platen 12 driven by the first driving mechanism 13A and the linear constant moving speed $V_{X1}$ (i.e., the speed in the constant speed mode) of the wafer platen 12 driven by the second driving mechanism 14A are compared. In this embodiment, the reciprocating linear moving speed $V_{X1}$ of the wafer platen 12 driven by the second driving mechanism 14A is higher than the moving speed $V_{Y1}$ of the wafer platen 12 driven by the first driving mechanism 13A.

More specifically, the absolute value $|V_{X1}|$ of the reciprocating linear moving speed $V_{X1}$ of the wafer platen 12 driven by the second driving mechanism 14A is set in the range of 1 m/S to 50 m/S. Further, the accuracy of the speed is set in the range of 0.01% to 1%. If converted into the frequency of the linear reciprocating movement of the wafer platen, the moving speed of the wafer platen 12 has a frequency value in the range of 1 Hz to 20 Hz.

As the wafer platen 12 can be moved in the vacuum processing chamber 11 by the second driving mechanism 14A, the IB process for the wafer 20 can be carried out with a high throughput.

If the absolute value $|V_{X1}|$ of the reciprocating linear moving speed $V_{X1}$ of the wafer platen 12 becomes smaller than 1 m/S or the frequency of the reciprocating linear movement of the wafer platen 12 becomes lower than 1 Hz, the process efficiency of the IB for the wafer 20 drops, resulting in the possibility of a temperature rise.

If the absolute value $|V_{X1}|$ of the reciprocating linear moving speed $V_{X1}$ of the wafer platen 12 exceeds 50 m/S or the frequency of the reciprocating linear movement of the wafer platen 12 exceeds 20 Hz, the IB process is carried out with a precision determined by the occurrence frequency of process beam instabilities (such as beam skipping). For this reason, a movement at a speed exceeding 50 m/S is substantially meaningless. Furthermore, an exceedingly high speed movement might reduce the process precision due to mechanical vibration.

Next, the IB movement trail strokes by the second driving mechanism 14A will be described. Each one stroke of the IB movement trail by the second driving mechanism 14A has a length made up of a length necessary for a process and a width necessary for changing the moving direction of the wafer platen 12 (hereinafter referred to as "return area width"). The return area width is equivalent to the moving distance (L2) of the IB in the directions of the arrows X1 and X2 at the varied moving speed mode time T1.

Since the IB impinges upon the entire wafer 20, the "length necessary for a process" should be the length of the wafer 20 in the directions of the arrows X1 and X2. In this embodiment, the "length necessary for a process (L1)" is longer than the length of the wafer 20 in the directions of the arrows X1 and X2, so as to secure the IB irradiation.

If the IB irradiation is carried out partially on the wafer 20, the "length necessary for a process" is equal to the length of the partial area, upon which the IB impinges, in the directions of the arrows X1 and X2.

At the varied moving speed mode time T2, the second driving mechanism 14A carries out the varied moving speed process so as to shorten the processing time. By doing so, the return area width L2 is shortened, and each stroke by the second driving mechanism 14A becomes shorter. Also, the reciprocating movement time of the wafer platen 12 by the second driving mechanism 14A can be shortened, so as to shorten the IB irradiation processing time.

At the switch points (indicated by the arrows A in FIG. 23-(A)) between the varied moving speed mode and the constant moving speed mode, a control operation for smoothing out the moving speed variations of the wafer platen 12 is carried out. By doing so, the speed variations at the switch points A are smoothed out. As the moving speed variations of the wafer platen 12 at the switch points A are smoothed out, the wafer platen 12 can be protected from excessive vibration or moment. Thus, the linear motor 30, the wafer platen 12, and the fourth driving mechanism 16 can be prevented from being damaged.

The controller 40 further controls the first driving mechanism 13A to intermittently move the wafer platen 12 while the second driving mechanism 14A is moving the wafer platen 12 at varied moving speed (in the varied moving speed mode). In other words, while the second driving mechanism 14A is in the constant moving speed mode, the first driving mechanism 13A is stopped.

With this structure, while linearly moving on the wafer 20, the IB is prevented from being drastically shifted by the first driving mechanism 13A in the direction of the arrow Y1. Thus, a stable process can be carried out for the wafer 20. In this embodiment, the area onto which the second driving mechanism 14A carries out the varied moving speed mode is an area outside the wafer 20 (as shown in FIG. 23-(c)). Therefore, even if the first driving mechanism 13A moves the wafer platen 12 in the direction of the arrow Y1 within this area, there will be no adverse influence on the wafer 20.

As the controller 40 controls both the first driving mechanism 13A and the second driving mechanism 14A in this embodiment as described above, the movement of the wafer platen 12 moved by the second driving mechanism 14A can be synchronized with the movement of the wafer platen 12 moved by the first driving mechanism 13A. Accordingly, a time lag caused by switching between the varied moving speed mode and the constant moving speed mode can be restrained, and efficient movement of the wafer platen 12 can be attained.

The width of the constant speed zone of the constant speed movement by the second driving mechanism 14A is set in conformity with the minimum stroke for a process depending on the outer shape of the wafer 20. However, it is also possible to vary the width of the constant speed zone (L1) during a process for the wafer 20. In such a structure, the width of the necessary constant speed zone (L1) can be adjusted depending on the outer shape of the wafer 20 or the processing area, even after a process for the wafer 20 is started. Accordingly, the processing time can be shortened.

Figure 24:
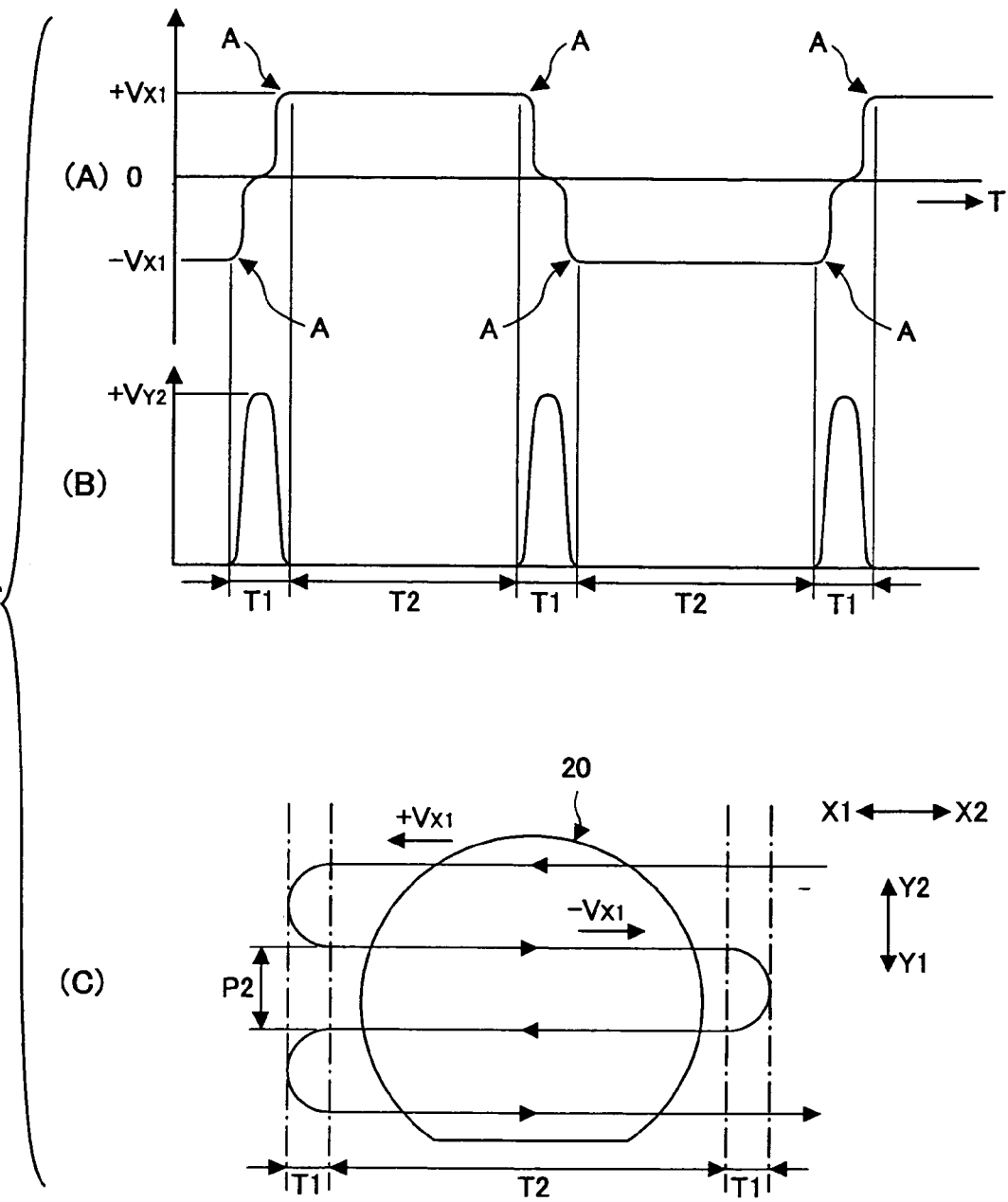
FIG. 24-(A) is a timing chart of a second control operation example of the first and second driving mechanisms carried out by the controller, FIG. 24-(B) is a timing chart of the second control operation example of the first and second driving mechanisms carried out by the controller, and FIG. 24-(C) shows a relative movement trail of a wafer in the second control operation example.

FIGS. 24-(A) through 24-(C) illustrate a second example of the control operations performed by the controller 40 for the first driving mechanism 13A and the second driving mechanism 14A. In this embodiment, the moving speed $V_{Y2}$ of the wafer platen 12 moved by the first driving mechanism 13A is higher than the moving speed $V_{Y1}$ in the first control operation example shown in FIG. 23-(A) through 23-(C) ($V_{Y2} > V_{Y1}$).

In the above manner, the moving speed $V_Y$ in the direction indicated by the arrow Y1 in the drawings can be changed by the controller 40 performing a driving control operation for the first driving mechanism 13A. Accordingly, the pitch P2 between each neighboring trail strokes in the second control operation example shown in FIG. 24C is wider than the pitch P1 in the first control operation example shown in FIG. 23-(c) (P2>P1).

In this manner, the pitch between each neighboring trail strokes in the constant speed mode can be changed by varying the moving speed $V_Y$ of the wafer platen 12 moved by the first driving mechanism 13A in the direction of the arrow Y1. Accordingly, the overlap ΔW of the IB can be adjusted as shown in FIG. 23C. The maximum value of the overlap ΔW of the IB is substantially equivalent to the beam width, and the minimum value is the smallest overlap between IBs. The greater the overlap ΔW, the higher the precision of the processing (repeated processing or implanting processing).

Figure 25:
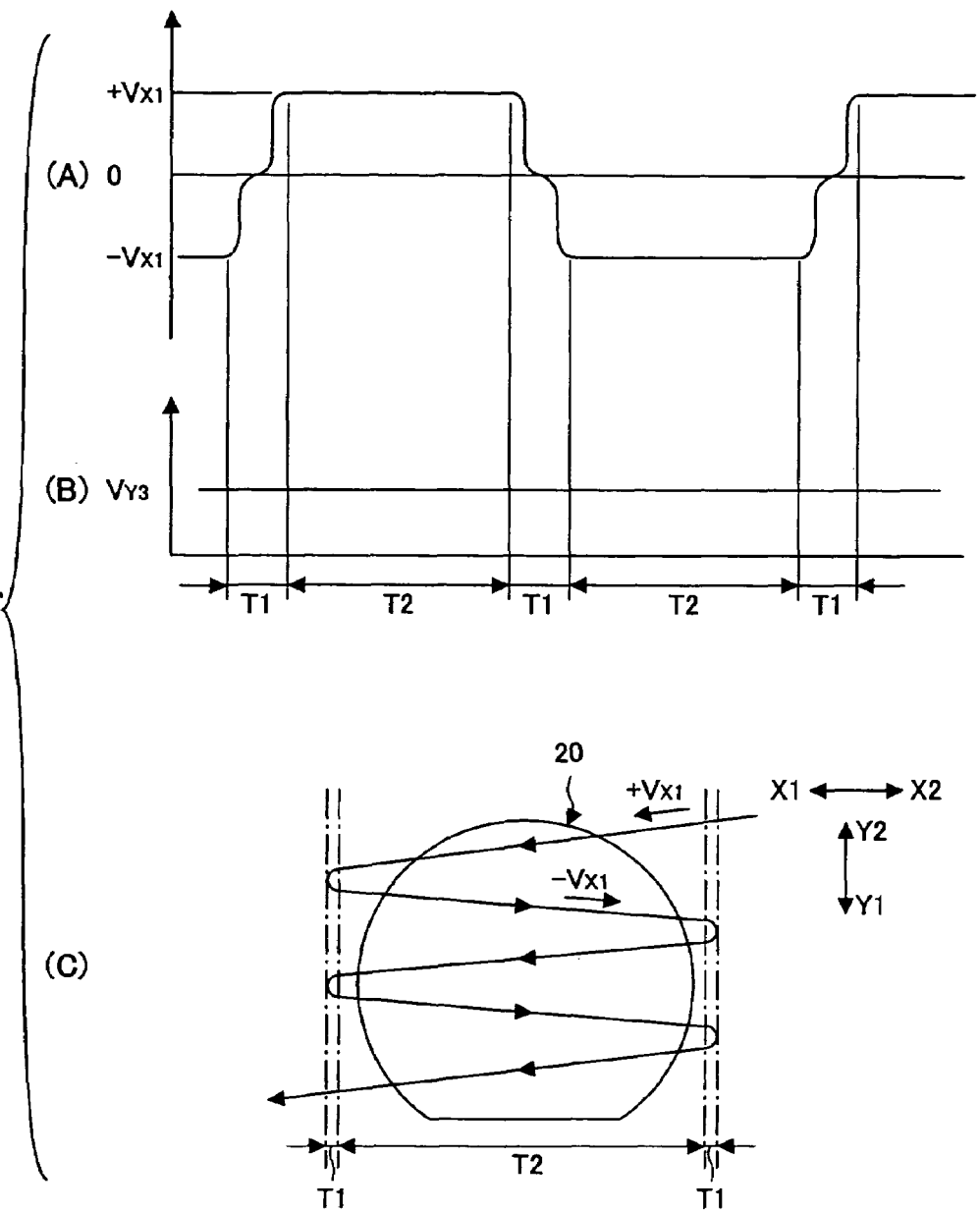
FIG. 25-(A) is a timing chart of a third control operation example of the first and second driving mechanisms carried out by the controller, FIG. 25-(B) is a timing chart of the third control operation example of the first and second driving mechanisms carried out by the controller, and FIG. 25-(C) shows a relative movement trail of a wafer in the third control operation example.

FIGS. 25-(A) through 25-(C) illustrate a third example of control operations performed by the controller 40 for the first driving mechanism 13A and the second driving mechanism 14A. In this embodiment, the moving speed $V_{Y3}$ of the wafer platen 12 moved by the first driving mechanism 13A is set at a constant speed both in the varied moving speed mode and the constant speed mode.

In this structure, the relative movement trail of the IB has a saw-toothed shape, as shown in FIG. 25-(C). To change the moving speed $V_{Y3}$ of the wafer platen 12 moved by the first driving mechanism 13A, the height of the teeth of the saw-toothed movement trail (the pitch of the adjacent movement trail) is changed, thereby increasing the degree of freedom in setting the movement trail in the IB.

Figure 26:
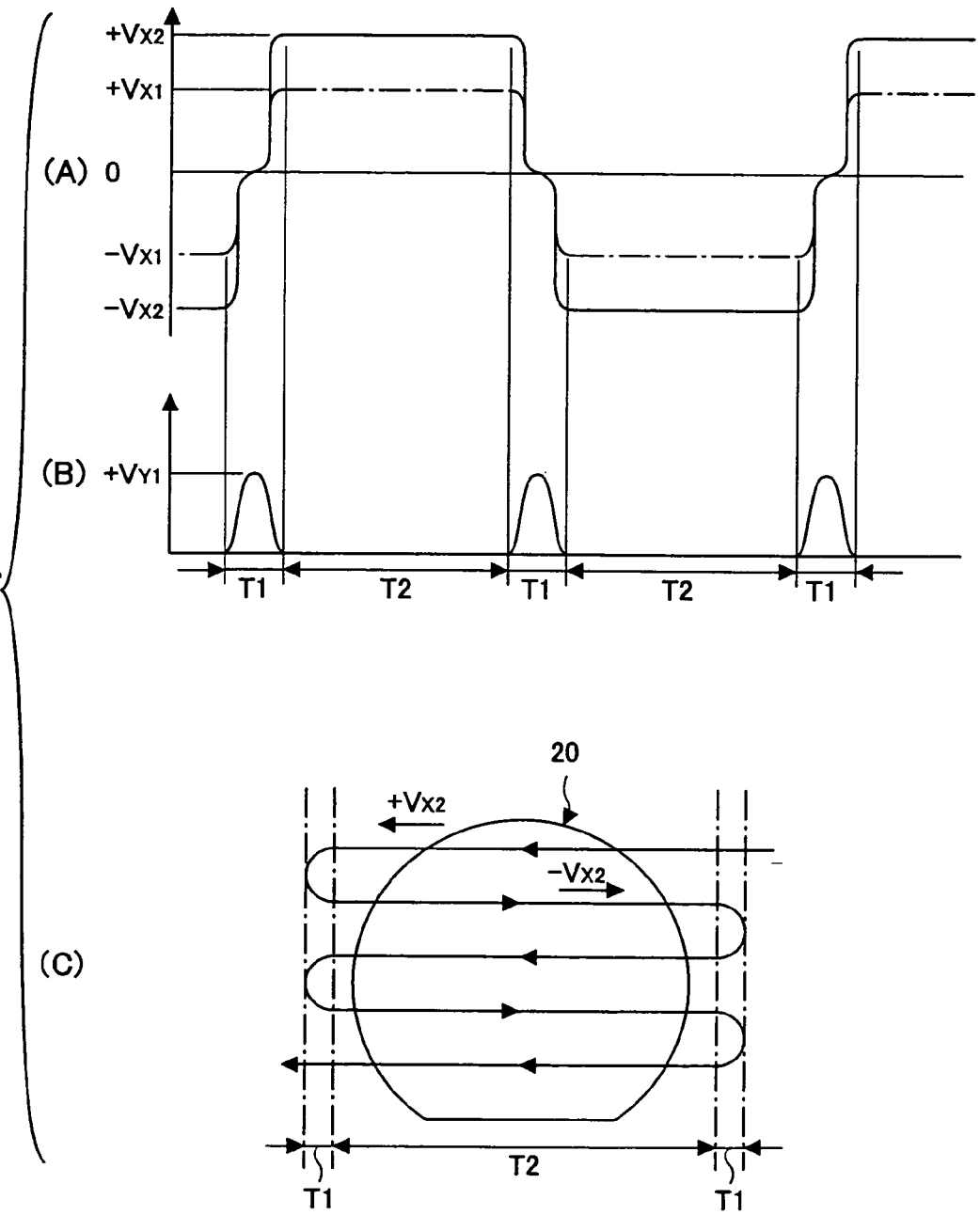
FIG. 26-(A) is a timing chart of a fourth control operation example of the first and second driving mechanisms carried out by the controller, FIG. 26-(B) is a timing chart of the fourth control operation example of the first and second driving mechanisms carried out by the controller, and FIG. 26-(c) shows a relative movement trail of a wafer in the fourth control operation example.

FIG. 26-(A) through 26-(C) illustrate a fourth example of control operations performed by the controller 40 for the first driving mechanism 13A and the second driving mechanism 14A. In this embodiment, the moving speed $V_{X1}$ of the wafer platen 12 moved by the second driving mechanism 14A in the first control example shown in FIG. 23-(A) through 23-(C) is changed to a moving speed $V_{X2}$. The controller 40 can change the moving speed $V_X$ of the wafer platen 12 moved by the second driving mechanism 14A. By doing so, the moving speed $V_X$ of the wafer platen 12 can be optimized depending on the intensity of the IB or the like, so that a suitable IB irradiation process can be carried out for the wafer 20.

In any of the above control operation examples, the controller 40 performs such a control operation that the IB irradiation process for the wafer 20 synchronizes with the constant speed mode for moving the wafer platen 12 by the second driving mechanism 14A at a constant speed. By this control operation, a predetermined process can be carried out at the constant speed mode, which allows a stable moving state. Accordingly, a stable and high-precision process can be carried out for the wafer 20.

In the substrate transfer device 10A of the first embodiment, only the wafer 20 is placed on the wafer platen 12. Although the single-substrate transfer device has been described so far, it is also possible to employ a structure in which a plurality of wafers 20 are placed on the wafer platen 12.

FIGS. 27-(A) through 27-(E) show examples of such a structure. FIG. 27-(A) shows an example in which two wafers 20 can be mounted onto the wafer platen 12. If the two wafers 20 are arranged vertically as shown in FIG. 27-(A), it is desirable to set the movement trail of the IB in the horizontal direction (in the directions indicated by the arrows X1 and X2) so as to achieve a higher efficiency. FIG. 27-(B) shows an example in which four wafers 20 are placed on the wafer platen 12, FIG. 27-(C) shows an example in which six wafers 20 are placed on the wafer platen 12, FIG. 27-(D) shows an example in which nine wafers 20 are placed on the wafer platen 12, and FIG. 27-(E) shows an example in which eight wafers 20 are placed on the wafer platen 12.

In a case where only one wafer 20 is mounted on the wafer platen 12, the process precision can be increased, and the size of the vacuum processing chamber can be reduced. In a case where a plurality of wafers 20 are placed on the wafer platen 12, the processing capacity can be increased.

In the latter case, however, the wafer platen 12 becomes larger, as the number of wafers 20 becomes greater. As a result, the vacuum processing chamber 11 also becomes larger, and the process precision becomes lower. To increase the process efficiency without reducing the process precision or enlarging the vacuum processing chamber 11, the number of wafers 20 to be placed on the wafer platen 12 should preferably be 2 to 9.

Figure 28:
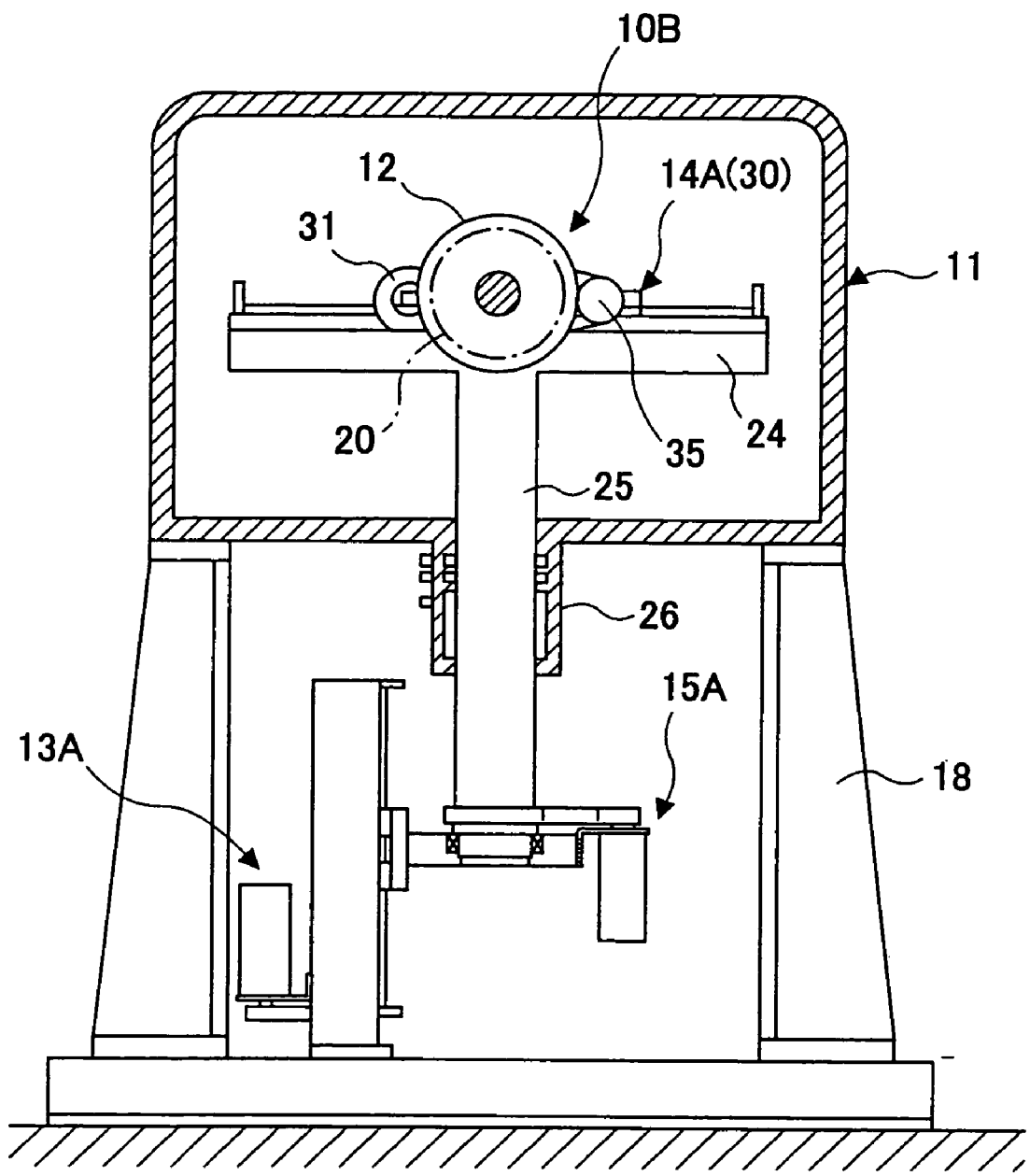
FIG. 28 is a section view of a substrate transfer device that is a modification of the first embodiment, seen from the front.

FIG. 28 shows a substrate transfer device 10B that is a modification of the substrate transfer device 10A of the first embodiment of the present invention. In FIG. 28, the same components as in the first embodiment shown in FIGS. 1 through 3 are denoted by the same reference numerals as in the first embodiment, and explanations for those components are omitted from the description below.

In the substrate transfer device 10A of the first embodiment, the center of the wafer platen 12 is offset in relation to the position where the wafer plate 12 is directly energized by the linear motor 30 (see FIG. 2).

This modification is characterized by setting the wafer platen 12 at the position where the wafer plate 12 is directly energized by the linear motor 30. More specifically, the wafer platen 12 is directly attached to the linear motor 30 without the support pillar 54. Accordingly, the offset is zero. In this structure, the linear motor 30 is located at the backside of the wafer platen 12. As a result, the Faraday cup 35 is placed on a side of the wafer platen 12.

In the substrate transfer device 10B having the above structure, the mounting position of the wafer 20 onto the wafer platen 12 is the position where the linear motor 30 directly moves the wafer platen 12. Accordingly, even though the wafer platen 12 is moved, the moment caused in the wafer platen 12 can be reduced. As a result, the movement of the wafer platen 12 does not cause vibrations or unnecessary loads. In this manner, a high-precision process can be carried out for the wafers 20.

Figure 29:
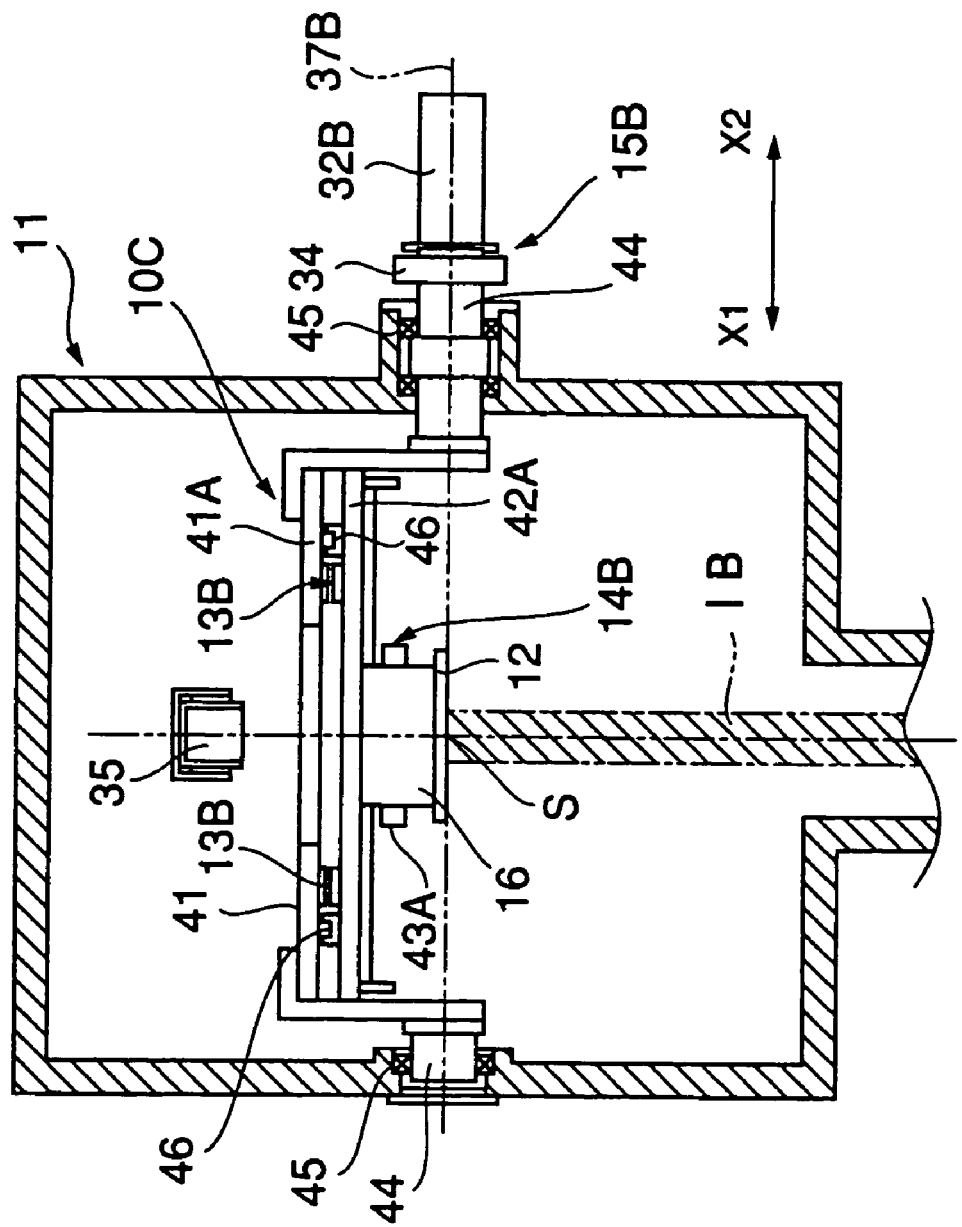
FIG. 29 is a schematic section view of a substrate transfer device that is the second embodiment of the present invention.
Figure 30:
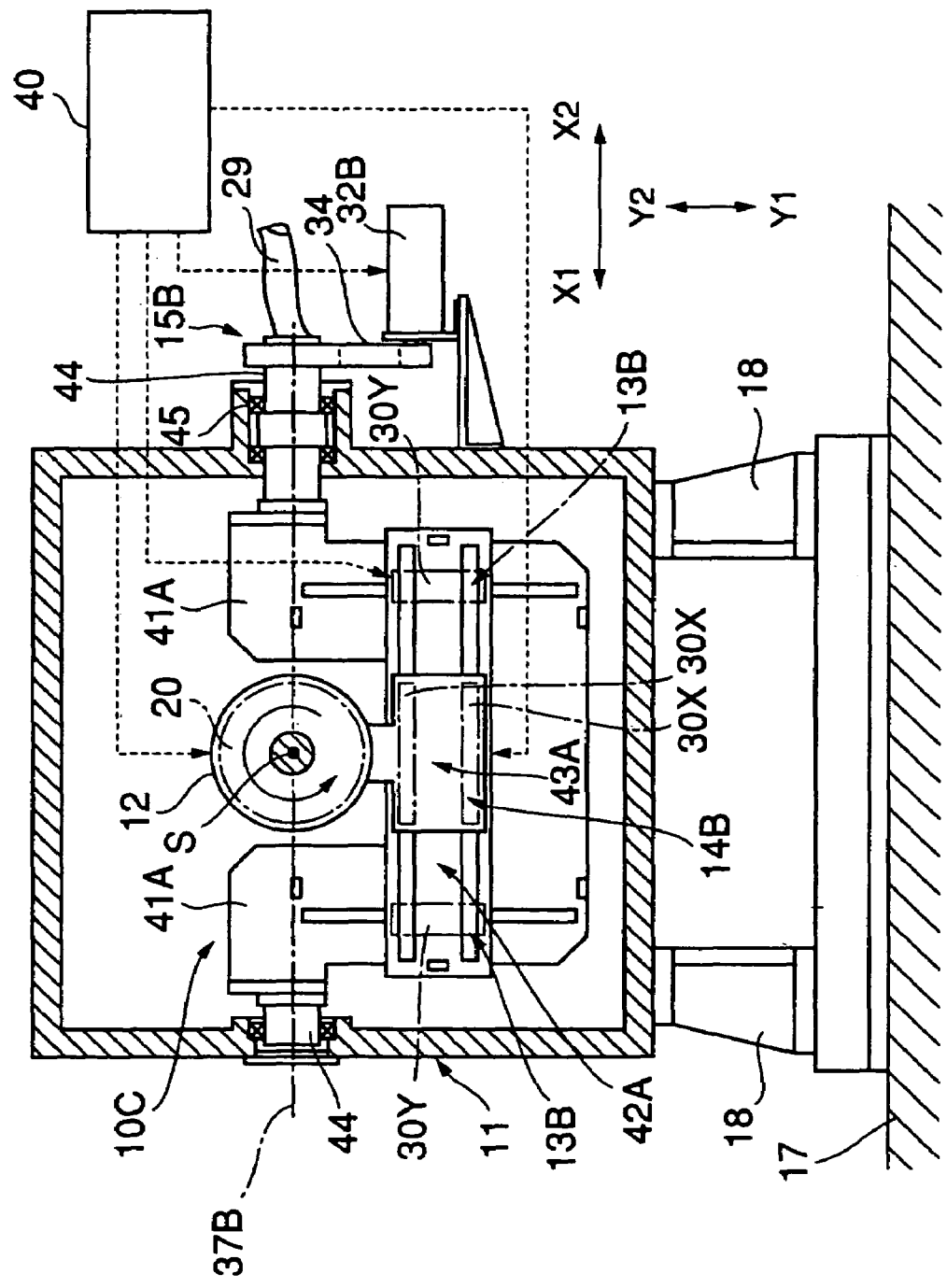
FIG. 30 is a section view of the substrate transfer device that is the present invention, seen from the front.
Figure 31:
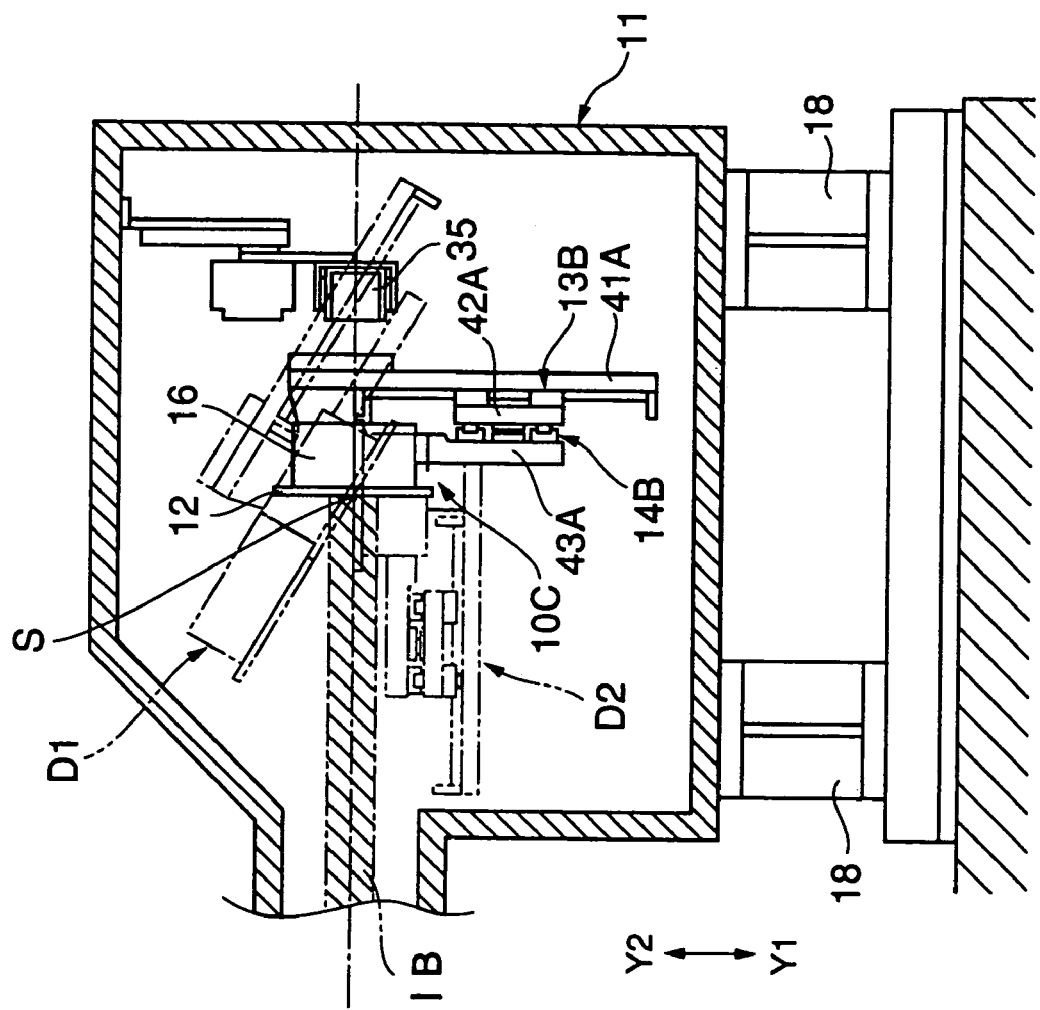
FIG. 31 is a section view of the substrate transfer device that is the second embodiment of the present invention, seen from a side.

FIGS. 29 through 31 illustrate a substrate transfer device 10C that is the second embodiment of the present invention.

In FIGS. 29 through 31, the same components as in the first embodiment shown in FIGS. 1 through 3 are denoted by the same reference numerals as in the first embodiment, and explanations for those components are omitted. Since the control operations of the controller 40, which have been described with reference to FIGS. 23 through 26, can be applied to this embodiment, explanation for the control operations is also omitted from the description below. This applies to the embodiments and modifications that will follow this embodiment.

In the substrate transfer device 10A of the first embodiment, the first driving mechanism 13A is located outside the vacuum processing chamber 11. In the substrate transfer device 10C of this embodiment, a first driving mechanism 13B, as well as a second driving mechanism 14B, is located inside the vacuum processing chamber 11.

The substrate transfer device 10C has a base substrate 41A that is axially supported by a rotation axis 44 in the vacuum processing chamber 11. A Y-direction movable substrate 42A that is movable in the directions indicated by the arrows Y1 and Y2 in the drawings is mounted to the base substrate 41. Further, an X-direction movable substrate 43A that is movable in the directions indicated by the arrows X1 and X2 is mounted to the Y-direction movable substrate 42A. Further, the wafer platen 12 is mounted to the X-direction movable substrate 43A.

The Y-direction movable substrate 42A is moved in the directions of the arrows Y1 and Y2 in relation to the base substrate 41A by a pair of linear motors 30Y that are located at either horizontal side of the Y-direction movable substrate 42A. The X-direction movable substrate 43A is moved in the directions of the arrows X1 and X2 in relation to the Y-direction movable substrate 42A by a pair of linear motors 30X that are located at either vertical side of the X-direction movable substrate 43A. With this structure, the wafer platen 12, onto which the wafer 20 is mounted, is driven by the linear motors 30X and 30Y and is moved in the directions of the arrows X1 and X2 and in the directions of the arrows Y1 and Y2. In this manner, the entire surface of the wafer 20 can be irradiated with the IB.

In this embodiment, the linear motors 30Y that function as the first driving mechanism 13B and the linear motors 30X that function as the second driving mechanism 14B each have the same structure as the linear motor 30, which has been described with reference to FIGS. 5 through 20. Accordingly, the first driving mechanism 13B and the second driving mechanism 14B can both be located inside the vacuum processing chamber 11, and can linearly reciprocate the wafer platen 12 at a high speed.

In this embodiment, the X-direction movable substrate 43A, to which the linear motors 30X as the second driving mechanism 14B is mounted, is placed over the Y-direction movable substrate 42A, to which the linear motors 30Y as the first driving mechanism 13B. With this structure, the entire structure size can be reduced, compared with a structure in which the Y-direction movable substrate 42A and the X-direction movable substrate 43A are separately mounted onto the base substrate 41A.

Alternatively, it is possible to mount the Y-direction movable substrate 42A, to which the linear motors 30Y as the first driving mechanism 13B is attached, onto the X-direction movable substrate 43A, to which the linear motors 30X as the second driving mechanism 14B is attached. With this structure, the entire structure size can also be reduced.

Next, a third driving mechanism 15B of the second embodiment will be described.

The third driving mechanism 15B includes a tilting motor 32B and the base substrate 41A. The base substrate 41A has the rotation axis 44 at either side. The rotation axis 44 is axially supported by bearings 45 provided inside the vacuum processing chamber 11. With this structure, the base substrate 41A is axially supported inside the vacuum processing chamber 11 in such a manner that the base substrate 41A can be vibrated.

The end of the rotation axis 44 in the X2 direction protrudes outwardly from the vacuum processing chamber 11, and the protruding end is connected to the tilting motor 32B by a belt 34. As the tilting motor 32B is actuated, the base substrate 41A is vibrated, with the rotation axis 44 being the center.

The rotation center of the rotation axis 44 extends through the center point S of the wafer 20 placed on the wafer platen 12. As the tilting motor 32B is actuated, the wafer platen 12 (or the wafer 20) tilts around the center axis of the rotation axis 44 (hereinafter referred to as "tilt axis 37B"). The tilt axis 37B extends in parallel to the moving direction of the wafer platen 12 (i.e., the directions of the arrows X1 and X2 in this embodiment). FIG. 31 shows examples in which the wafer platen 12 is tilted at approximately 60 degrees and 90 degrees by the third driving mechanism, as indicated by the dots-and-dash lines.

Figure 32:
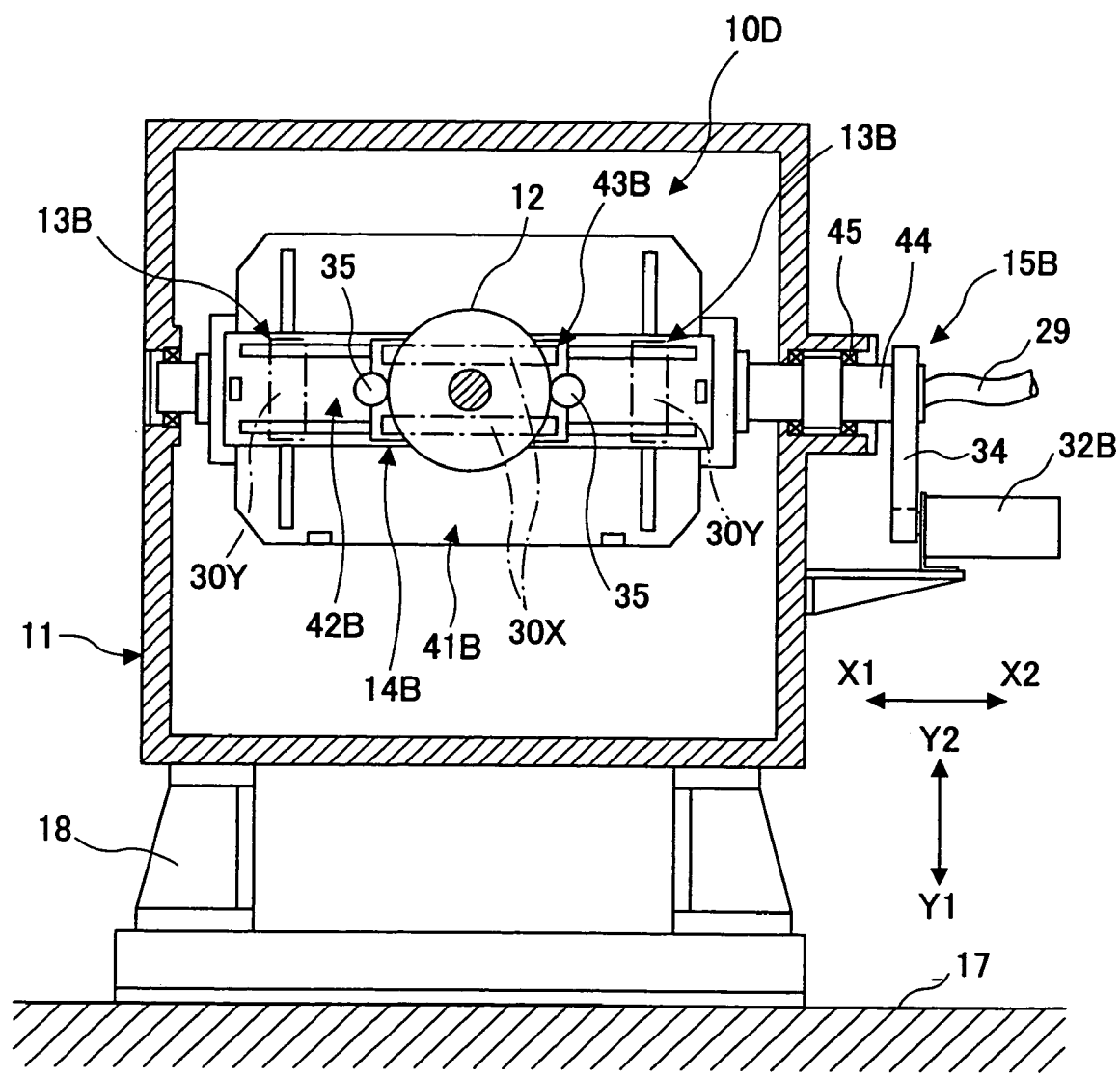
FIG. 32 is a section view of a substrate transfer device that is a modification of the second embodiment, seen from the front.

FIG. 32 illustrates a substrate transfer device 10D that is a modification of the substrate transfer device; 10C of the second embodiment. Like the substrate transfer device 10B described with reference to FIG. 28, the offset of the wafer platen 12 as in the substrate transfer device 10C of the second embodiment is eliminated in this embodiment.

Since the mounting position of the wafer 20 onto the wafer platen 12 is also the position where the linear motors 30X energizes and moves the wafer platen 12, the moment generated in the wafer platen 12 can be reduced, even when the wafer platen 12 is moved. As a result, the movement of the wafer platen 12 does not cause vibrations or loads on the wafer platen 12, and a high-precision process can be carried out for the wafer 20. In this embodiment, a Faraday cup 35 is placed on either side of the wafer platen 12.

Figure 33:
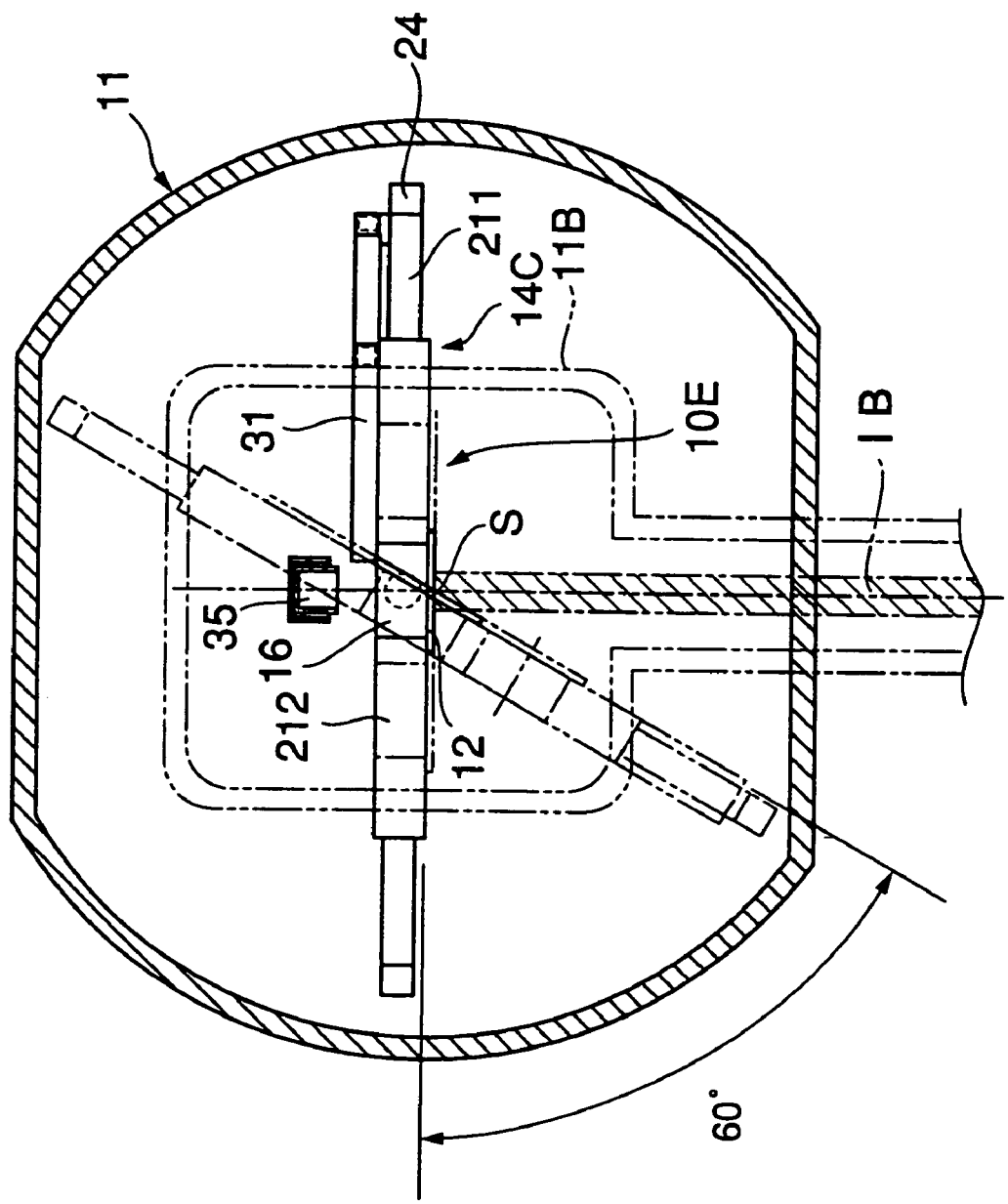
FIG. 33 is a schematic section view of a substrate transfer device that is the third embodiment of the present invention.
Figure 34:
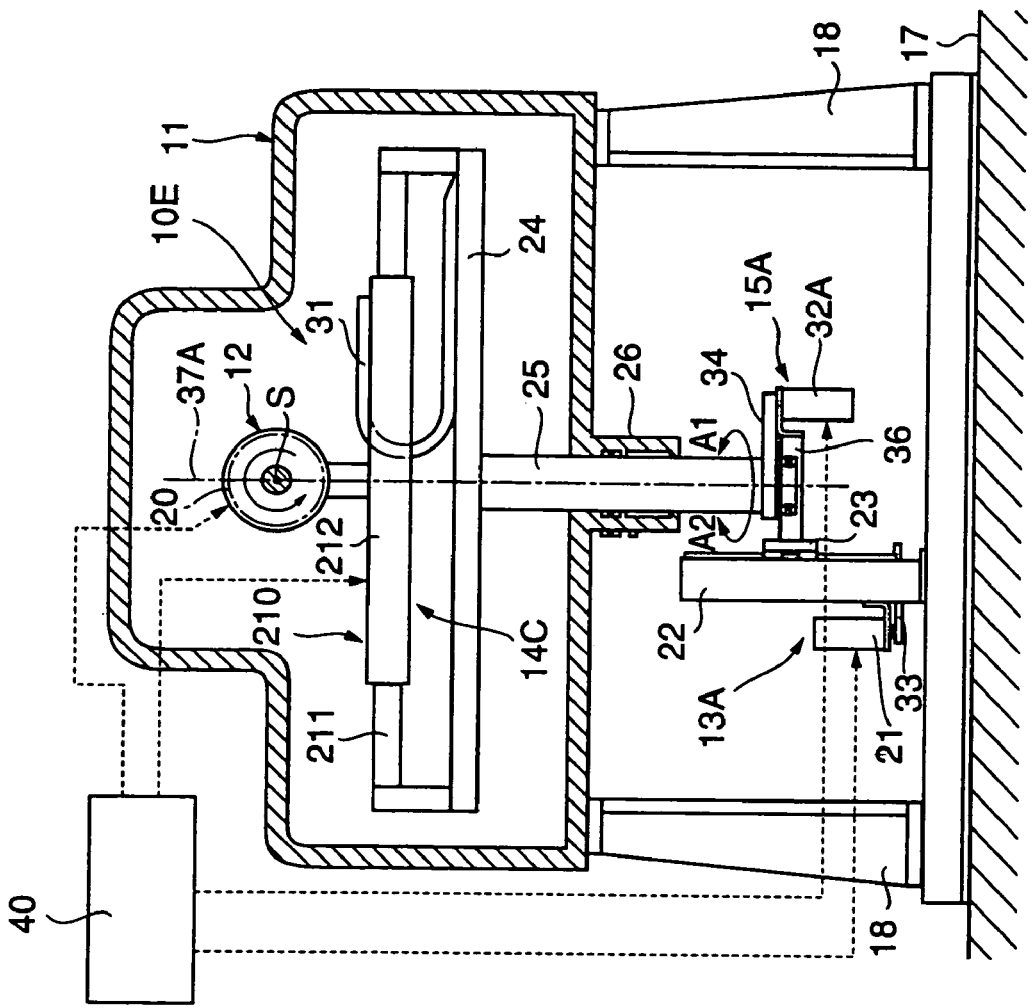
FIG. 34 is a section view of the substrate transfer device that is the third embodiment of the present invention, seen from the front.
Figure 35:
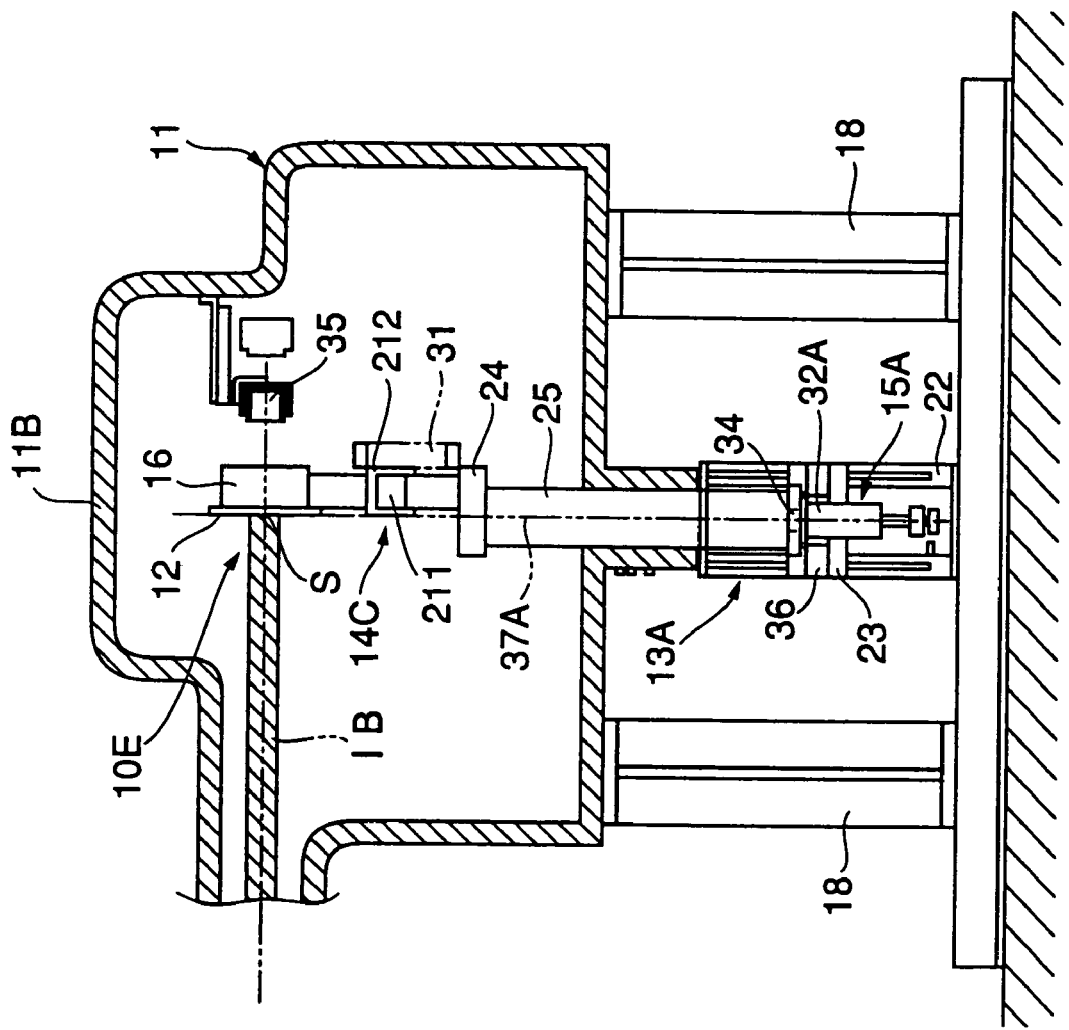
FIG. 35 is a section view of the substrate transfer device that is the third embodiment of the present invention, seen from a side.

FIGS. 33 through 35 illustrate a substrate transfer device 10E that is the third embodiment of the present invention. In each of the foregoing embodiments, the second driving mechanisms 14A and 14B are formed by the linear motors 30 and 30X, respectively. In this embodiment, on the other hand, a fluid pressure actuator 210 is employed as a second driving mechanism 14C.

This fluid pressure actuator 210 employed as the second driving mechanism 14C in the substrate transfer device 10E of this embodiment will now be described.

Figure 37:
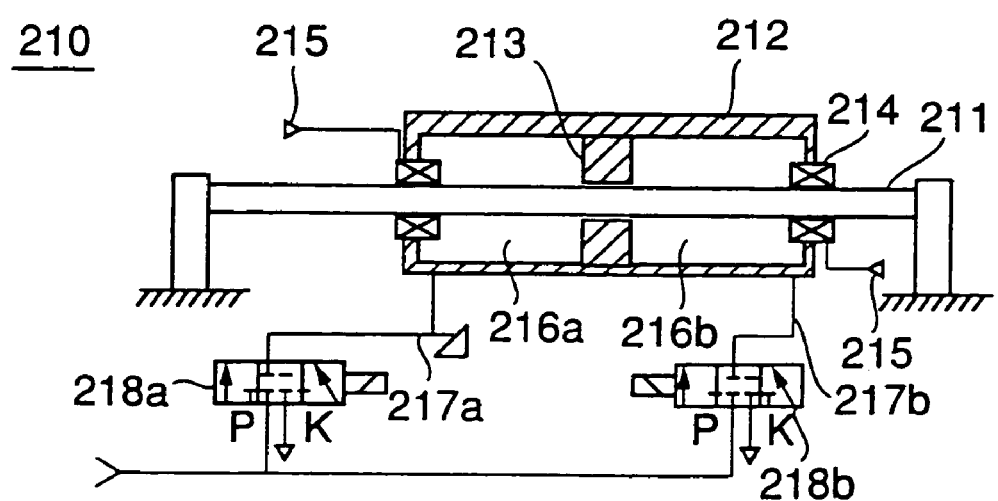
FIG. 37 shows the principles of the fluid pressure actuator shown in FIG. 36.

Referring to FIG. 37, the driving principles of the fluid pressure actuator in accordance with the present invention will be described, taking a case of a pneumatic pressure actuator as an example. In FIG. 37, the actuator 210 includes a guide axis 211 that is fixed by a support member at both ends and extends in an axial direction, and a slider 212 that can be moved along the guide axis 211.

The slider 212 is a cylindrical member that can surround the guide axis 211, with a space being formed between the slider 212 and the outer periphery of the guide axis 211. The wafer platen 12 is placed above the slider 212 (see FIG. 34).

The space is used as a pressure chamber, and a partition wall 213 for dividing the pressure chamber into two cylinder chambers 216a and 216b in the axial direction is fixed to the inner wall of the slider 212. The partition wall 213 and the slider 212 can slide along the guide axis 211.

Hydrostatic air bearings 214 are provided at either end of the slider 212, and a bearing air supplier 215 is connected to each of the hydrostatic air bearings 214. Since the structure of a hydrostatic bearing is well known, explanation of the hydrostatic bearings is omitted. Also, cylinder air suppliers 217a and 217b for allowing compressed air to enter and exit the divided cylinder chambers 216a and 216b are connected to either end of the slider 212. The cylinder air suppliers 217a and 217b are provided with servo valves 218a and 218b, respectively. These servo valves 218a and 218b are connected to a compressed air supply source.

In this structure, as the compressed air is supplied to the hydrostatic air bearings 214, the slider 212 moves up slightly from the guide axis 211. Here, with the servo valve 218a being provided at the compressed air supply side and the servo valve 218b being provided at the open-air side, the partition wall 213 functions as a piston so as to move the slider 212 toward the right in FIG. 37. In this manner, the degree of opening of the servo valves 218a and 218b is controlled, so that the slider 212 is moved to a desired position in relation to the guide axis 211.

Figure 36:
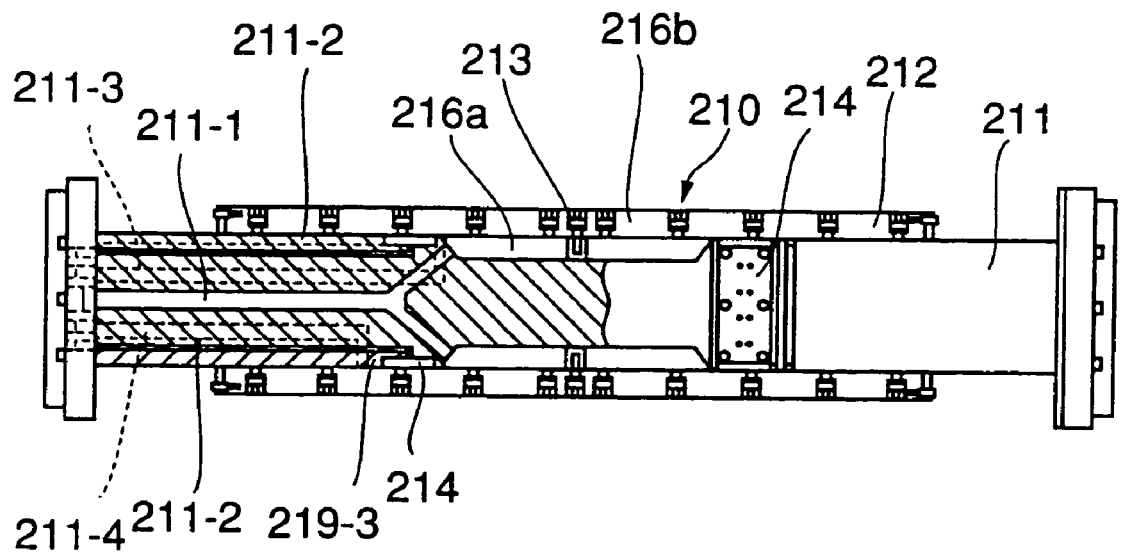
FIG. 36 is a partial section view of the structure of a fluid pressure actuator provided in the substrate transfer device that is the third embodiment of the present invention.

Referring now to FIG. 36, an example of the actuator 210 utilizing the above driving principles will be described.

In this example, an axis member having a rectangular section is employed as the guide axis 211, and the slider 212 also has a rectangular section so as to form an inner space having a rectangular section into which the guide axis 11 can be inserted. Here, the gap between the inner wall of the slider 212 and the outer periphery of the guide axis 211 is very small. Also, the guide axis 211 is so thin as to form the pressure chamber in the vicinity of the center of the guide axis 211. The partition wall 213 that can slide along the guide axis 211 is fixed to the inner wall of the slider 212, so as to divide the pressure chamber into the two cylinder chambers 216a and 216b. In the following, the structure surrounding the cylinder chamber 216a will be described. The structure surrounding the cylinder chamber 216b is exactly the same as the structure surrounding the cylinder chamber 216a.

To allow the compressed air to enter and exit the cylinder chamber 216a, an air passage 211-1 is provided at the center in the guide axis 211, extending from one end toward the center of the guide axis 211. The air passage 211-1 is divided into a plurality of branches near the cylinder chamber 216a, and communicates with the cylinder chamber 216a. With this structure, the pressure distribution in the cylinder chamber 216a can be made uniform.

The air passage 211-1 at one end of the guide axis 211 is connected to an air pipe, and is provided with the servo valve described with reference to FIG. 37. The maximum stroke of the slider 212 is determined by the size of the cylinder chambers 216a and 216b in the axial direction.

Figure 38:
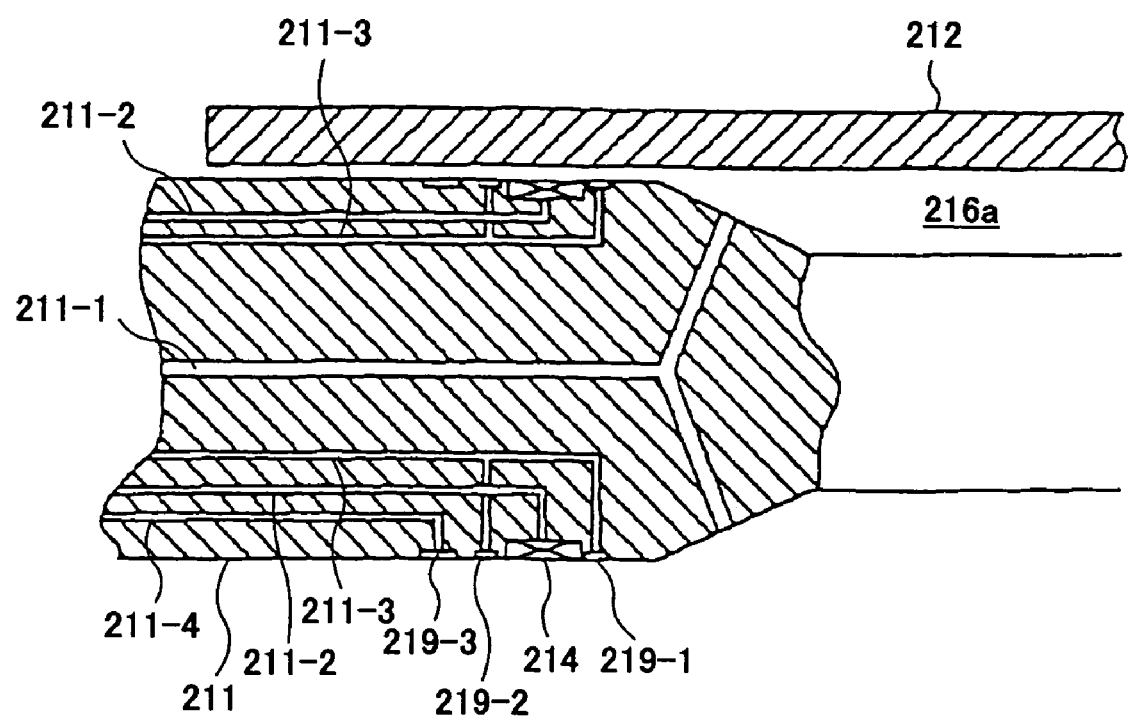
FIG. 38 is an enlarged view of the fluid pressure actuator shown in FIG. 36.

Also referring to FIG. 38, the hydrostatic air bearings 214 are provided around the guide axis 211 at a point near the cylinder chamber 216a. Exhausting parts 219-1 and 219-2 are provided at either side of each of the hydrostatic air bearings 214. Since the guide axis 211 has a rectangular shape, the hydrostatic air bearings 214 are formed on the four surfaces of the guide axis 211.

The exhausting parts 219-1 and 219-2 discharge leakage air from the cylinder chamber 216a and air from the hydrostatic air bearing 214. A groove for facilitating the exhaust is formed around the guide axis 211, and the exhaust is carried out through this groove. The guide axis 211 is further provided with a vacuum exhaust part 219-3 outwardly from the hydrostatic air bearing 214 in the axial direction. The vacuum exhaust part 219-3 is employed for use in the vacuum chamber. The vacuum exhaust part 219-3 also has a groove formed around the guide axis 211 so as to facilitate the exhaust. The vacuum exhaust part 219-3 carries out the exhaust through the vacuum exhaust part 219-3.

To supply the compressed air to the hydrostatic air bearings 214, a plurality of air passages 211-2 leading to the hydrostatic air bearings 214 from one end of the guide axis 211 are formed inside the guide axis 211. Further, a plurality of exhaust air passages 211-3 leading to the grooves of the discharge parts 219-1 and 219-2 from the end are formed inside the guide axis 211.

Another discharge air passage 211-4 leading to the groove of the vacuum discharge part 219-3 from the end is formed inside the guide axis 211. This discharge air passage 211-4 should preferably communicate with each of holes that are formed through the groove of the vacuum discharge part 219-3. These holes correspond to the four faces of the guide axis 211. In FIG. 38, the passages of various types formed inside the guide axis 211 are indicated by solid lines for convenience. However, it should be understood that these passages are located at different locations in relation to the circumferential direction inside the guide axis 211.

An air pipe is connected to the plurality of air passages 211-2 at the end of the guide axis 211. Further, a compressed air supply source is provided for the plurality of air passages 211-2. Likewise, an air pipe is connected to the plurality of exhaust air passage 211-3 at the end of the guide axis 211. Further, an exhaust pump is provided for the plurality of exhaust air passages 211-3. Also, an air pipe is connected to the exhaust air passage 211-4 at the end of the guide axis 211. Further, a vacuum exhaust pump is provided for the exhaust air passage 211-4.

Figure 39:
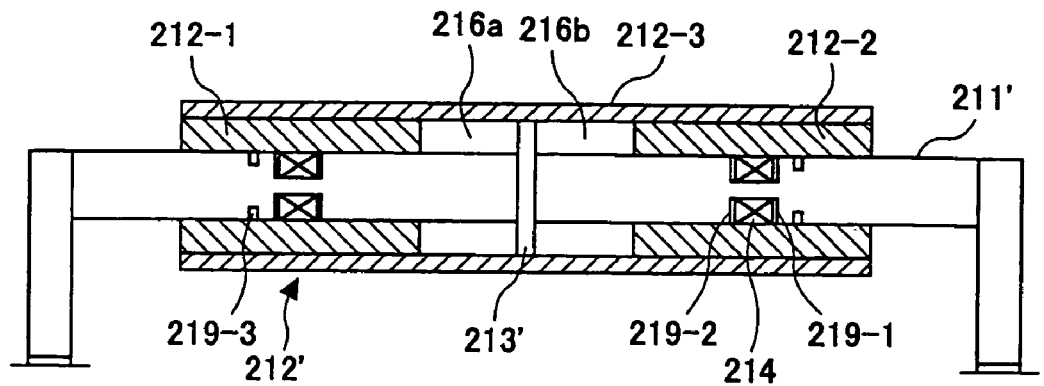
FIG. 39 shows a first modification of the fluid pressure actuator shown in FIG. 36.

FIG. 39 shows another example of the actuator. In this example, a guide axis 211' has the same section in the axial direction.

A slider 212' is formed by two members 212-1 and 212-2 into which the guide axis 211' is inserted, and a cylindrical member 212-3 that covers and connects the two members 212-1 and 212-2. With this structure, a pressure chamber is formed around the center of the guide axis 211'.

Further, a partition wall 213' is fixed to the guide axis 211' inside the pressure chamber, so as to divide the pressure chamber into the two cylinder chambers 216a and 216b. The two members 212-1 and 212-2, as well as the cylindrical member 212-3, can move along the guide axis 211'. The inner wall of the cylindrical member 212-3 that forms the pressure chamber can slide on the outer periphery of the partition wall 213'. The structure for allowing the compressed air to enter and exit the cylinder chambers 216a and 216b, and the structures involving the hydrostatic air bearings 214, the exhaust parts 219-1 and 219-2, and the vacuum exhaust part 219-3, are the same as in the foregoing example.

The operation principles of this actuator are the same as in the example shown in FIG. 36, except that the slider 212' moves toward the left in FIG. 39 when the compressed air is introduced into the cylinder chamber 216a, for instance.

Figure 40:
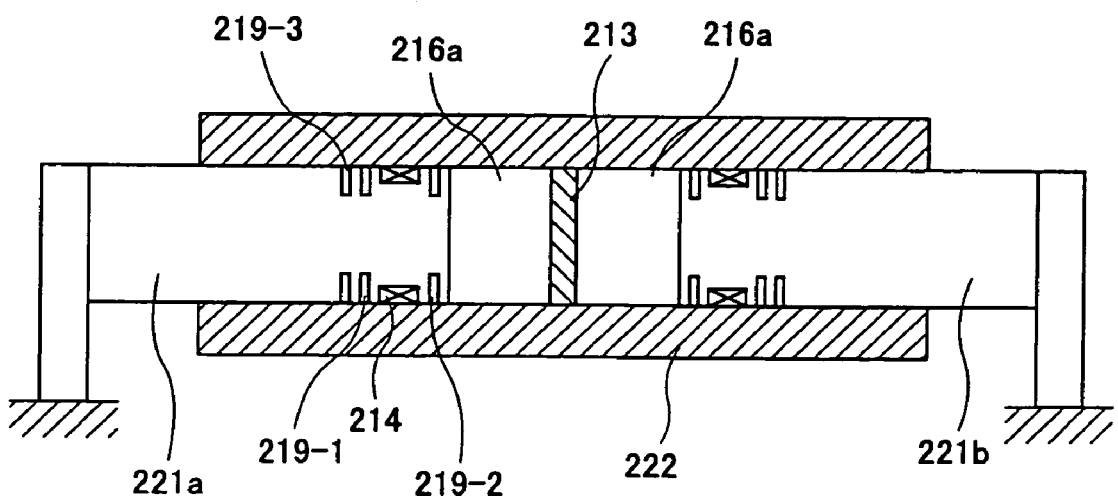
FIG. 40 shows a second modification of the fluid pressure actuator shown in FIG. 36.

FIG. 40 shows yet another example of the actuator. In this example, the guide axis is formed by two axis members 221a and 221b, each of which has one end facing to the corresponding end of each other axis member, with a constant distance being maintained in between. With this structure, the axis centers of the two axis members 221a and 221b correspond to each other.

The two axis members 221a and 221b should preferably have a rectangular section. It is also preferable to form the slider 212 from a cylindrical member that has an inner space having a rectangular section. This inner space can accommodate the space (the pressure chamber) formed between the facing ends of the two axis members 221a and 221b, and the area covering the predetermined distance from one end to the other of each of the two axis members 221a and 221b.

Further, the partition wall 213 is fixed to the inner wall of the slider 212. The partition wall 213 divides the space, which is formed between the one ends of the axis members 221a and 221b, into the two cylinder chambers 216a and 216b with respect to the axial direction. The slider 212 can move along the guide axis members 221a and 22 1b. The structure for allowing the compressed air to enter and exit the cylinder chambers 216a and 216b, and the structure surrounding the hydrostatic air bearings 214, the exhaust parts 219-1 and 219-2, and the vacuum exhaust part 219-3, are the same as in the example shown in FIG. 36.

When the compressed air is introduced into the cylinder chamber 216a in this actuator, the slider 212 moves to the right in FIG. 40, as in the example shown in FIG. 36. Accordingly, the operation principles of this actuator are exactly the same as the example shown in FIG. 36. Although pneumatic pressure actuators that use compressed air have been described in the above examples, a gas such as nitrogen gas or a liquid such as water can be used.

As described above, in the substrate transfer device 10E of this embodiment, the second driving mechanism 14C formed by the fluid pressure actuator 210 can be placed inside the vacuum processing chamber 11. More specifically, the fluid pressure actuator 210 has the guide axis 211 and the slider 212 that can move along the guide axis 211, as described above. The pressure chamber formed between the guide axis and the slider 212 is divided into the cylinder chambers 216a and 216b. A compressed fluid enters and exits the cylinder chambers 216a and 216b selectively through the supply and discharge passages, so that the slider 212 can move along the guide axis 211.

The compressed fluid is not introduced into the vacuum processing chamber 11 from the cylinder chambers 216a and 216b. With this structure, the degree of vacuum inside the vacuum processing chamber 11 is not lowered by the fluid pressure actuator 210. Also, since the fluid pressure actuator 210 moves the slider 212 with the compressed fluid, heat generation is hardly caused at the driving point.

Further, the slider 212 can be moved at a high speed by controlling the pressure of the compressed fluid. Accordingly, the wafer platen 12 can be linearly reciprocated at a high speed (at a frequency in the range of 1 Hz to 20 Hz, at a moving speed in the range of 1 m/S to 50 m/S) as in the first embodiment. Thus, the throughput of each process can be increased.

Figure 41:
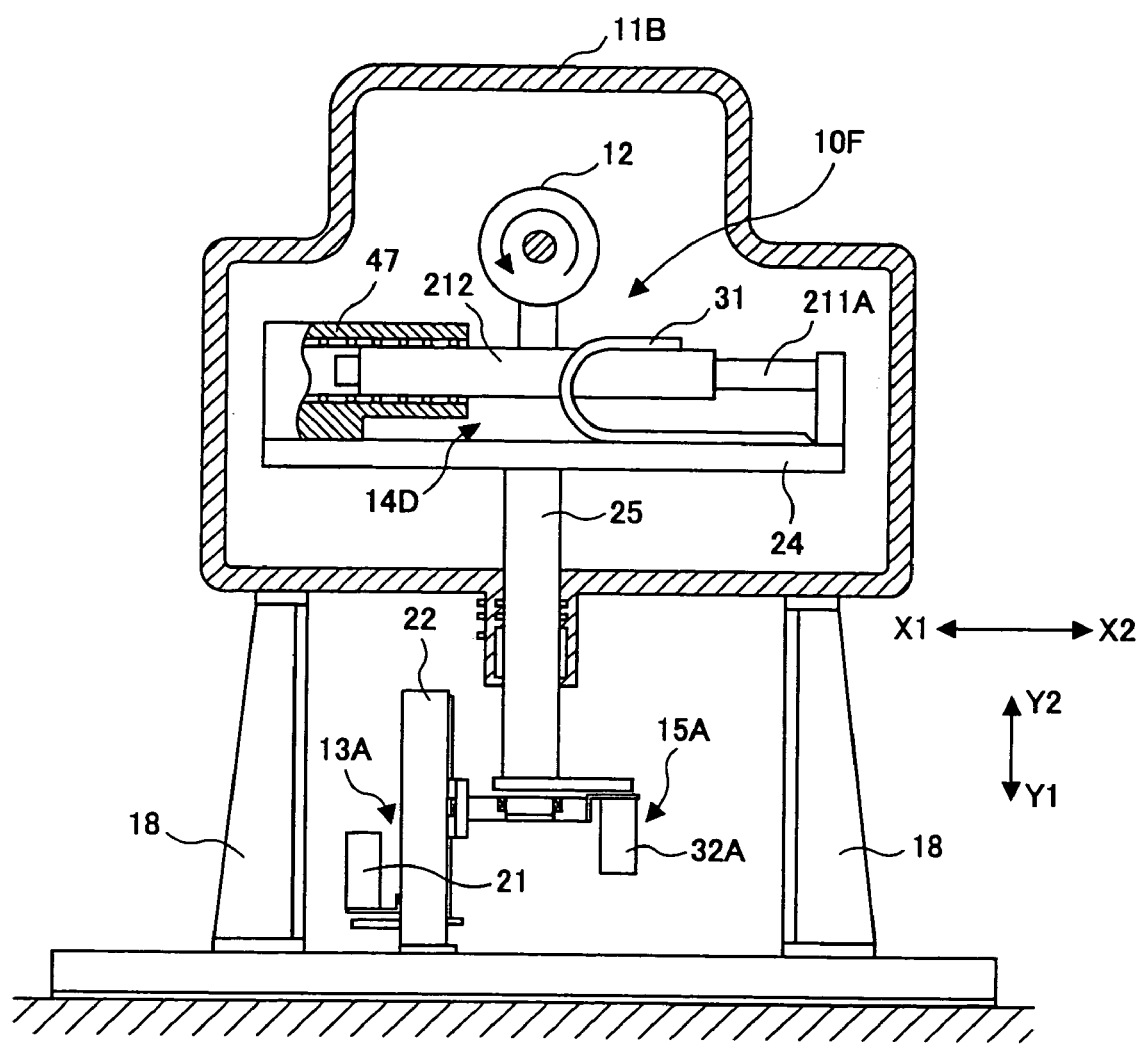
FIG. 41 is a section view of a substrate transfer device that is the fourth embodiment of the present invention, seen from the front.

FIG. 41 shows a substrate transfer device 10F that is the fourth embodiment of the present invention.

In the substrate transfer device 10E of the third embodiment, the guide axis 211 is supported by the table 24 at both ends. In this embodiment, on the other hand, only the end of a guide axis 211A on the side of the arrow X2 shown in FIG. 41 is fixed to the table 24 so as to form a cantilever structure. Therefore, the end of the slider 212 at the side of the arrow X1 is supported by a support cylinder 47.

With the guide axis 211A having the cantilever structure, the size of a second driving mechanism 14D (a fluid pressure actuator) is reduced, and, as a result, the vacuum processing chamber 11 becomes smaller.

Figure 42:
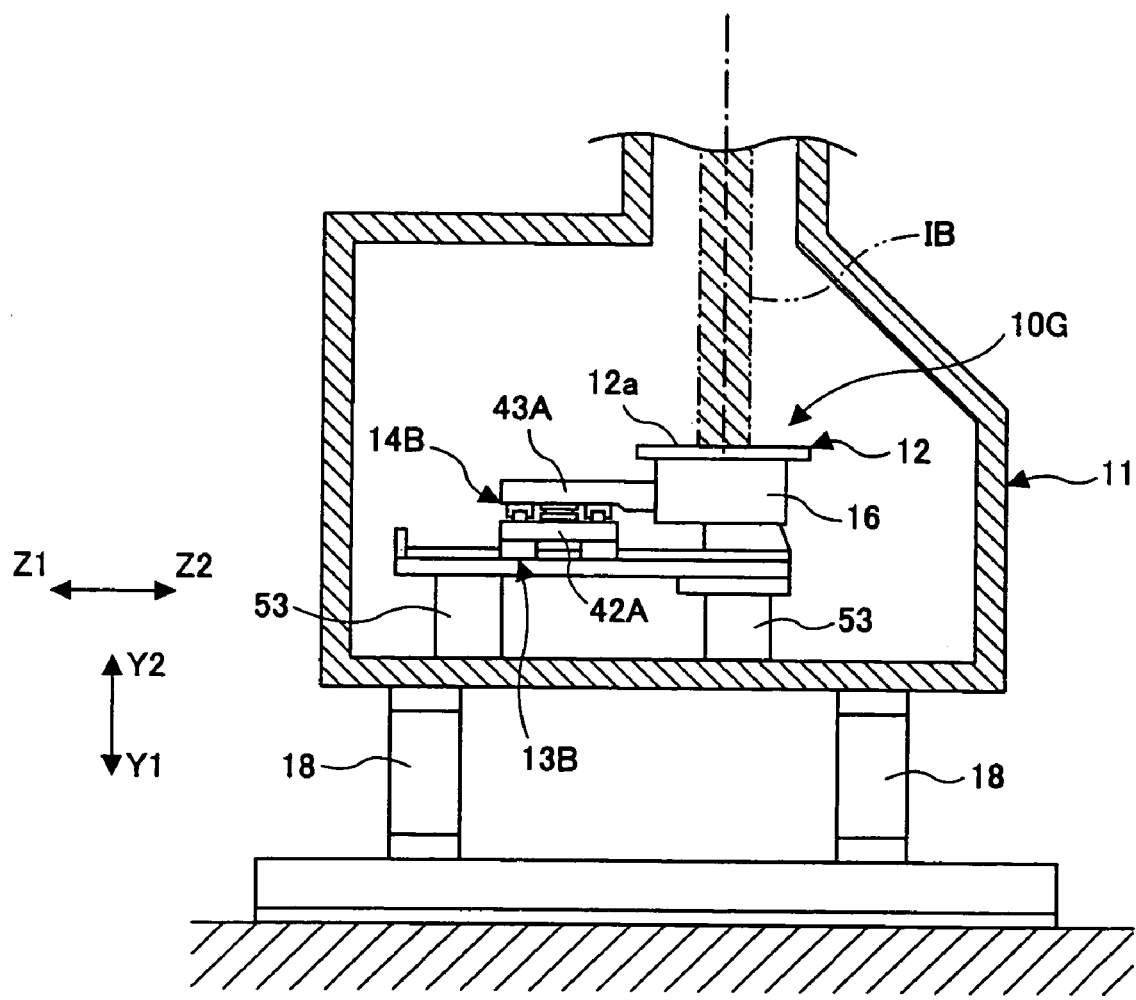
FIG. 42 is a section view of a substrate transfer device that is a fifth embodiment of the present invention, seen from a side.

FIG. 42 shows a substrate transfer device 10G that is the fifth embodiment of the present invention.

In each of the foregoing embodiments, the wafer mounting surface 12a stands in the vertical direction (in the directions indicated by the arrows Y1 and Y2 in the drawings). In the substrate transfer device 10G of this embodiment, on the other hand, the wafer mounting surface 12a lies in the horizontal direction (in the directions X1, X2, Z1, and Z2 in the drawing). In this manner, the present invention can be applied to a wafer platen having the wafer mounting surface lying in the horizontal direction, and can achieve the same effects as in each of the foregoing embodiments.

Figure 43:
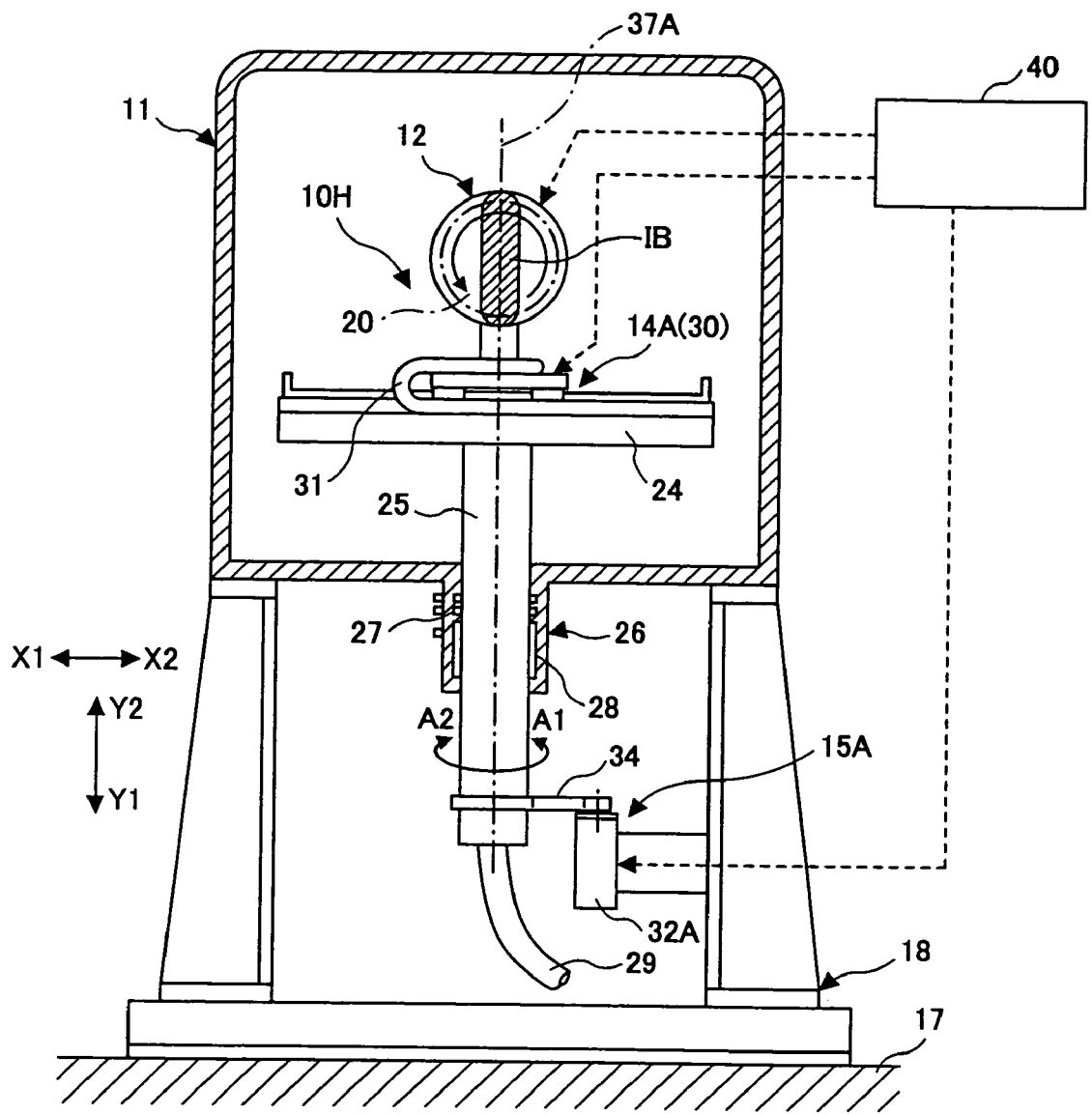
FIG. 43 is a section view of a substrate transfer device that is the sixth embodiment of the present invention, seen from the front.
Figure 44:
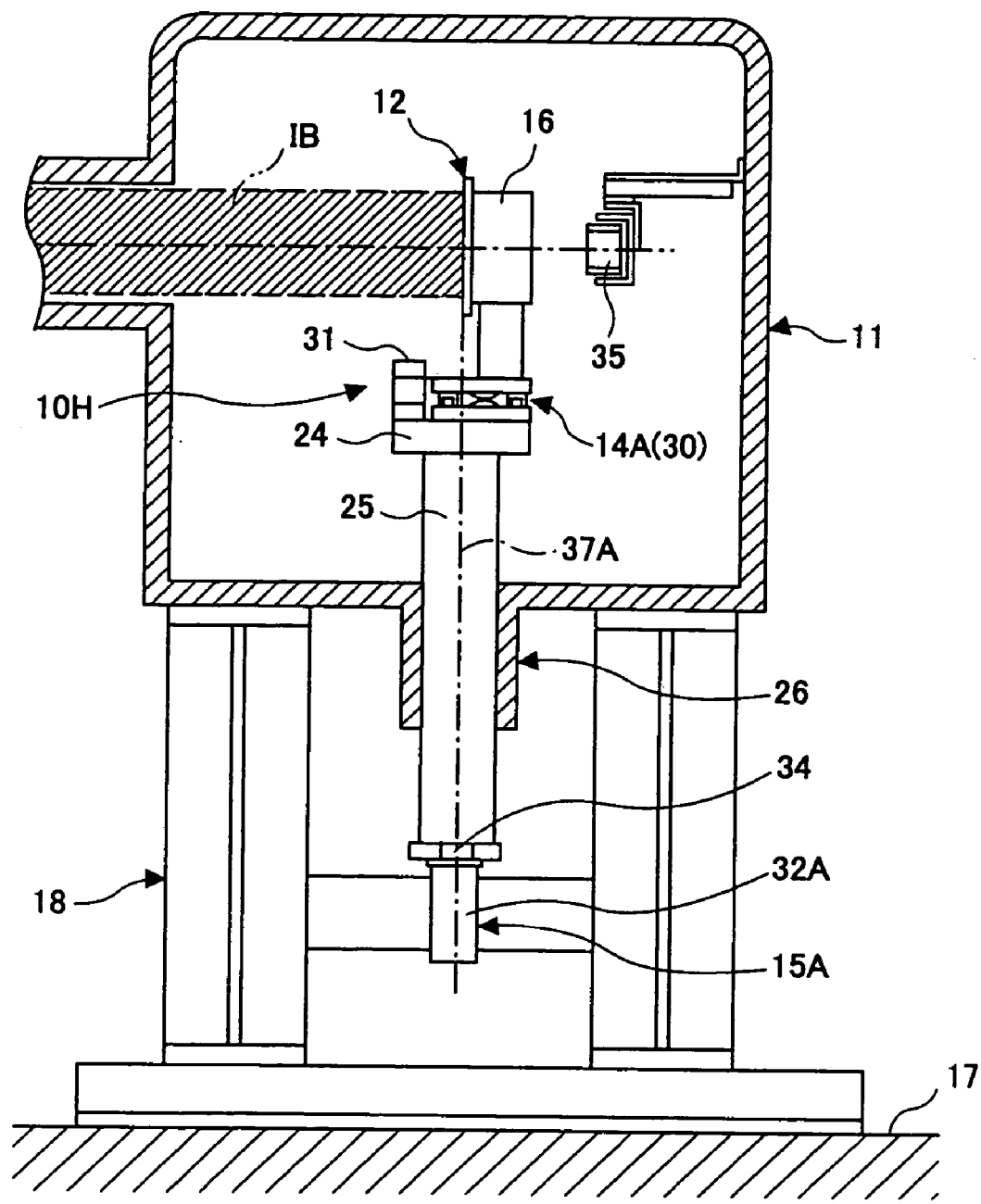
FIG. 44 is a section view of the substrate transfer device that is the sixth embodiment of the present invention, seen from a side.

FIGS. 43 and 44 show a substrate transfer device 10H that is the sixth embodiment of the present invention.

The substrate transfer device 10H of this embodiment includes the second driving mechanism 14A, but does not include the first driving mechanism 13A or 13B, which is employed in the foregoing embodiments. Also, the IB irradiation is not in the form of a spot (a small circular shape), but is carried out by a beam having a length that is at least equal to or greater than the diameter of the wafer 20, and a long oval irradiation range. With this IB, the wafer 20 mounted onto the wafer platen 12 is constantly irradiated with the IB in the directions of the arrows Y1 and Y2, even though the wafer platen 12 is not moved in the directions indicated by the arrows Y1 and Y2 in the drawings.

Since the first driving mechanism 13A or 13B employed in the foregoing embodiment using the spot-type IB is not necessary in this embodiment, only the second driving mechanism 14A is employed. Thus, the structure of the substrate transfer device 10H is simplified and reduced in size.

The present invention is not limited to these embodiments, but variations and modifications may be made without departing from the scope of the present invention.

What is claimed is:

1. A substrate transfer device for moving a substrate in a vacuum processing chamber for processing the substrate, the substrate being mounted on a base, said substrate transfer device comprising:
a first driving mechanism for moving the base, the first driving mechanism being located outside the vacuum processing chamber;
a second driving mechanism for reciprocating the base in a direction perpendicular to a moving direction of the first driving mechanism at a speed higher than a moving speed of the first driving mechanism, the second driving mechanism being located inside the vacuum processing chamber; and
a driving control unit for controlling driving operations of the first driving mechanism and the second driving mechanism;
wherein the driving control unit controls the first driving mechanism to continuously move the base at a constant moving speed.

2. The substrate transfer device as claimed in claim 1, wherein the first driving mechanism and the second driving mechanism both linearly reciprocate the base.

3. The substrate transfer device as claimed in claim 1, wherein a frequency of the linear reciprocating movement of the base moved by the second driving mechanism is set in the range of 1 Hz to 20 Hz.

4. The substrate transfer device as claimed in claim 1, wherein a moving speed of the base moved linearly reciprocated by the second driving mechanism is set in the range of 1 m/S to 50 m/S.

5. The substrate transfer device as claimed in claim 3, wherein the accuracy of the speed in a linear constant speed moving area during the linear reciprocating movement is in the range of 0.01% to 1%.

6. The substrate transfer device as claimed in claim 1, wherein the second driving mechanism is formed by a fluid pressure actuator.

7. The substrate transfer device as claimed in claim 6, wherein
the fluid pressure actuator comprises a guide axis that extends in a single axial direction, and a slider that can move along the guide axis,
a pressure chamber is formed between a surrounding area of the guide axis and the slider,
a partition wall for dividing the pressure chamber into two cylinder chambers with respect to the axial direction is fixed to the slider or one end of the guide axis, and
a supply and discharge passage provided inside the guide axis is extended to each of the two cylinder chambers, so that compressed fluid can enter and exit the two cylinder chambers.

8. The substrate transfer device as claimed in claim 6, wherein
the fluid pressure actuator comprises a guide axis and a slider that can move along the guide axis,
the guide axis is formed by two axis members each having a first end facing the first end of the other axis member, with a predetermined distance being maintained between the two axis members, and the centers of the two axis members corresponding to each other,
the slider is formed by a cylindrical member that accommodates a space formed between the one ends of the two axis members facing each other and an area covering a predetermined distance from the first end to a second end of each of the two axis members,
a partition wall for dividing the space between the first ends into two cylinder chambers with respect to the axial direction is fixed to the inner wall of the slider, and
a supply and discharge passage provided in the guide axis is extended to each of the two cylinder chambers, so that compressed fluid can enter and exit the cylinder chambers.

9. The substrate transfer device as claimed in claim 7, wherein
a bearing and a discharging part for discharging leaking fluid from each of the cylinder chambers are formed between the guide axis and the slider on either side of each of the cylinder chambers, and
a discharging path that extends from an end of the guide axis to the discharging part is provided in the guide axis.

10. The substrate transfer device as claimed in claim 1, wherein the second driving mechanism is formed by a linear motor.

11. The substrate transfer device as claimed in claim 10, wherein the linear motor has a magnet as a stator, and a coil as a needle.

12. The substrate transfer device as claimed in claim 10, wherein the linear motor has a magnet as a needle, and a coil as a stator.

13. The substrate transfer device as claimed in claim 10, wherein the linear motor contains a coil formed by combining a plurality of coil pieces, and comprises a sealed container for cooling the coil by having a refrigerant flowing around the coil.

14. The substrate transfer device as claimed in claim 10, wherein each of coil pieces contained in the linear motor substantially has a ring shape, and
each of the coil pieces comprises effective conductive parts that are formed by two facing sides of a rectangular section of each of the coil pieces and help to generate a thrust force for the base, and a linking conductive part that is formed by the other two facing sides of the rectangular section and links the effective conductive parts to each other.

15. The substrate transfer device as claimed in claim 13, wherein the coil pieces are formed by repeating a coil forming process that comprises:
a first rotating step of rotating a winding die around an X-axis by 180 degrees, with a lead wire sent out in a Z-axial direction being engaged at one of engaging points that are the four corners of the rectangular section;
a second rotating step of rotating the winding die around a Y-axis by 180 degrees, with the lead wire being engaged at one of the engaging points that is adjacent to the engaging point that engages the lead wire in the first rotating step;
a third rotating step of rotating the winding die around the X-axis by 180 degrees, with the lead wire being engaged at one of the engaging points that is adjacent to the engaging point that engages the lead wire in the second rotating step; and
a fourth rotating step of rotating the winding die around the Y-axis by 180 degrees, with the lead wire being engaged at one of the engaging points that is adjacent to the engaging point that engages the lead wire in the third rotating step,
the lead wire being employed to form the coil pieces, the Z-axis being the direction of sending out the lead wire,
the X-axis and the Y-axis being perpendicular to each other in a plane that is perpendicular to the Z-axis,
the winding die being a base for winding the lead wire in a shape substantially having a rectangular section, and having the engaging points, and
the center of the winding die corresponding to the point of origin of the X-axis and the Y-axis.

16. The substrate transfer device as claimed in claim 1, further comprising a third driving mechanism that rotates the base around a tilt axis that is parallel to the moving direction of the base driven by the first driving mechanism or/and a tilt axis that is parallel to the moving direction of the base driven by the second driving mechanism, the third driving mechanism also stopping the base at a desired angle.

17. The substrate transfer device as claimed in claim 1, further comprising a third driving mechanism that rotates the base around a tilt axis parallel to the vertical direction in such a manner that the base can be stopped at a desired angle, the third driving mechanism stopping and positioning the base at the desired angle.

18. The substrate transfer device as claimed in claim 16, wherein the tilt axis extends through the center point of the substrate to be processed.

19. The substrate transfer device as claimed in claim 1, further comprising a fourth driving mechanism that rotates the base around an axis that is perpendicular to an attachment surface to which the substrate to be processed is mounted, the fourth driving mechanism also stopping and positioning the base.

20. The substrate transfer device as claimed in claim 19, wherein the axis perpendicular to the attachment surface extends through the center point of the substrate to be processed.

21. The substrate transfer device as claimed in claim 1, wherein the substrate to be processed is attached to the base so that a process surface of the substrate to be processed stands vertically in a standard attachment state.

22. The substrate transfer device as claimed in claim 1, wherein the base attracts the substrate to be processed by electrostatic suction force, so that the substrate to be processed is mounted on the base.

23. The substrate transfer device as claimed claim 1, wherein the base is provided with a cooling mechanism.

24. The substrate transfer device as claimed in claim 1, wherein the base has only one substrate to be processed mounted thereon.

25. The substrate transfer device as claimed in claim 1, wherein the base has two to nine substrates to be processed mounted thereon.

26. The substrate transfer device as claimed in claim 1, wherein the second driving mechanism has a stroke including a length necessary for a process and a return area width necessary for changing the moving direction of the base.

27. The substrate transfer device as claimed in claim 26, wherein the length necessary for the process is a length in a processing direction of an object to be processed.

28. The substrate transfer device as claimed in claim 26, wherein the length necessary for the process is a length in a processing direction for carrying out an actual process on an object to be processed.

29. The substrate transfer device as claimed in claim 1, wherein a mounting position of the substrate to be processed onto the base is offset in relation to a position where the first driving mechanism and the second driving mechanism directly move the base.

30. The substrate transfer device as claimed in claim 1, wherein a mounting position of the substrate to be processed onto the base is equivalent to a position where the first driving mechanism and the second driving mechanism directly move the base.

31. The substrate transfer device as claimed in claim 1, wherein the second driving mechanism is placed on the first driving mechanism.

32. The substrate transfer device as claimed in claim 1, wherein the first driving mechanism is placed on the second driving mechanism.

33. The substrate transfer device as claimed in claim 1, wherein the driving control unit alternately carries out a mode for the second driving mechanism to move the base at considerably varied moving speeds and a mode for the second driving mechanism to move the base at a constant moving speed.

34. The substrate transfer device as claimed in claim 33, wherein a constant speed zone width of the constant speed movement by the second driving mechanism is determined by a smallest stroke necessary for a process that depends on the outer configuration of the substrate to be processed, and the constant speed zone width can be set or changed prior to the process for the substrate to be processed.

35. The substrate transfer device as claimed in claim 33, wherein the driving control unit smoothes out a moving speed variation of the base at each switch point between the varied moving speed mode and the constant moving speed mode.

36. The substrate transfer device as claimed in claim 1, wherein the driving control unit can change the constant moving speed at which the first driving mechanism moves the base.

37. The substrate transfer device as claimed in claim 33, wherein the driving control unit can change a moving distance of the base moved by the first driving mechanism.

38. The substrate transfer device as claimed in claim 33, wherein the driving control unit performs the driving control operation so that a process for the substrate to be processed synchronizes with the mode for the second driving mechanism to move the base at constant moving speed.

39. The substrate transfer device as claimed in claim 1, wherein the base is guided by a linear guide.

40. The substrate transfer device as claimed in claim 39, wherein the linear guide is formed by an air bearing or a magnetic bearing.

41. The substrate transfer device as claimed in claim 1, which is incorporated into a device selected from the group consisting of a beam processing device, an exposure device, and an ion implantation device.

* * * * *